(12) United States Patent
Yoshikawa

(10) Patent No.: US 12,690,209 B2
(45) Date of Patent: Jul. 21, 2026

(54) SEMICONDUCTOR DEVICE FOR IMPROVING ON VOLTAGE AND SATURATION VOLTAGE

(71) Applicant: FUJI ELECTRIC CO., LTD., Kawasaki (JP)

(72) Inventor: Koh Yoshikawa, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 601 days.

(21) Appl. No.: 18/158,433

(22) Filed: Jan. 23, 2023

(65) Prior Publication Data

US 2023/0282737 A1 Sep. 7, 2023

(30) Foreign Application Priority Data

Mar. 4, 2022 (JP) ................................. 2022-033124

(51) Int. Cl.
H10D 12/00 (2025.01)
H10D 62/13 (2025.01)
(Continued)

(52) U.S. Cl.
CPC ......... H10D 12/481 (2025.01); H10D 62/133 (2025.01); H10D 62/393 (2025.01); H10D 64/513 (2025.01)

(58) Field of Classification Search
CPC .. H10D 12/481; H10D 62/133; H10D 62/393; H10D 64/513; H10D 62/127;
(Continued)

(56) References Cited

U.S. PATENT DOCUMENTS

2005/0062064 A1 3/2005 Hattori
2008/0079066 A1 4/2008 Hamaguchi
(Continued)

FOREIGN PATENT DOCUMENTS

EP 0399530 A1 11/1990
JP S6226687 A 2/1987
(Continued)

OTHER PUBLICATIONS

Office Action issued for counterpart Japanese Application No. 2022-033124, transmitted from the Japanese Patent Office on Nov. 18, 2025.

*Primary Examiner* — Shahed Ahmed

(57) ABSTRACT

Provided is a semiconductor device including: a semiconductor substrate; gate trench portions; an emitter electrode; a mesa portion; an emitter region of a first conductivity type provided on an upper surface of the mesa portion and in contact with the gate trench portions; a contact region of a second conductivity type provided on the upper surface of the mesa portion; a base region of a second conductivity type provided below the emitter region and the contact region, in contact with the gate trench portions, and having a lower doping concentration than the contact region; a drift region of a first conductivity type provided below the base region and having a lower doping concentration than the emitter region; and a high resistance portion provided between the emitter electrode and the base region in a depth direction of the semiconductor substrate and having a higher resistance than the emitter region.

13 Claims, 45 Drawing Sheets

(51) Int. Cl.
H10D 62/17 (2025.01)
H10D 64/27 (2025.01)

(58) Field of Classification Search
CPC .... H10D 62/145; H10D 64/23; H10D 64/411;
H10D 12/411–491; H10D 12/031–038;
H10D 62/141–148; H10D 84/40–409;
H10D 62/60–605
See application file for complete search history.

(56) References Cited

U.S. PATENT DOCUMENTS

| | | | | |
|---|---|---|---|---|
| 2013/0015493 | A1* | 1/2013 | Senoo .................. | H10D 30/668 |
| | | | | 257/E29.198 |
| 2015/0108564 | A1 | 4/2015 | Miura | |
| 2015/0263146 | A1 | 9/2015 | Ogura | |
| 2017/0179267 | A1 | 6/2017 | Hikasa | |
| 2017/0229535 | A1 | 8/2017 | Hatta | |

| | | | | |
|---|---|---|---|---|
| 2018/0182885 | A1* | 6/2018 | Kobayashi ........... | H10D 64/513 |
| 2021/0384343 | A1 | 12/2021 | Takeuchi | |
| 2023/0031686 | A1* | 2/2023 | Iwakaji ................ | H03K 17/567 |

FOREIGN PATENT DOCUMENTS

| | | | |
|---|---|---|---|
| JP | S62266871 | A | 11/1987 |
| JP | H02307274 | A | 12/1990 |
| JP | H0613620 | A | 1/1994 |
| JP | H10173170 | A | 6/1998 |
| JP | 2001250947 | A | 9/2001 |
| JP | 2008091491 | A | 4/2008 |
| JP | 2013239554 | A | 11/2013 |
| JP | 2015095578 | A | 5/2015 |
| JP | 2015176891 | A | 10/2015 |
| JP | 2015213163 | A | 11/2015 |
| JP | 2019046996 | A | 3/2019 |
| JP | 2020141130 | A | 9/2020 |
| WO | 2013172079 | A1 | 11/2013 |
| WO | 2016063644 | A1 | 4/2016 |
| WO | 2017169777 | A1 | 10/2017 |

* cited by examiner c-c

SEMICONDUCTOR DEVICE FOR IMPROVING ON VOLTAGE AND SATURATION VOLTAGE

The contents of the following Japanese patent application(s) are incorporated herein by reference:

NO. 2022-033124 filed in JP on Mar. 4, 2022

BACKGROUND

1. Technical Field

The present invention relates to a semiconductor device.

2. Related Art

Conventionally, there is known a technique of changing, in a semiconductor device such as an IGBT (Insulated Gate Bipolar Transistor), an arrangement of a region of a first conductivity type, such as an emitter region, and a region of a second conductivity type, such as a contact region, to thus improve characteristics (see, for example, Patent Documents 1 and 2).

Patent Document 1: Japanese Patent Application Publication No. 2008-91491

Patent Document 2: Japanese Patent Application Publication No. H10-173170

DESCRIPTION OF EXEMPLARY EMBODIMENTS

Figure 1:
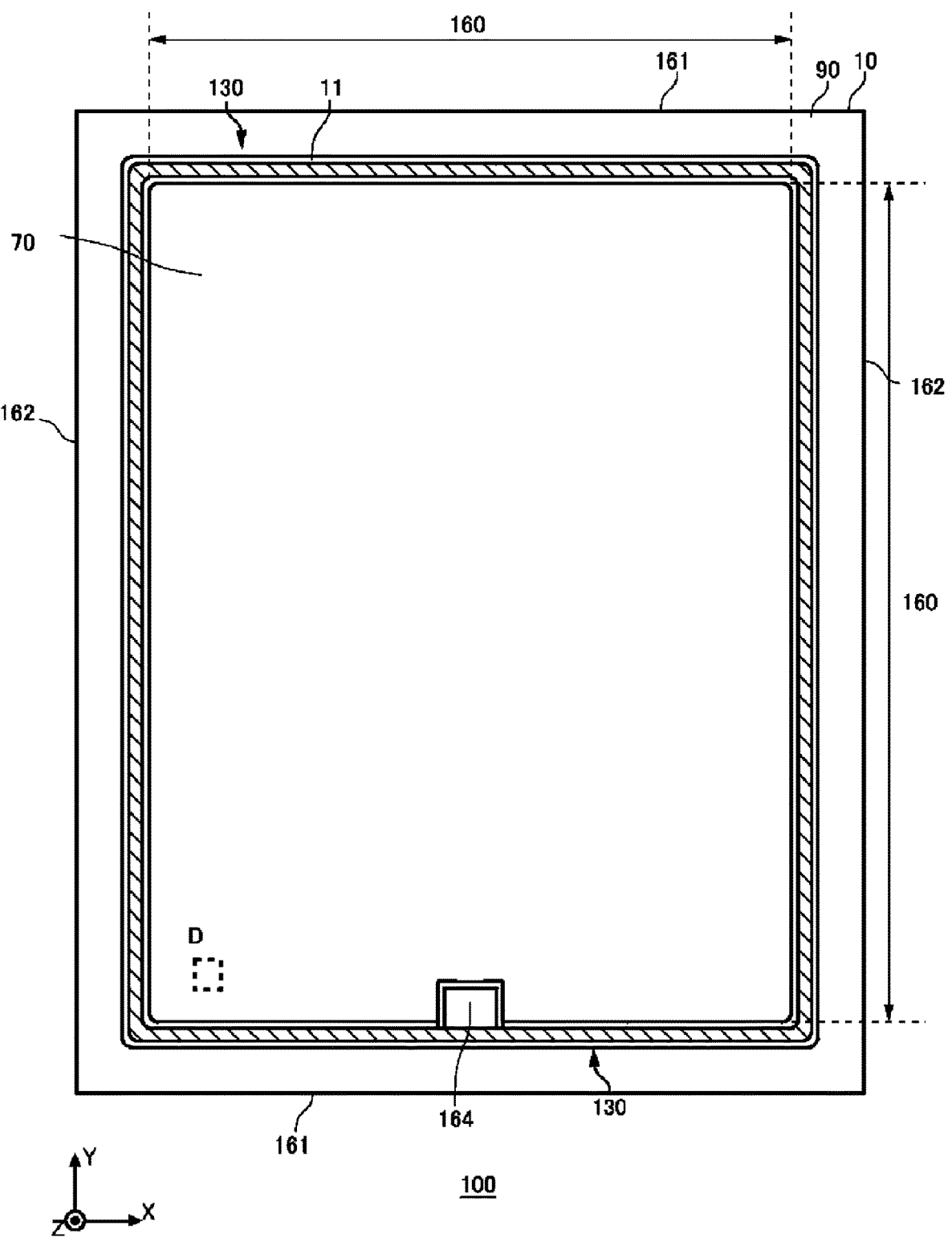
FIG. 1 is a top view showing an example of a semiconductor device 100.

Hereinafter, the present invention will be described through embodiments of the invention, but the following embodiments do not limit the claimed invention. In addition, not all of the combinations of features described in the embodiments are essential to the solution of the invention.

As used herein, one side in a direction parallel to a depth direction of a semiconductor substrate is referred to as "upper" and the other side is referred to as "lower". One surface of two principal surfaces of a substrate, a layer, or other members is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. It is to be noted that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. In addition, the axis perpendicular to the upper surface and the lower surface of the semiconductor substrate is defined as the Z axis. In the present specification, the direction of the Z axis may be referred to as the depth direction. In addition, as used herein, a direction parallel to the upper surface and the lower surface of the semiconductor substrate, including the X axis and the Y axis, may be referred to as a horizontal direction.

In addition, a region from the center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side.

In the present specification, a case where a term such as "same" or "equal" is mentioned may include a case where an error due to a variation in manufacturing or the like is included. The error is, for example, within 10%.

In the present specification, a conductivity type of a doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting a conductivity type of the P type.

In the present specification, a doping concentration means a concentration of the donor or a concentration of the acceptor in a thermal equilibrium state. In the present specification, a net doping concentration means a net concentration obtained by adding the donor concentration set to be a positive ion concentration to the acceptor concentration set to be a negative ion concentration, taking into account of polarities of charges. As an example, when the donor concentration is ND and the acceptor concentration is NA, the net doping concentration at any position is given as ND-NA. In the present specification, the net doping concentration may be simply referred to as a doping concentration.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be referred to as a hydrogen donor.

In the present specification, a description of a P+ type or an N+ type means a higher doping concentration than that of the P type or the N type, and a description of a P− type or an N− type means a lower doping concentration than that of the P type or the N type. The unit system in the present specification is an SI unit system unless otherwise specified. The unit of length may be expressed in cm, but various calculations may be performed after conversion into meters (m).

A chemical concentration in the present specification indicates an atomic density of an impurity measured regardless of an electrical activation state. The chemical concentration (atomic density) can be measured by, for example, secondary ion mass spectrometry (SIMS). The net doping concentration described above can be measured by voltage-capacitance profiling (CV profiling). In addition, a carrier concentration measured by a spreading resistance profiling method (SRP method) may be set as the net doping concentration. The carrier concentration measured by the CV profiling or the SRP method may be a value in a thermal equilibrium state. In addition, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration. In the present specification, the doping concentration of the N type region may be referred to as the donor concentration, and the doping concentration of the P type region may be referred to as the acceptor concentration.

Further, when a concentration distribution of the donor, acceptor, or net doping has a peak in a region, the peak value may be set to be the concentration of the donor, acceptor, or net doping in the region. In a case where the concentration of the donor, acceptor, or net doping is substantially uniform in a region, or the like, an average value of the concentration of the donor, acceptor, or net doping in the region may be set to be the concentration of the donor, acceptor, or net doping. In the present specification, atoms/cm$^3$ or/cm$^3$ is used for concentration display per unit volume. This unit is used for the donor or acceptor concentration or the chemical concentration in the semiconductor substrate. The expression of atoms may be omitted.

The carrier concentration measured by the SRP method may be lower than the concentration of the donor or the acceptor. In a range where a current flows when a spreading resistance is measured, a carrier mobility of the semiconductor substrate may be lower than a value in a crystalline state. The reduction in the carrier mobility occurs when carriers are scattered due to disorder (disorder) of a crystal structure due to a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorus or arsenic serving as a donor, or an acceptor concentration of boron serving as an acceptor is approximately 99% of chemical concentrations of these. On the other hand, in the silicon semiconductor, a donor concentration of hydrogen serving as a donor is approximately 0.1% to 10% of a chemical concentration of hydrogen. Each concentration in the present specification may be a value at room temperature. As an example, a value at 300K (Kelvin) (about 26.9° C.) may be used for a value at room temperature.

FIG. 1 is a top view showing an example of a semiconductor device 100. FIG. 1 shows a position at which each member is projected onto an upper surface of a semiconductor substrate 10. FIG. 1 merely shows some members of the semiconductor device 100, and omits illustrations of some members.

The semiconductor device 100 includes the semiconductor substrate 10. The semiconductor substrate 10 is a substrate formed of a semiconductor material. Although the semiconductor substrate 10 is a silicon substrate as an example, the material of the semiconductor substrate 10 is not limited to silicon.

The semiconductor substrate 10 has a first end side 161 and a second end side 162 in a top view. When merely referred to as the top view in the present specification, it means that the semiconductor substrate 10 is viewed from an upper surface side. The semiconductor substrate 10 of the present example has one set of first end sides 161 facing each other in a top view. In addition, the semiconductor substrate 10 of the present example has one set of second end sides 162 facing each other in a top view. In FIG. 1, the first end side 161 is parallel to the X axis direction. The second end side 162 is parallel to the Y axis direction. In addition, the Z axis is perpendicular to the upper surface of the semiconductor substrate 10. Moreover, the first end side 161 is perpendicular to an extending direction of a gate trench portion to be described later. The second end side 162 is parallel to the extending direction of the gate trench portion to be described later.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but is omitted in FIG. 1.

In the present example, the active portion 160 is provided with a transistor portion 70 including a transistor device such as an IGBT. In another example, the transistor portion 70 and the diode portion including the diode device such as a free wheel diode (FWD) may be alternately arranged along a predetermined array direction on the upper surface of the semiconductor substrate 10. Although one transistor portion 70 is provided in the present example, a plurality of transistor portions 70 may also be provided. A P+ type well region or a gate runner may be provided between the transistor portions 70.

The transistor portion 70 has the P type collector region of the P+ type in a region in contact with the lower surface of the semiconductor substrate 10. Further, in the transistor portion 70, a surface MOS structure including an N+ type emitter region, a P– type base region, an N– type drift region, a gate conductive portion, and a gate dielectric film is arranged periodically on the upper surface side of the semiconductor substrate 10.

The semiconductor device 100 may have one or more pads above the semiconductor substrate 10. The semiconductor device 100 of the present example includes a gate pad 164. The semiconductor device 100 may include pads such as an anode pad, a cathode pad, and a current detection pad. Each pad is arranged in the vicinity of the first end side 161. The vicinity of the first end side 161 refers to a region between the first end side 161 and the emitter electrode in a top view. When the semiconductor device 100 is mounted, each pad may be connected to an external circuit via a wiring such as a wire.

A gate potential is applied to the gate pad 164. The gate pad 164 is electrically connected to a conductive portion of the gate trench portion of the active portion 160. The semiconductor device 100 includes a gate runner 130 that connects the gate pad 164 and the gate trench portion. In FIG. 1, the gate runner 130 is hatched with diagonal lines.

The gate runner 130 is arranged between the active portion 160 and the first end side 161 or the second end side 162 in a top view. The gate runner 130 of the present example surrounds the active portion 160 in a top view. A region surrounded by the gate runner 130 in a top view may be the active portion 160. Further, the gate runner 130 is connected to the gate pad 164. The gate runner 130 is arranged above the semiconductor substrate 10. The gate runner 130 may be a metal wiring containing aluminum or the like. The gate runner 130 may be provided separate from the emitter electrode.

A P type outer circumferential well region 11 is provided so as to overlap the gate runner 130. That is, similar to the gate runner 130, the P type outer circumferential well region 11 surrounds the active portion 160 in a top view. The P type outer circumferential well region 11 is provided so as to extend with a predetermined width also in a range not overlapping the gate runner 130. The P type outer circumferential well region 11 is a region of the second conductivity type. The P type outer circumferential well region 11 of the present example is of the P+ type. An impurity concentration of the P type outer circumferential well region 11 may be $5.0 \times 10^{17}$ atoms/cm$^3$ or more and $5.0 \times 10^{19}$ atoms/cm$^3$ or less. The impurity concentration of the P type outer circumferential well region 11 may be $2.0 \times 10^{18}$ atoms/cm$^3$ or more and $2.0 \times 10^{19}$ atoms/cm$^3$ or less.

In addition, the semiconductor device 100 may include a temperature sensing portion (not shown) which is a PN junction diode formed of polysilicon or the like, and a current detection portion (not shown) which simulates the operation of the transistor portion 70 provided in the active portion 160. The temperature sensing portion may be connected to the anode pad and the cathode pad via a wiring. When the temperature sensing portion is provided, the temperature sensing portion is preferably provided at a center of the semiconductor substrate 10 in the X axis direction and the Y axis direction.

The semiconductor device 100 of the present example includes an edge termination structure portion 90 between the active portion 160 and the first end side 161 or the second end side 162 in a top view. The edge termination structure portion 90 of the present example is arranged between the gate runner 130 and the first end side 161 or the second end side 162. The edge termination structure portion 90 relaxes an electric field strength on the upper surface side of the semiconductor substrate 10. The edge termination structure portion 90 may include at least one of a guard ring, a field plate, or a RESURF annularly provided surrounding the active portion 160.

Figure 2:
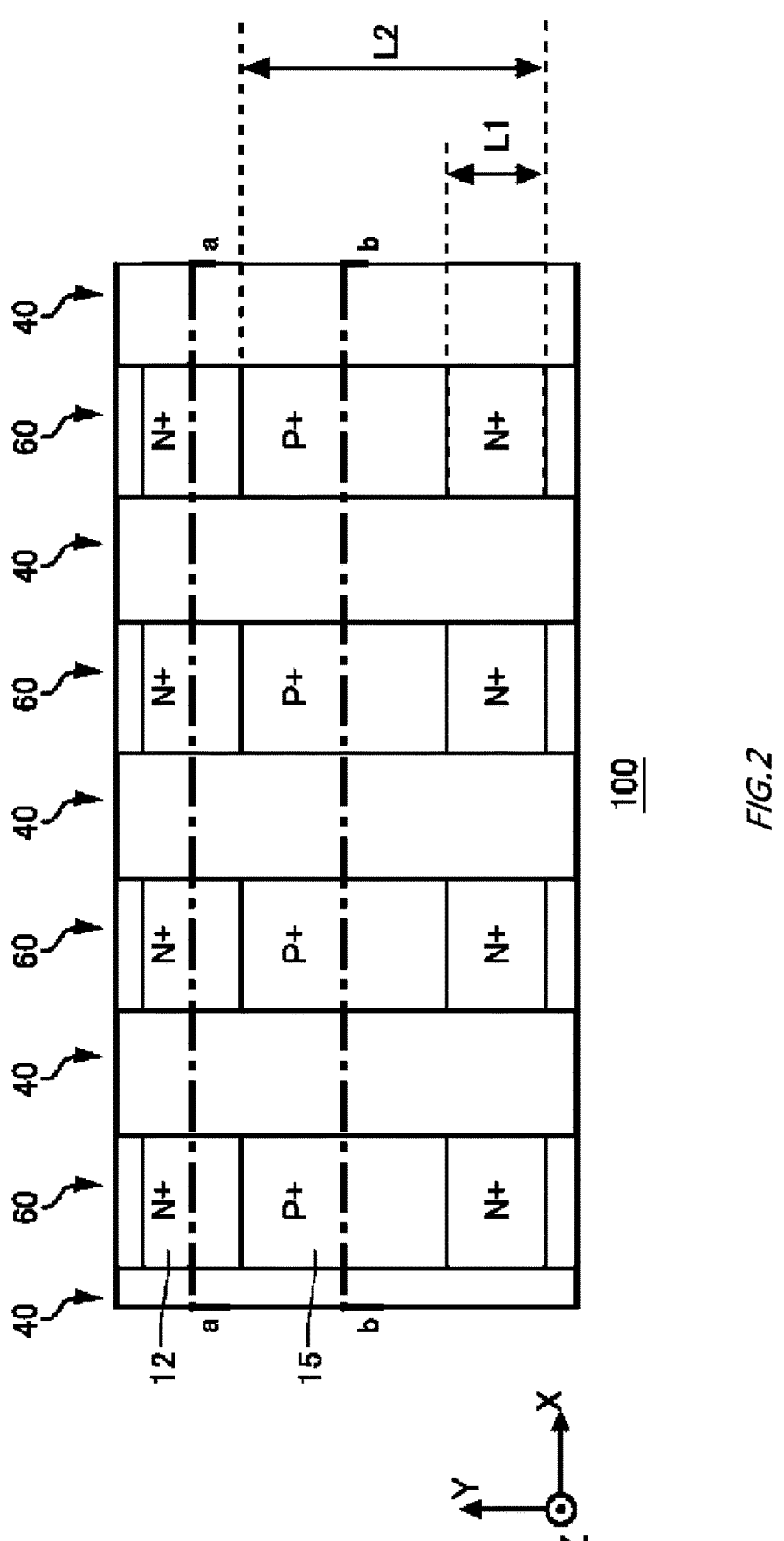
FIG. 2 is a diagram showing a comparative example of an arrangement on an upper surface of a semiconductor substrate 10 in a region D shown in FIG. 1.

FIG. 2 is a diagram showing a comparative example of an arrangement on the upper surface of the semiconductor substrate 10 in a region D shown in FIG. 1. The region D is a region including the transistor portion 70 of the active portion 160. In FIG. 2, the semiconductor device 100 includes gate trench portions 40, N type emitter regions 12, and P type contact regions 15 that are provided inside the upper surface side of the semiconductor substrate 10. FIG.

2 shows the arrangement of the gate trench portions 40, the N type emitter regions 12, and the P type contact regions 15 on the upper surface of the semiconductor substrate 10.

The transistor portion 70 includes a plurality of gate trench portions 40 arrayed in an array direction. In the present example, the gate trench portions 40 are provided in the active portion 160 on the upper surface of the semiconductor substrate 10. The gate trench portions 40 may also be provided in the P type outer circumferential well region 11. The gate trench portions 40 are provided in a striped pattern in a top view in the transistor portion 70. Although only the gate trench portions 40 are arrayed in the present example, one gate trench portion 40 and one dummy trench portion may be provided alternately. In FIG. 2, the array direction is the X axis direction. The gate trench portions 40 may be provided so as to extend in the extending direction (Y axis direction).

Mesa portions 60 are provided between the respective gate trench portions 40 in the array direction. The mesa portion 60 refers to a region sandwiched between the trench portions inside the semiconductor substrate 10. That is, the mesa portion 60 may be provided between adjacent gate trench portions 40. As an example, an upper end of the mesa portion 60 is the upper surface of the semiconductor substrate 10. A depth position of a lower end of the mesa portion 60 is the same as a depth position of a lower end of the trench portion. The mesa portion 60 of the present example is provided so as to extend in the extending direction (Y axis direction) along the gate trench portions 40, on the upper surface of the semiconductor substrate 10.

In each of the mesa portions 60, at least one of the N type emitter region 12 of the first conductivity type or the P type contact region 15 of the second conductivity type may be provided. In the present example, the N type emitter region 12 is of the N+ type, and the P type contact region 15 is of the P+ type. The N type emitter region 12 and the P type contact region 15 may be provided between the P type base region and the upper surface of the semiconductor substrate 10 in the depth direction.

The mesa portion 60 of the transistor portion 70 has the N type emitter region 12 exposed on the upper surface of the semiconductor substrate 10. The N type emitter region 12 is provided in contact with the gate trench portions 40. The mesa portion 60 in contact with the gate trench portion 40 may be provided with the P type contact region 15 exposed on the upper surface of the semiconductor substrate 10.

Each of the P type contact region 15 and the N type emitter region 12 in the mesa portion 60 is provided from one trench portion to the other trench portion in the X axis direction. As an example, the P type contact region 15 and the N type emitter region 12 in the mesa portion 60 are alternately arranged along the extending direction of the trench portion (Y axis direction).

In FIG. 2, a width of the N type emitter region 12 in the Y axis direction is set as an emitter width L1. Also in FIG. 2, a sum of a width of the N type emitter region 12 in the Y axis direction and a width of the P type contact region 15 in the Y axis direction is set as a pitch width L2. The emitter width L1 is, for example, 1.5 μm, and the pitch width L2 is, for example, 5.0 μm.

In another example, the P type contact region 15 and the N type emitter region 12 in the mesa portion 60 may be provided in a striped pattern along the extending direction of the trench portion (Y axis direction). For example, the N type emitter region 12 is provided in a region in contact with the trench portion, and the P type contact region 15 is provided in a region sandwiched between the N type emitter regions 12.

Figure 3:
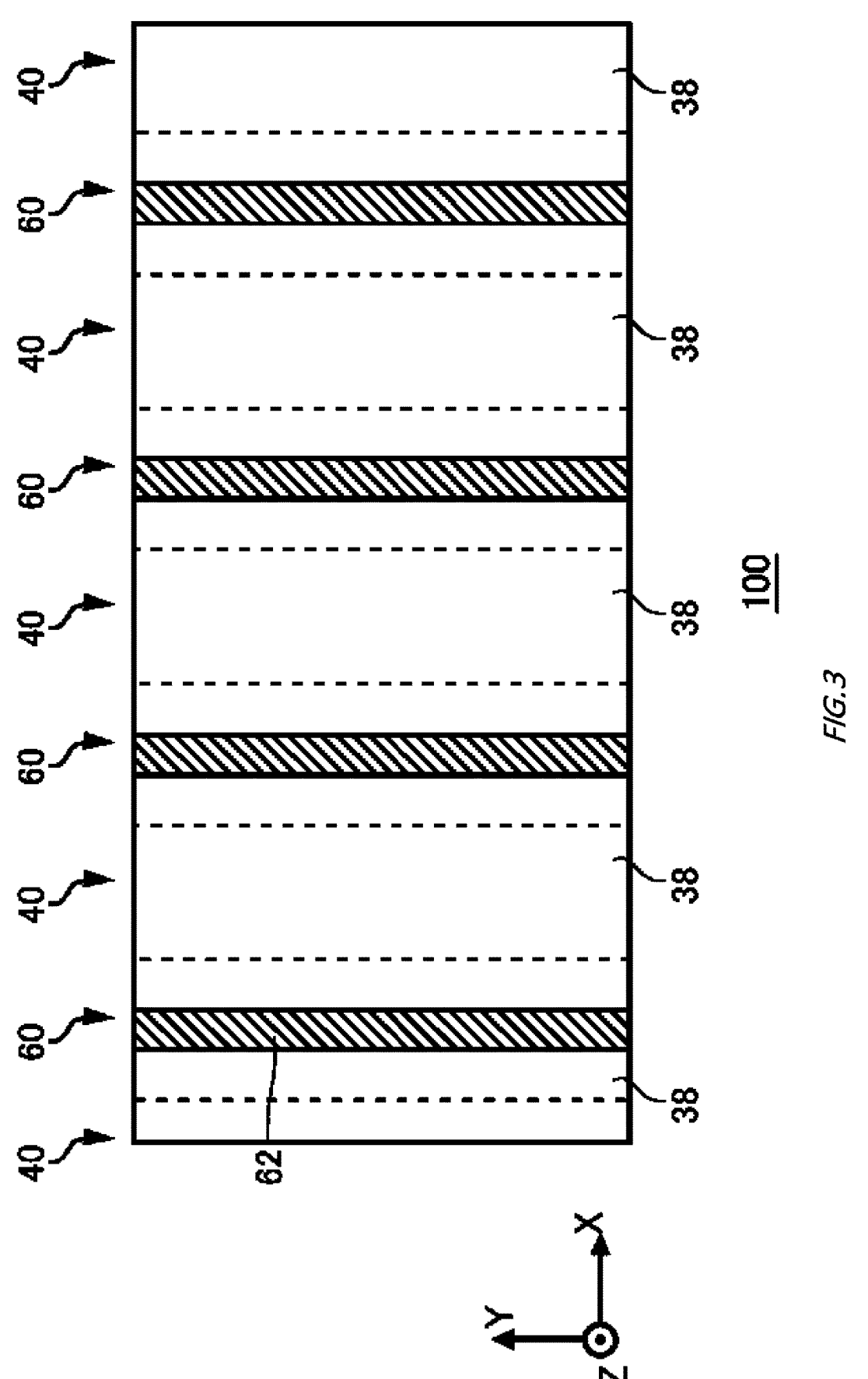
FIG. 3 is a diagram showing a comparative example of an arrangement on an upper surface of an interlayer dielectric film 38 in the region D shown in FIG. 1.

FIG. 3 is a diagram showing a comparative example of an arrangement on an upper surface of an interlayer dielectric film 38 in the region D shown in FIG. 1. FIG. 3 shows an arrangement in an XY plane different from FIG. 2. In FIG. 3, the semiconductor device 100 includes the interlayer dielectric film 38 and a metal plug 62 provided inside the upper surface side of the semiconductor substrate 10. FIG. 3 shows the arrangement of the metal plug 62 on the upper surface of the interlayer dielectric film 38. Also in FIG. 3, the arrangement of the gate trench portions 40 and the mesa portions 60 is indicated by dotted lines.

The interlayer dielectric film 38 is provided above the semiconductor substrate 10. In the present example, the interlayer dielectric film 38 is provided on the upper surface of the semiconductor substrate 10. The interlayer dielectric film 38 is a film including at least one layer of a dielectric film such as silicate glass added with impurities of boron, phosphorus, or the like, a thermally oxidized film, or other dielectric films. The interlayer dielectric film 38 is provided above the gate trench portions 40. In the present example, the interlayer dielectric film 38 covers the gate trench portions 40.

The metal plug 62 is formed in the interlayer dielectric film 38. The metal plug 62 may be formed in a contact hole provided in the interlayer dielectric film 38. The metal plug 62 electrically connects the semiconductor substrate 10 (mesa portions 60) and the emitter electrode. By providing the metal plug 62, a contact resistance between the semiconductor substrate 10 and the emitter electrode can be reduced. As an example, the metal plug 62 is formed of Ta, W, Mo, or the like. The metal plug 62 is provided above the mesa portion 60.

Figure 4:
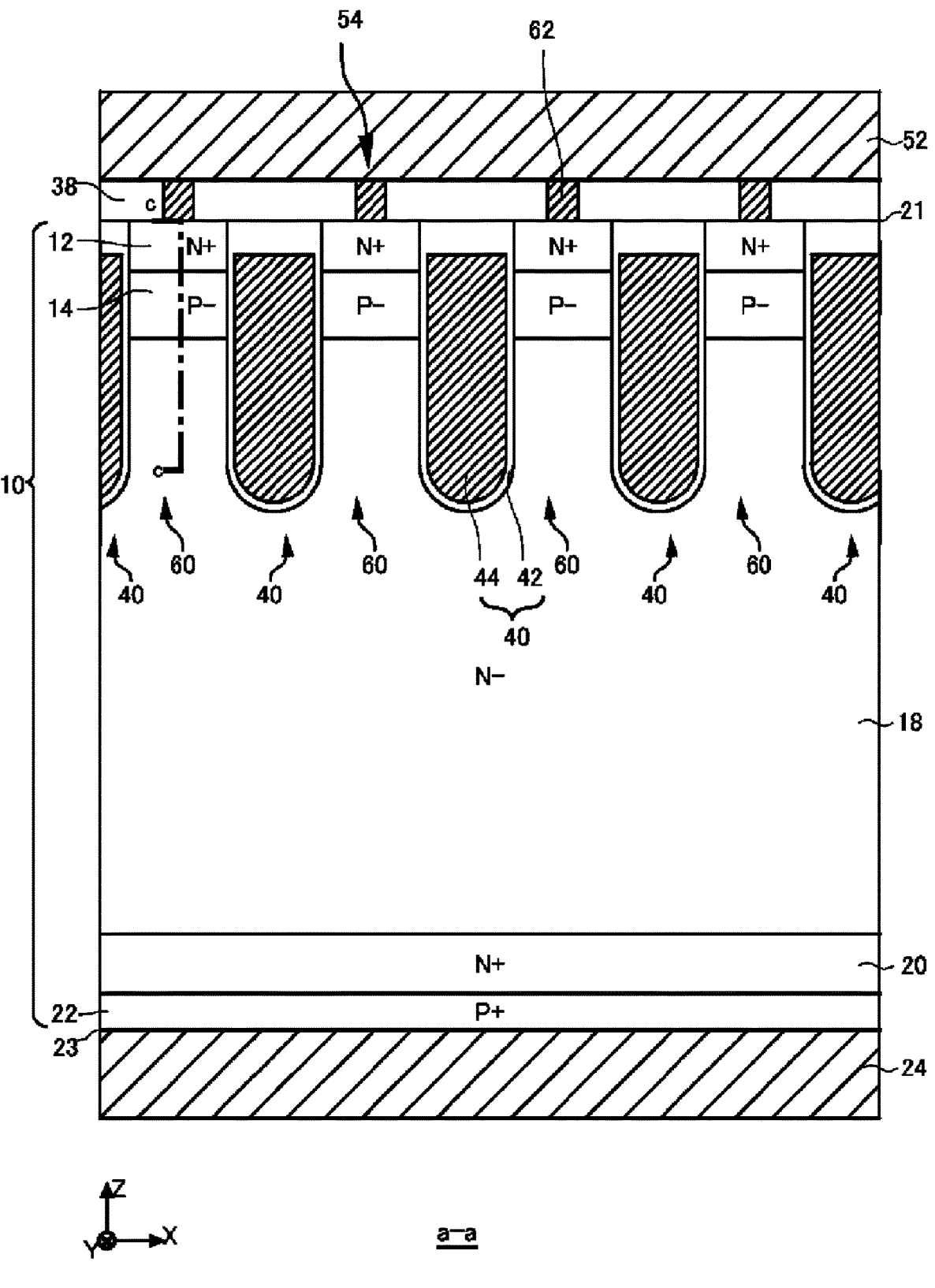
FIG. 4 is a diagram showing an example of a cross section a-a shown in FIG. 2.

FIG. 4 is a diagram showing an example of a cross section a-a shown in FIG. 2. The cross section a-a is an XZ plane that passes through the N type emitter regions 12. In the cross section, the semiconductor device 100 of the present example includes the semiconductor substrate 10, the interlayer dielectric film 38, the emitter electrode 52, a collector electrode 24, and the metal plug 62.

The emitter electrode 52 is provided above the gate trench portions 40, the N type emitter regions 12, and the P type contact regions 15. The emitter electrode 52 is in contact with the N type emitter regions 12 and the P type contact regions 15 on the upper surface 21 of the semiconductor substrate 10 through contact holes 54.

The emitter electrode 52 is formed of a material including metal. For example, at least a partial region of the emitter electrode 52 is formed of aluminum or an aluminum-silicon alloy, for example, a metal alloy such as AlSi or AlSiCu. The emitter electrode 52 may have a barrier metal formed of titanium, a titanium compound, or the like below a region formed of aluminum or the like. The metal plug 62 may be in contact with the barrier metal, aluminum, and the like in the contact hole 54.

The interlayer dielectric film 38 is provided on the upper surface 21 of the semiconductor substrate 10. The interlayer dielectric film 38 is a film including at least one layer of a dielectric film such as silicate glass added with impurities of boron, phosphorus, or the like, a thermally oxidized film, or other dielectric films. The interlayer dielectric film 38 is provided with the contact holes 54. It is to be noted that the interlayer dielectric film 38 does not need to be provided. In this case, the emitter electrode 52 may be in contact with the upper surface 21 of the semiconductor substrate 10.

The emitter electrode 52 is provided above the semiconductor substrate 10. In the present example, the emitter electrode 52 is provided above the interlayer dielectric film 38. The emitter electrode 52 is in contact with the upper surface 21 of the semiconductor substrate 10 through the contact holes 54 of the interlayer dielectric film 38. It is to be noted that the emitter electrode 52 does not need to be provided above the P type outer circumferential well region 11. The gate runner 130 may be provided above the P type outer circumferential well region 11.

The collector electrode 24 is provided on the lower surface 23 of the semiconductor substrate 10. Similar to the emitter electrode 52, the collector electrode 24 is formed of a metal material such as aluminum. In the present specification, a direction connecting the emitter electrode 52 and the collector electrode 24 (Z axis direction) is referred to as the depth direction.

Each mesa portion 60 is provided with a P type base region 14 of the second conductivity type. The P type base region 14 may be in contact with the gate trench portion 40. The N type emitter region 12 and the P type contact region 15 are provided between the upper surface 21 of the semiconductor substrate 10 and the P type base region 14. The P type base region 14 of the present example is of the P− type. That is, the P type base region 14 may have a lower doping concentration than the P type contact region 15.

The semiconductor substrate 10 includes an N type drift region 18 of the first conductivity type. The N type drift region 18 of the present example is of the N− type. That is, the N type drift region 18 may have a lower doping concentration than the N type emitter region 12. The N type drift region 18 may be provided below the P type base regions 14.

In the mesa portion 60 in FIG. 4, the N type emitter region 12 of the N+ type and the P type base region 14 of the P− type are sequentially provided from the upper surface 21 side of the semiconductor substrate 10. The N type drift region 18 is provided below the P type base regions 14. The mesa portion 60 may also be provided with an N+ type accumulation region (not shown).

The N type emitter region 12 is exposed on the upper surface 21 of the semiconductor substrate 10. In addition, the N type emitter region 12 is provided in contact with the gate trench portion 40. The N type emitter region 12 may be in contact with the trench portions on both sides of the mesa portion 60. The N type emitter region 12 may have a higher doping concentration than the N type drift region 18.

The P type base region 14 is provided below the N type emitter region 12. The P type base region 14 of the present example is provided in contact with the N type emitter region 12. The P type base region 14 may be in contact with the gate trench portions 40 on both sides of the mesa portion 60. An impurity concentration peak of the P type base region 14 is, for example, $2.5 \times 10^{17}$ atoms/cm$^3$. The impurity concentration of the P type base region 14 may be $5.0 \times 10^{16}$ atoms/cm$^3$ or more and $1.0 \times 10^{18}$ atoms/cm$^3$ or less.

An N type buffer region 20 of the N+ type may be provided below the N type drift region 18. The doping concentration of the N type buffer region 20 is higher than the doping concentration of the N type drift region 18. The N type buffer region 20 may have a concentration peak at which the doping concentration is higher than that of the N type drift region 18. The doping concentration of the concentration peak refers to a doping concentration at a local maximum of the concentration peak. Further, as the doping concentration of the N type drift region 18, an average value of doping concentrations in a region where the doping concentration distribution is substantially flat may be used.

The N type buffer region 20 may be formed by performing ion implantation of an N type dopant such as hydrogen (proton) or phosphorus. The N type buffer region 20 of the present example is formed by performing ion implantation of hydrogen. The N type buffer region 20 may function as a field stop layer which prevents a depletion layer extending from a lower end of the P type base region 14 from reaching the P type collector region 22 of the P+ type.

The P type collector region 22 of the P+ type is provided below the N type buffer region 20. An acceptor concentration of the P type collector region 22 is higher than an acceptor concentration of the P type base region 14. The P type collector region 22 may contain the same acceptor as the P type base region 14, or may contain a different acceptor. The acceptor of the P type collector region 22 is, for example, boron. An element to be the acceptor is not limited to the examples described above.

The P type collector region 22 is exposed on the lower surface 23 of the semiconductor substrate 10 and is connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 are provided on the upper surface 21 side of the semiconductor substrate 10. In the present example, the plurality of gate trench portions 40 are provided on the upper surface 21 side of the semiconductor substrate 10. In the present example, each gate trench portion 40 penetrates through the P type base region 14 to reach the N type drift region 18 from the upper surface 21 of the semiconductor substrate 10. In a region where at least either the N type emitter region 12 or the P type contact region 15 is provided, each gate trench portion 40 also penetrates through these doping regions to reach the N type drift region 18. The configuration of the trench portion penetrating through the doping region is not limited to the one manufactured in the order of forming the doping region and then forming the trench portion. A case where a doping region is formed between the trench portions after the trench portions are formed is also included in the trench portion penetrating through the doping region.

The gate trench portion 40 includes a gate trench, a gate dielectric film 42, and a gate conductive portion 44 provided on the upper surface 21 of the semiconductor substrate 10. The gate conductive portion 44 is formed of polysilicon as a conductive material. The gate conductive portion 44 may be formed of the same material as the gate runner. The gate dielectric film 42 is provided to cover an inner wall of the gate trench. The gate dielectric film 42 may be formed by oxidizing or nitriding a semiconductor in the inner wall of the gate trench. In FIG. 4, the gate conductive portion 44 is provided on an inner side of the gate dielectric film 42 inside the gate trench. That is, the gate dielectric film 42 insulates the gate conductive portion 44 from the semiconductor substrate 10.

The gate conductive portion 44 in the gate trench portion 40 may be provided to be longer than the P type base region 14 in the depth direction. The gate trench portion 40 in the cross section is covered by the interlayer dielectric film 38 on the upper surface 21 of the semiconductor substrate 10. The gate conductive portion 44 is electrically connected to the gate runner 130. When a predetermined gate voltage is applied to the gate conductive portion 44, a channel is formed by an electron inversion layer in a surface layer of the P type base region 14 at a boundary in contact with the gate trench portion 40.

The gate trench portion 40 of the present example is covered by the interlayer dielectric film 38 on the upper surface 21 of the semiconductor substrate 10. It is to be noted that a bottom portion of the gate trench portion 40 may have a curved surface which is convex downward (a curved line shape in the cross section).

A protective film (not shown) may be provided on an upper surface of the emitter electrode 52. By providing the protective film on the upper surface of the emitter electrode 52, the electrode can be protected. The protective film may be provided by patterning. The protective film is, for example, a polyimide film.

Figure 5:
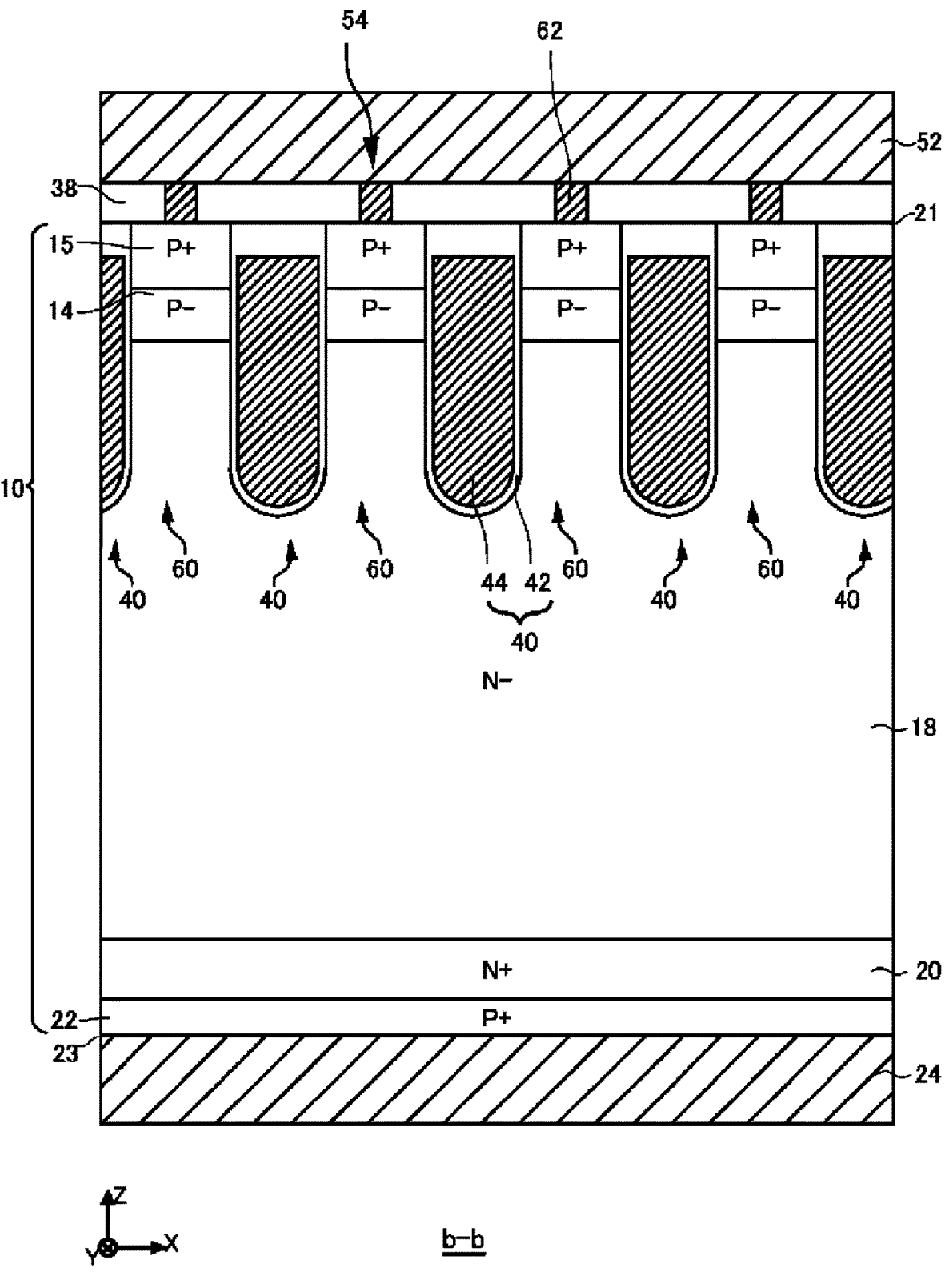
FIG. 5 is a diagram showing an example of a cross section b-b shown in FIG. 2.

FIG. 5 is a diagram showing an example of a cross section b-b shown in FIG. 2. The cross section b-b is the XZ plane that passes through the P type contact regions 15. In the cross section, the semiconductor device 100 of the present example includes the semiconductor substrate 10, the interlayer dielectric film 38, the emitter electrode 52, the collector electrode 24, and the metal plug 62.

In the present example, the P type contact regions 15 are exposed on the upper surface 21 of the semiconductor substrate 10. Also in the present example, in the mesa portion 60, the P type contact region 15 of the P+ type and the P type base region 14 of the P− type are sequentially provided from the upper surface 21 side of the semiconductor substrate 10. The N type drift region 18 is provided below the P type base regions 14.

Figure 6:
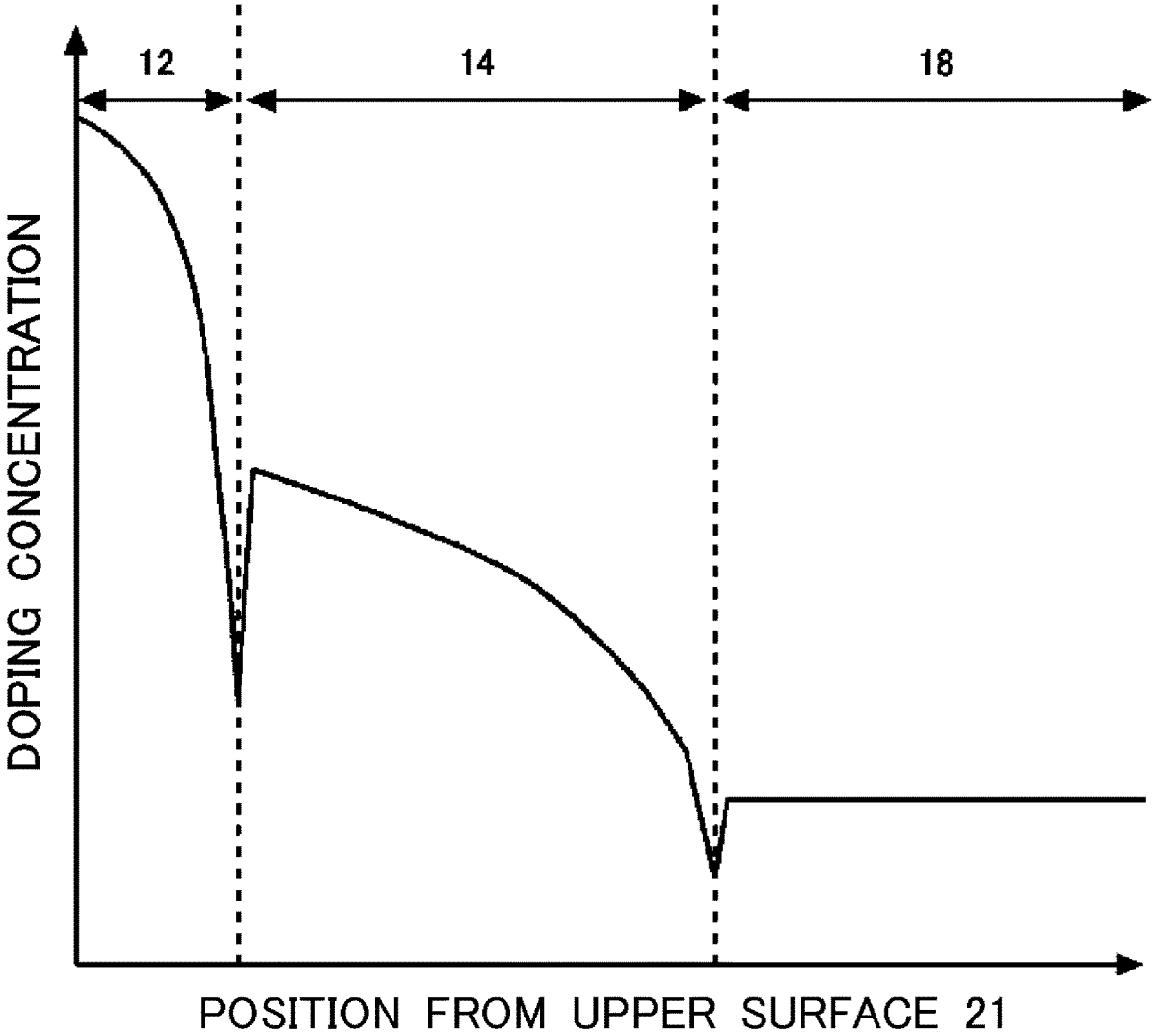
FIG. 6 is a diagram showing an example of a doping concentration distribution on a line c-c shown in FIG. 4.

FIG. 6 is a diagram showing an example of a doping concentration distribution on a line c-c shown in FIG. 4. The line c-c may be set at a position at a center of the mesa portion 60 in the X axis direction. FIG. 6 shows the doping concentration distribution in the N type emitter region 12, the P type base region 14, and the N type drift region 18.

At the center of the mesa portion 60, the doping concentration of the N type emitter region 12 may be higher than the doping concentration of the P type base region 14. The N type emitter region 12 may have a concentration peak at which the doping concentration is higher than that of the P type base region 14.

At the center of the mesa portion 60, the doping concentration of the P type base region 14 may be higher than the doping concentration of the N type drift region 18. The P type base region 14 may have a concentration peak at which the doping concentration is higher than that of the N type drift region 18.

As described above, in the transistor portion 70 of the semiconductor device 100, the surface MOS structure including the N type emitter region 12 of the N+ type, the P type base region 14 of the P− type, the N type drift region 18 of the N− type, the gate conductive portion 44, and the gate dielectric film 42 is arranged periodically on the upper surface 21 side of the semiconductor substrate 10. Owing to a current saturation function of the surface MOS structure, the IGBT has a current limiting function. Therefore, short-circuit withstand capability characteristics that enable shut-down to be performed without breakdown even after a certain time in a short circuit state where a current and a voltage are applied to the semiconductor device 100 at the same time are provided. When all cells have the surface MOS structure in a miniaturized IGBT, a saturation current becomes extremely large, so a thinning emitter structure (or repetitive structure) in which the N type emitter regions 12 of the N+ type are thinned out and the P type contact regions 15 of the P+ type are provided in place of the thinned-out N type emitter regions 12 as shown in FIG. 2 is adopted. By the thinning emitter structure, an ON voltage and a saturation current can be adjusted.

The current saturation characteristics of the surface MOS structure can be generally expressed by the following Expression 1 using parameters of the semiconductor device 100. Here, Isat represents a saturation current, Z represents a total emitter width of the N type emitter regions 12, μn represents an electron mobility, Cox represents a gate oxidized film capacity, Lch represents a channel length, Vge represents an inter-gate-emitter voltage, and Vth represents a threshold voltage. The total emitter width Z may be a sum of the emitter widths in the Y axis direction.

$$Isat = \frac{Z\mu nCox}{Lch}\left[\frac{1}{2}(Vge - Vth)^2\right]$$

In addition, a channel resistance Rch of the surface MOS structure is generally expressed by the following Expression 2. Comparing Expression 1 and Expression 2, the channel resistance Rch increases as the saturation current Isat decreases, and the channel resistance Rch decreases as the saturation current Isat increases. That is, it can be seen that there is a tradeoff correlation in which the ON voltage increases as the saturation current decreases for improving the short-circuit withstand capability of the semiconductor device 100. Since the N type emitter regions 12 are sparsely formed in the mesa portions 60 in the thinning emitter structure, the supply of an electronic current to the N type drift region 18 also becomes sparse, to thus cause non-uniformity of the current flow and an increase of the ON voltage.

$$Rch = \frac{Lch}{Z\mu nCox(Vge - Vth)}$$

Figure 7:
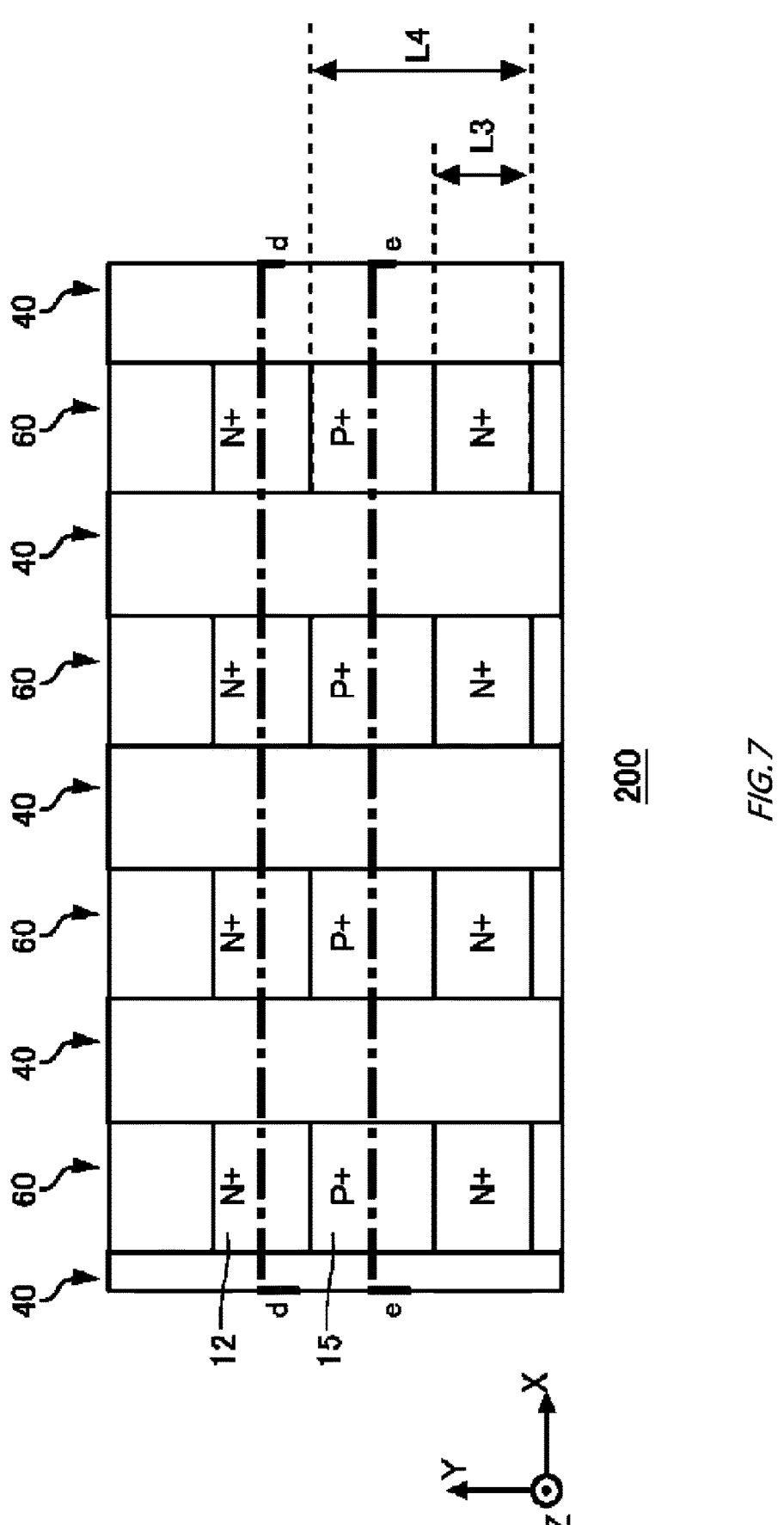
FIG. 7 is a diagram showing a semiconductor device 200 according to an example.

FIG. 7 is a diagram showing a semiconductor device 200 according to an example. FIG. 7 shows the arrangement on the upper surface 21 of the semiconductor substrate 10. FIG. 7 differs from FIG. 2 in that the width of the N type emitter region 12 in the Y axis direction is set as an emitter width L3, and a sum of the width of the N type emitter region 12 in the Y axis direction and the width of the P type contact region 15 in the Y axis direction is set as a pitch width L4. Other configurations of FIG. 7 may be the same as those of FIG. 2.

Figure 8:
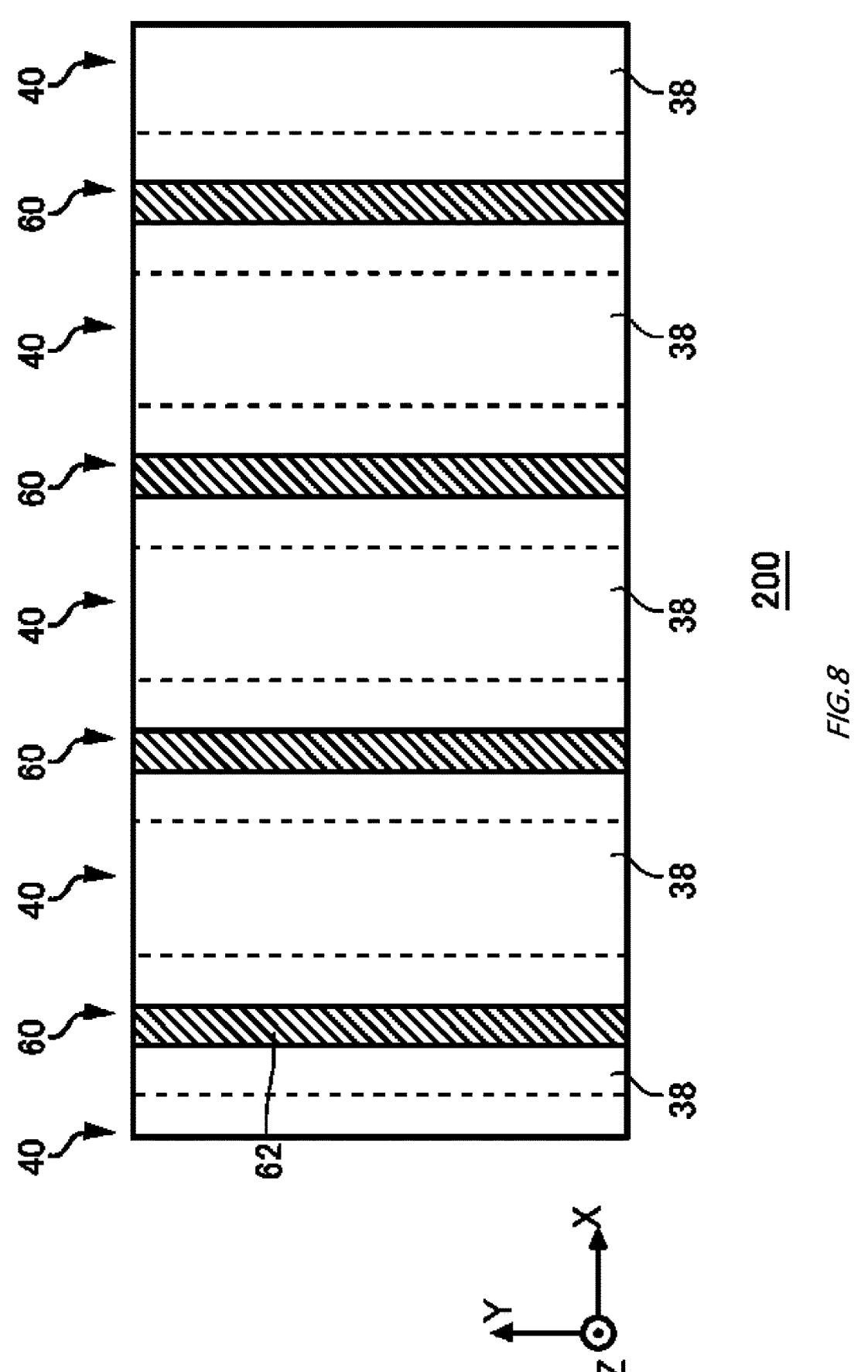
FIG. 8 is a diagram showing the semiconductor device 200 according to the example.

FIG. 8 is a diagram showing the semiconductor device 200 according to the example. FIG. 8 shows the arrangement on the upper surface of the interlayer dielectric film 38. FIG. 8 shows the arrangement in the XY plane different from FIG. 7. The configuration of FIG. 8 may be the same as that of FIG. 3.

Figure 9:
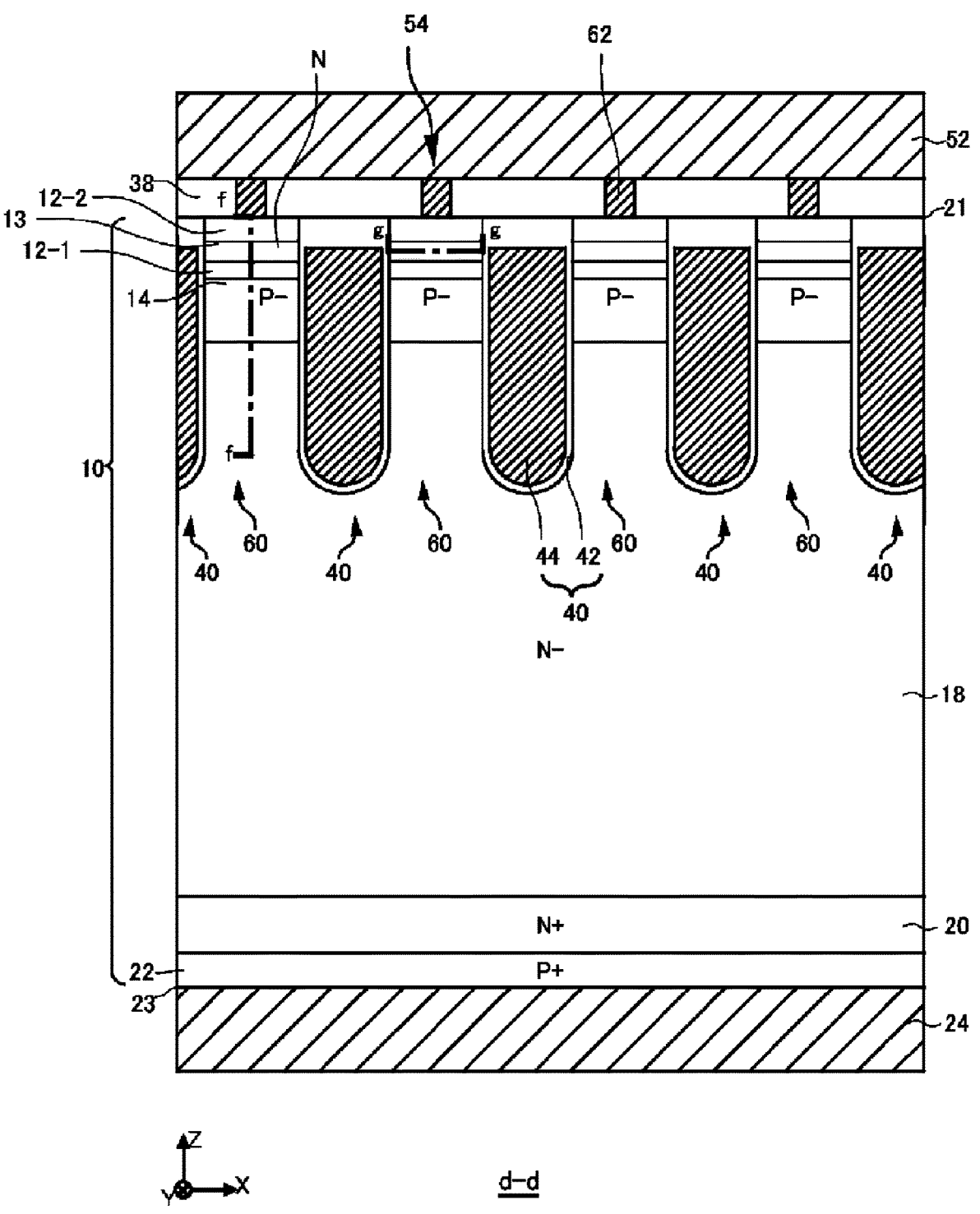
FIG. 9 is a diagram showing an example of a cross section d-d shown in FIG. 7.

FIG. 9 is a diagram showing an example of a cross section d-d shown in FIG. 7. The cross section d-d is the XZ plane that passes through the N type emitter regions 12. FIG. 9 differs from FIG. 4 in that low concentration N type emitter regions 13 are provided. Other configurations of FIG. 9 may be the same as those of FIG. 4.

The low concentration N type emitter region 13 is provided between the emitter electrode 52 and the P type base region 14 in the depth direction of the semiconductor substrate 10. In the present example, the low concentration N type emitter region 13 is provided in the N type emitter region 12. The N type emitter region 12 below the low concentration N type emitter region 13 is set as an N type emitter region 12-1, and the N type emitter region 12 above the low concentration N type emitter region 13 is set as an N type emitter region 12-2. The N type emitter region 12-1 is an example of a first high concentration emitter region. The N type emitter region 12-2 is an example of a second high concentration emitter region. It is to be noted that the N type emitter region 12 may include the low concentration N type emitter region 13. The N type emitter region 12 may include the N type emitter region 12-1, the N type emitter region 12-2, and the low concentration N type emitter region 13.

In the present example, the low concentration N type emitter region 13 has a higher resistance than the N type emitter region 12-1 and the N type emitter region 12-2. At the center of the mesa portion 60, the doping concentration of the low concentration N type emitter region 13 may be lower than the doping concentrations of the N type emitter region 12-1 and the N type emitter region 12-2. The low concentration N type emitter region 13 of the present example is of the N type. The low concentration N type emitter region 13 may alternatively be of the N− type. The low concentration N type emitter region 13 is an example of a high resistance portion.

Figure 10:
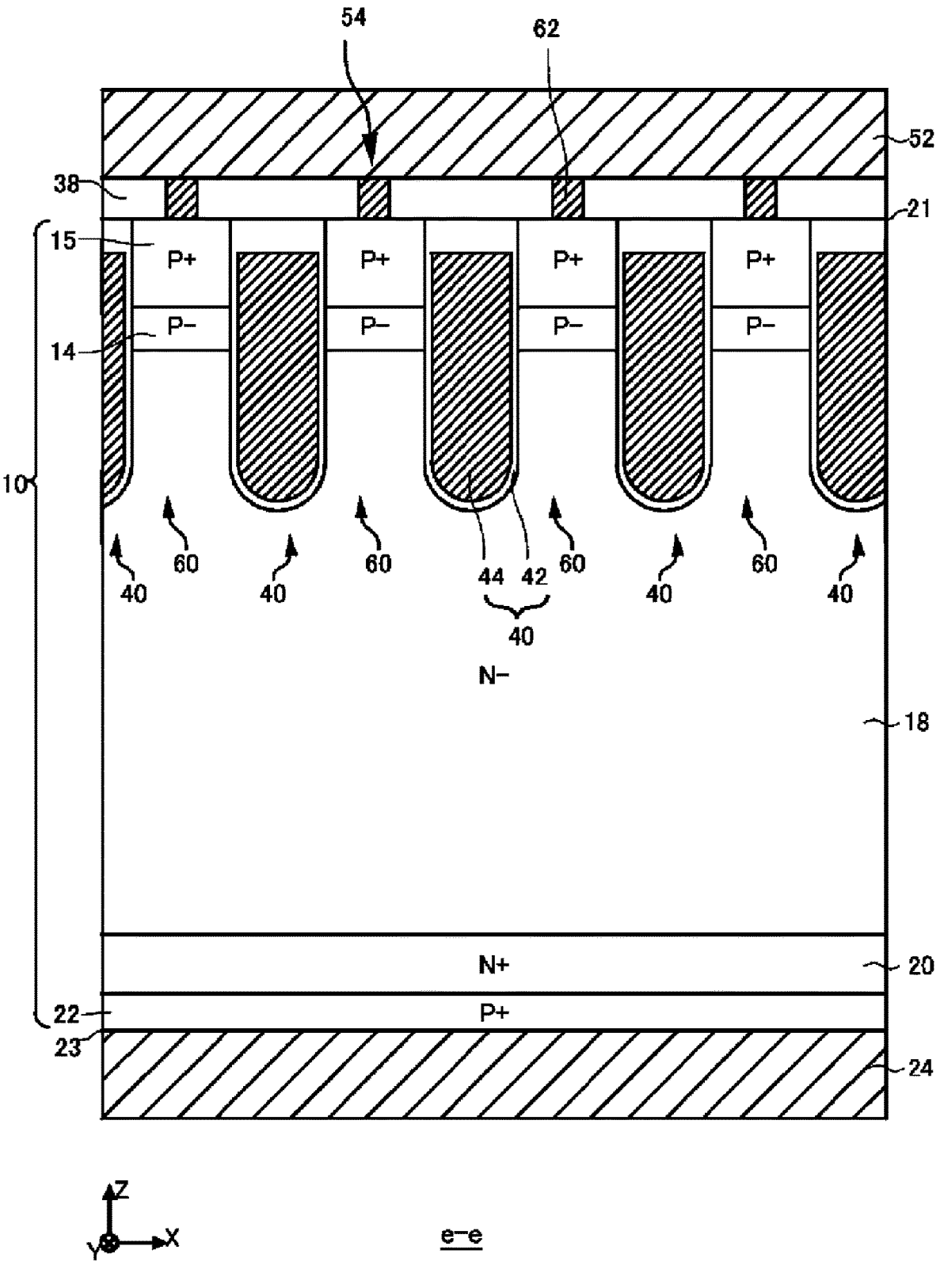
FIG. 10 is a diagram showing an example of a cross section e-e shown in FIG. 7.

FIG. 10 is a diagram showing an example of a cross section e-e shown in FIG. 7. The cross section e-e is the XZ plane that passes through the P type contact regions 15. The configuration of FIG. 10 may be the same as that of FIG. 5.

Figure 11:
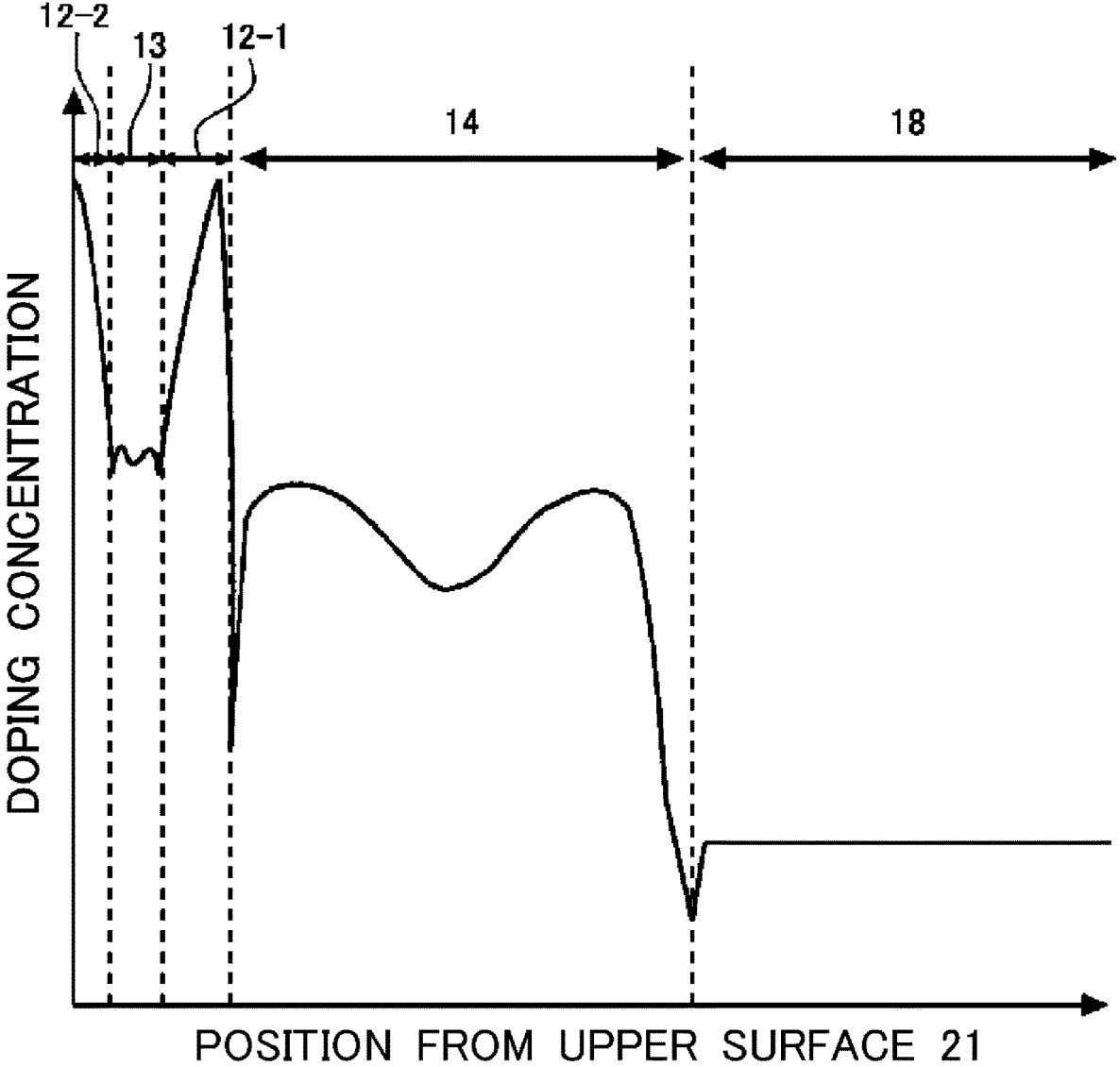
FIG. 11 is a diagram showing an example of a doping concentration distribution on a line f-f shown in FIG. 9.

FIG. 11 is a diagram showing an example of a doping concentration distribution on a line f-f shown in FIG. 9. The line f-f may be set at a position at the center of the mesa portion 60 in the X axis direction. FIG. 11 shows the doping concentration distribution in the N type emitter region 12-2, the low concentration N type emitter region 13, the N type emitter region 12-1, the P type base region 14, and the N type drift region 18.

At the center of the mesa portion 60, the doping concentration of the N type emitter region 12-1 may be higher than the doping concentration of the low concentration N type emitter region 13. The N type emitter region 12-1 may have a concentration peak at which the doping concentration is higher than that of the low concentration N type emitter region 13. At the center of the mesa portion 60, the doping concentration of the N type emitter region 12-2 may be higher than the doping concentration of the low concentration N type emitter region 13. The emitter region 12-2 may have a concentration peak at which the doping concentration is higher than that of the low concentration N type emitter region 13.

Also in the present example, at the center of the mesa portion 60, the doping concentration of the low concentration N type emitter region 13 is higher than the doping concentration of the P type base region 14. The low concentration N type emitter region 13 may have a concentration peak at which the doping concentration is higher than that of the P type base region 14.

Figure 12:
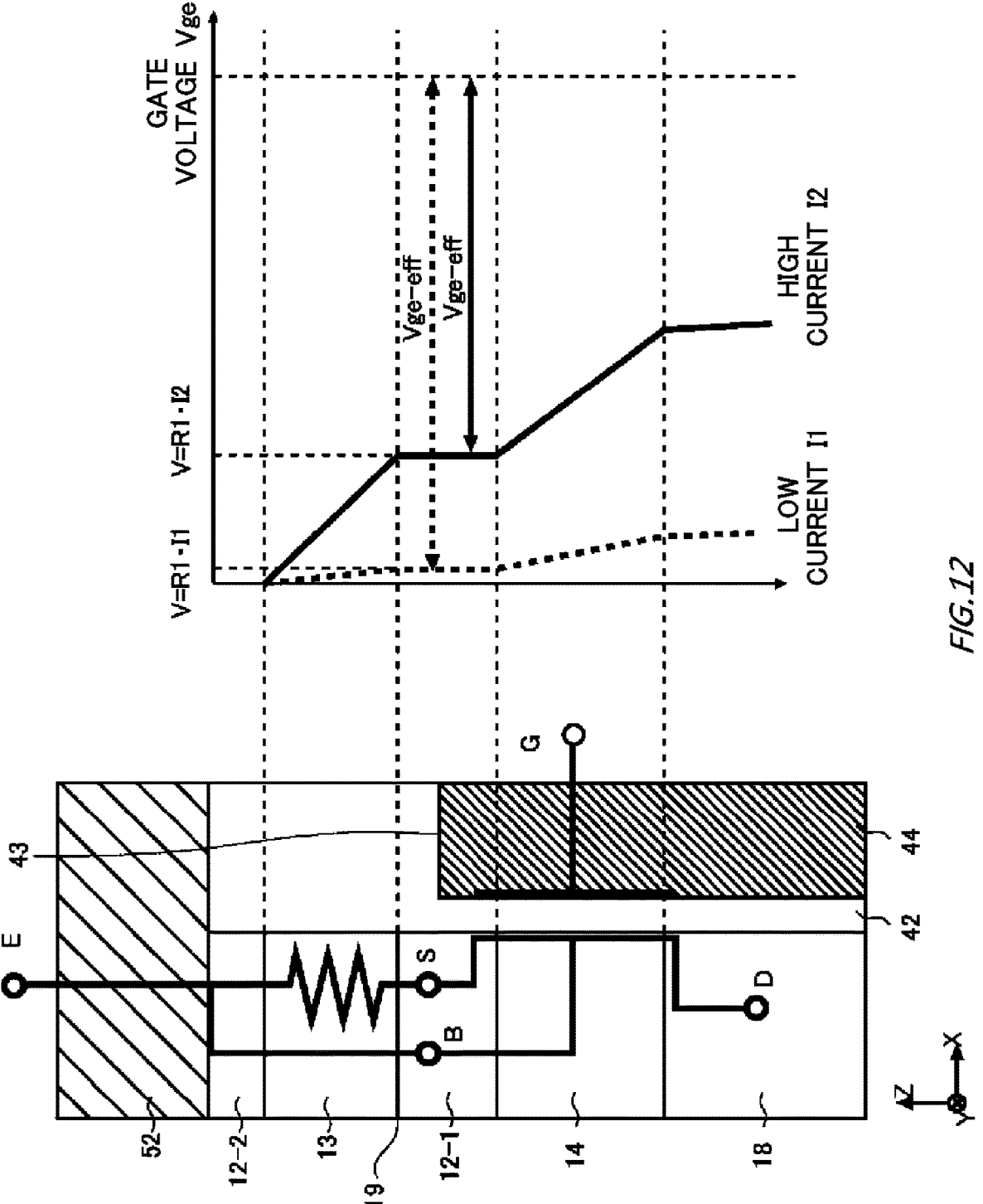
FIG. 12 is a diagram for describing an effect of a low concentration N type emitter region 13.

FIG. 12 is a diagram for describing an effect of the low concentration N type emitter region 13. In FIG. 12, a low current I1 is a current smaller than a rated current, and a high current I2 is a high current of about the same level as the saturation current. Further, the resistance of the low concentration N type emitter region 13 is represented by R1. It is to be noted that in FIG. 12, the interlayer dielectric film 38 and the metal plug 62 are omitted.

When the low concentration N type emitter region 13 is provided, a potential of the N type emitter region 12-1 varies due to a current that flows in the low concentration N type emitter region 13 and the resistance R1 of the low concentration N type emitter region 13. When the high current I2 flows, the potential of the N type emitter region 12-1 largely increases. On the other hand, when the low current I1 flows, the potential of the N type emitter region 12-1 only increases slightly. Since the gate voltage Vge for driving the surface MOS structure is constant, a potential difference Vge-eff applied to the gate dielectric film 42 becomes small in a high current region. On the other hand, the potential difference Vge-eff applied to the gate dielectric film 42 becomes relatively large in a low current region. Therefore, the saturation current can be largely suppressed.

Thus, in the present example, the semiconductor device 200 includes the low concentration N type emitter region 13 that functions as the high resistance portion. Since the low concentration N type emitter region 13 is provided, the saturation current can be reduced, and by increasing the total emitter width Z, the reduced limit current value can be adjusted. Therefore, it becomes possible to drive with a large gate voltage/emitter voltage difference in the low current region and drive with a small gate voltage/emitter voltage difference in the high current region, and realize characteristics of the semiconductor device 200 having a low ON voltage and a low saturation voltage.

In the present example, the emitter width L3 is, for example, 1.5 μm, and the pitch width L4 is, for example, 3.5 μm. Therefore, in the semiconductor device 200, the total emitter width Z can be increased as compared to the semiconductor device 100, and the low ON voltage can be realized by Expression 2.

The gate conductive portion 44 may be provided on a lower side of a position at which the low concentration N type emitter region 13 is provided in the depth direction of the semiconductor substrate 10. The gate conductive portion 44 being provided on the lower side of the position at which the low concentration N type emitter region 13 is provided in the depth direction of the semiconductor substrate 10 may mean that, for example, a position of an upper end 43 of the gate conductive portion 44 in the depth direction of the semiconductor substrate 10 is set at a position at which the N type emitter region 12-1 is provided in the depth direction of the semiconductor substrate 10. The gate conductive portion 44 being provided on the lower side of the position at which the low concentration N type emitter region 13 is provided in the depth direction of the semiconductor substrate 10 may mean that the position of the upper end 43 of the gate conductive portion 44 in the depth direction of the semiconductor substrate 10 is set on a lower side of a lower end 19 of the low concentration N type emitter region 13. Since the gate conductive portion 44 is provided on the lower side of the position at which the low concentration N type emitter region 13 is provided in the depth direction of the semiconductor substrate 10, the low concentration N type emitter region 13 is prevented from becoming a carrier accumulation layer, and it becomes easier for the low concentration N type emitter region 13 to function as the high resistance portion. It is to be noted that also in other diagrams, the gate conductive portion 44 may be provided on the lower side of the position at which the low concentration N type emitter region 13 is provided in the depth direction of the semiconductor substrate 10.

Figure 13:
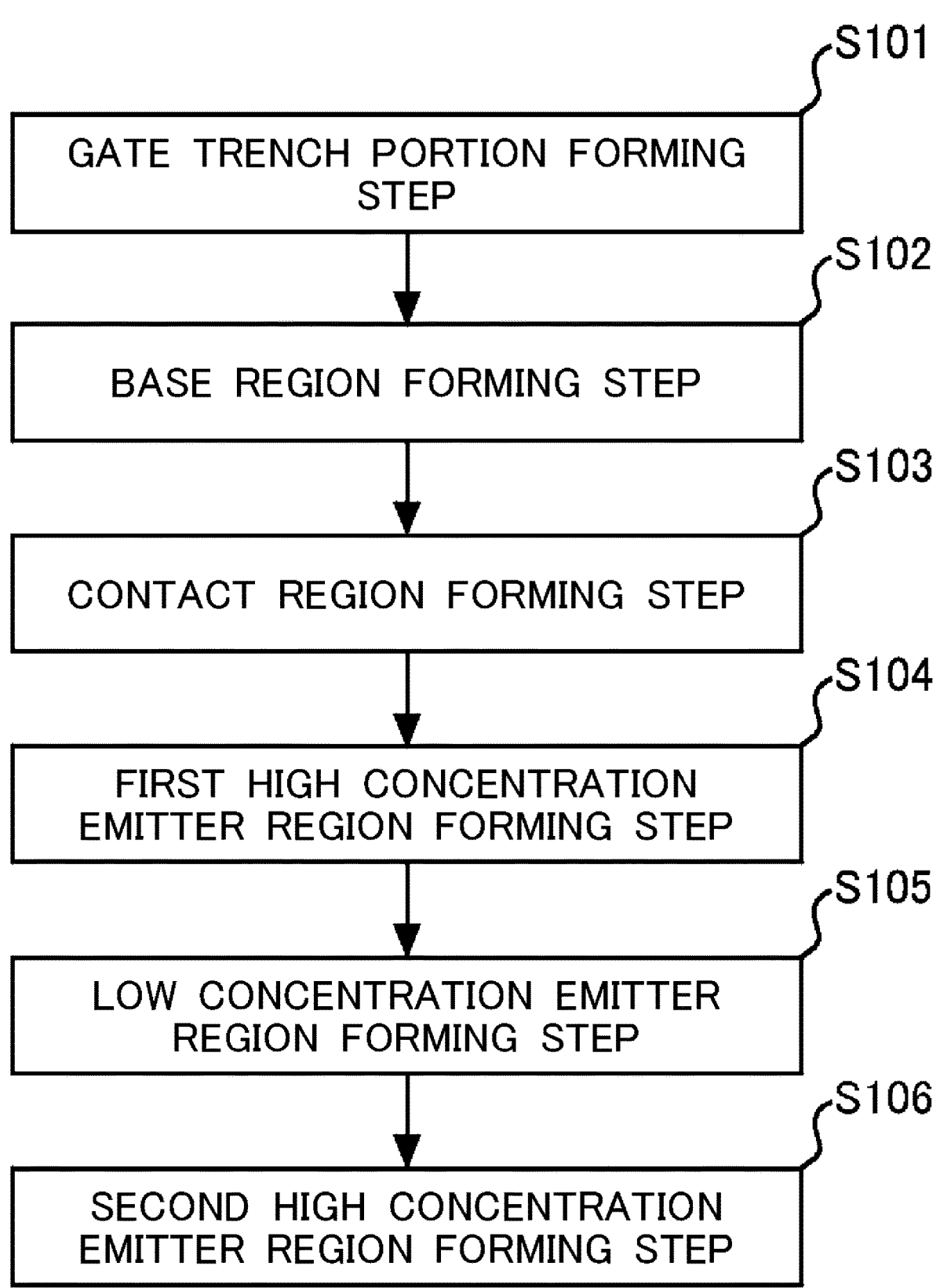
FIG. 13 is a diagram for describing an example of a flowchart of a manufacturing method of the semiconductor device 200.

FIG. 13 is a diagram for describing an example of a flowchart of a manufacturing method of the semiconductor device 200. The manufacturing method of the semiconductor device 200 includes a gate trench portion forming step S101, a base region forming step S102, a contact region forming step S103, a first high concentration emitter region forming step S104, a low concentration emitter region forming step S105, and a second high concentration emitter region forming step S106.

In the gate trench portion forming step S101, the gate trench portions 40 are formed on the upper surface 21 of the semiconductor substrate 10. In the gate trench portion forming step S101, first, gate trenches are provided on the upper surface 21 of the semiconductor substrate 10. The gate trenches may be formed by a well-known method such as etching. After that, the gate dielectric film 42 and the gate conductive portion 44 are formed inside each of the gate trenches. The gate dielectric film 42 may be formed by oxidizing the semiconductor substrate 10 by a well-known method. The gate conductive portion 44 may be formed by depositing polysilicon or the like by a well-known method such as a CVD method. Screening oxidization may be performed after the gate trench portion forming step S101.

In the base region forming step S102, the P type base region 14 is formed in the mesa portion 60. As an example, the P type base region 14 is formed by performing ion implantation of boron. In the present example, for lowering a boron concentration in the vicinity of the surface, the P type base region 14 is formed by performing ion implantation of boron at a high acceleration voltage. After the ion implantation, heat treatment may be performed for activating the P type base region 14.

In the contact region forming step S103, the P type contact region 15 is selectively formed in the mesa portion 60. Therefore, in the contact region forming step S103, photolithography is performed, and a photoresist is formed by patterning. As an example, the P type contact region 15 may be formed by ion implantation of boron. In the present example, for connecting the P type base region 14 and the upper surface 21 of the semiconductor substrate 10 by the high concentration P type layer, the P type contact region 15 is formed by performing high acceleration voltage multi-stage ion implantation of boron.

In the first high concentration emitter region forming step S104, the N type emitter region 12-1 is selectively formed in the mesa portion 60. Therefore, in the first high concentration emitter region forming step S104, photolithography may be performed so that a photoresist is formed by patterning. The photoresist formed in the first high concentration emitter region forming step S104 may remain until the second high concentration emitter region forming step S106. As an example, the N type emitter region 12-1 is formed by performing ion implantation of phosphorus.

In the low concentration emitter region forming step S105, the low concentration N type emitter region 13 is selectively formed in the mesa portion 60. As an example, the low concentration N type emitter region 13 is formed by performing ion implantation of phosphorus.

In the second high concentration emitter region forming step S106, the N type emitter region 12-2 is selectively formed in the mesa portion 60. As an example, the N type emitter region 12-2 is formed by performing ion implantation of arsenic. After the ion implantation, the photoresist may be removed. After the second high concentration emitter region forming step S106, heat treatment is performed for activating the P type contact region 15, the N type emitter region 12-1, the N type emitter region 12-2, and the low concentration N type emitter region 13.

Figure 14:
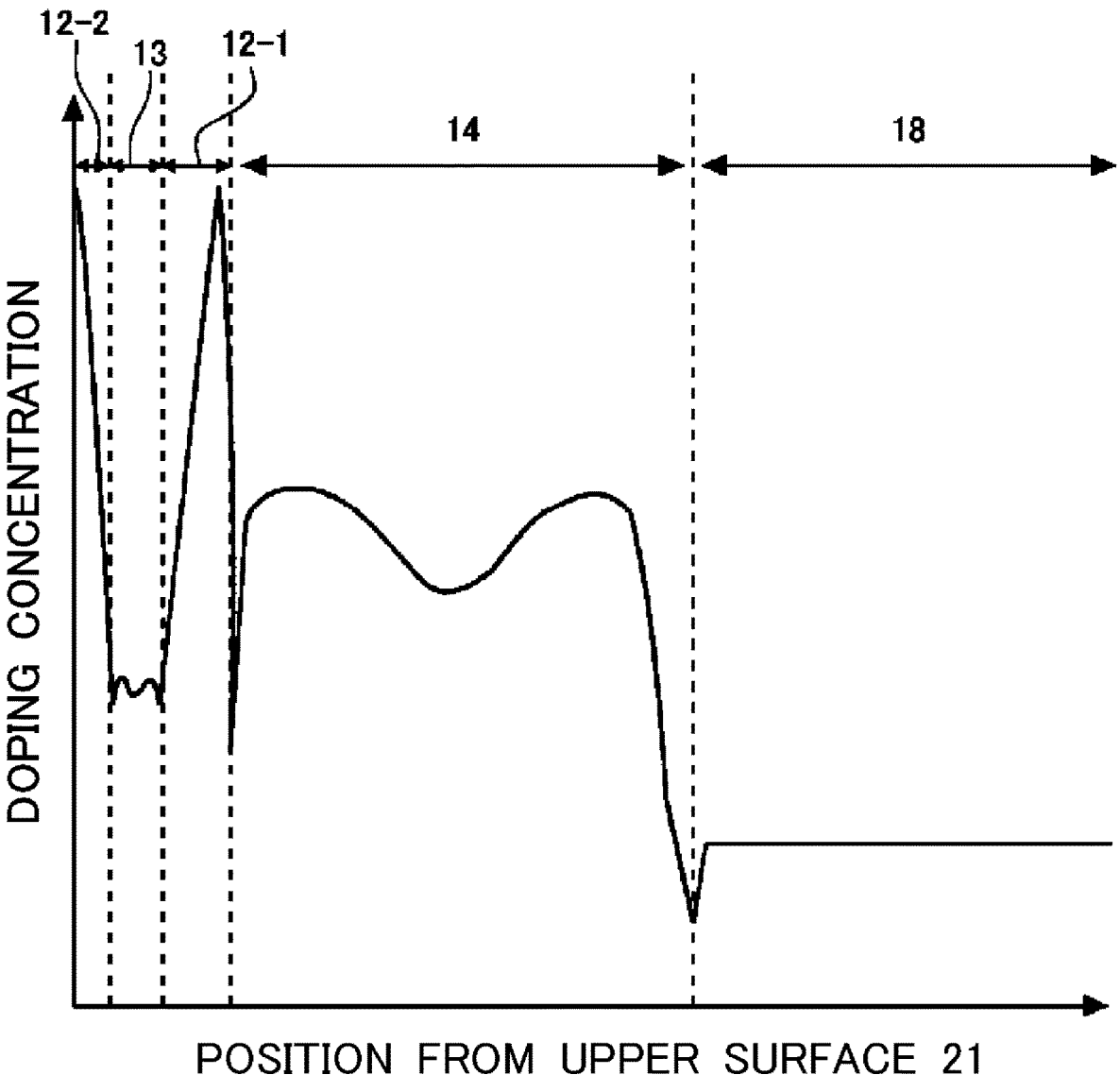
FIG. 14 is a diagram showing another example of the doping concentration distribution on the line f-f shown in FIG. 9.

FIG. 14 is a diagram showing another example of the doping concentration distribution on the line f-f shown in FIG. 9. The line f-f may be set at a position at the center of the mesa portion 60 in the X axis direction. FIG. 14 shows the doping concentration distribution in the N type emitter region 12-2, the low concentration N type emitter region 13, the N type emitter region 12-1, the P type base region 14, and the N type drift region 18.

At the center of the mesa portion 60, the doping concentration of the N type emitter region 12-1 may be higher than the doping concentration of the low concentration N type emitter region 13. The N type emitter region 12-1 may have a concentration peak at which the doping concentration is higher than that of the low concentration N type emitter region 13. At the center of the mesa portion 60, the doping concentration of the N type emitter region 12-2 may be higher than the doping concentration of the low concentration N type emitter region 13. The N type emitter region 12-2 may have a concentration peak at which the doping concentration is higher than that of the low concentration N type emitter region 13.

Also in the present example, at the center of the mesa portion 60, the doping concentration of the low concentration N type emitter region 13 is lower than the doping concentration of the P type base region 14. The low concentration N type emitter region 13 may have a concentration peak at which the doping concentration is lower than that of the P type base region 14.

The doping concentration of the low concentration N type emitter region 13 may be equal to or smaller than the doping concentration of the P type base region 14. In the present example, at the center of the mesa portion 60, the doping concentration of the low concentration N type emitter region 13 is lower than the doping concentration of the P type base region 14. The P type base region 14 may have a concentration peak at which the doping concentration is higher than that of the low concentration N type emitter region 13. Also with such a configuration, characteristics of the semiconductor device 200 having a low ON voltage and a low saturation voltage can be realized.

Figure 15:
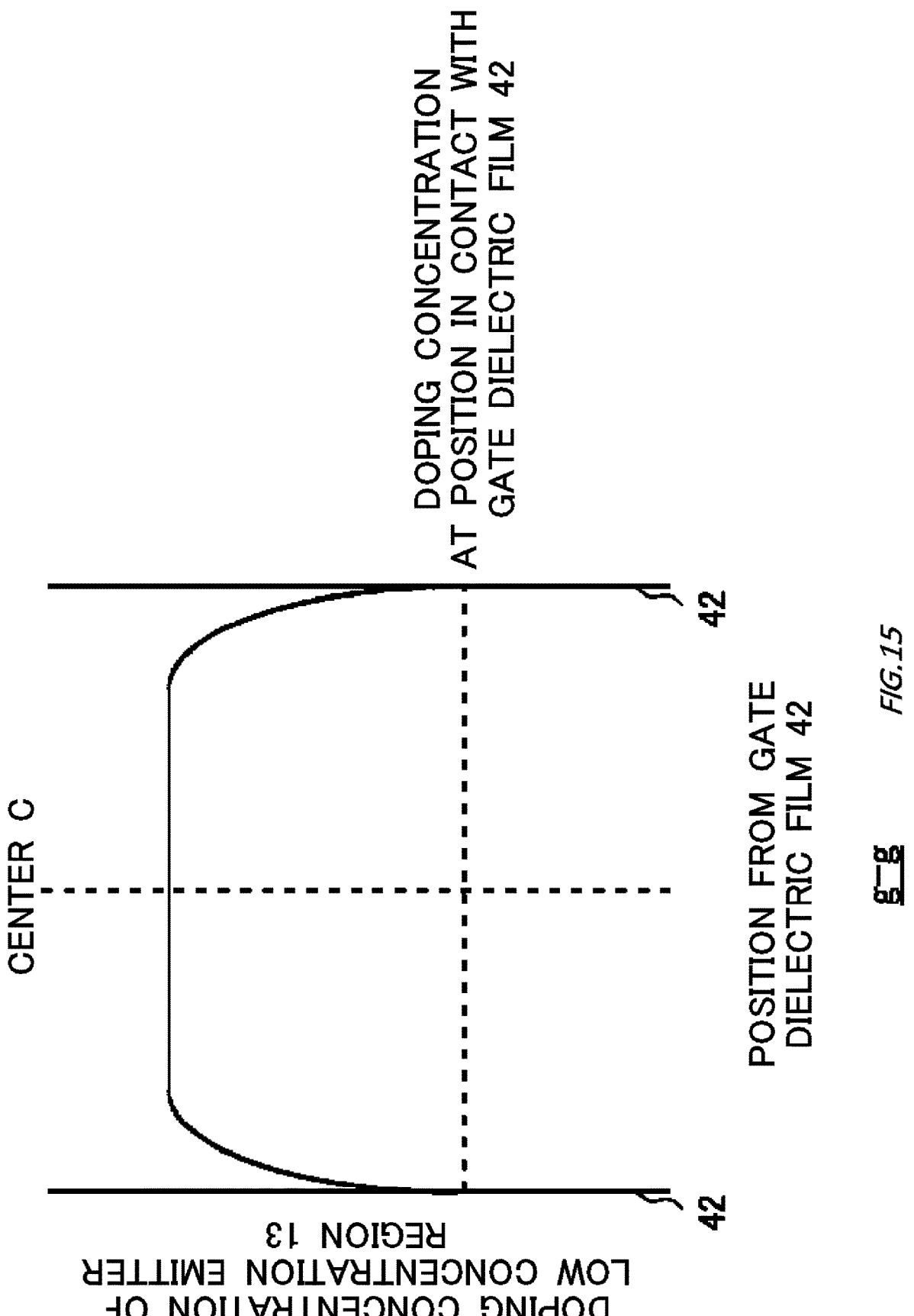
FIG. 15 is a diagram showing an example of a doping concentration distribution on a line g-g shown in FIG. 9.

FIG. 15 is a diagram showing an example of a doping concentration distribution on a line g-g shown in FIG. 9. The line g-g may be set at the center of the low concentration N type emitter region 13 in the depth direction. Further, the center of the mesa portion 60 in the X axis direction is set as a center C. FIG. 15 shows the doping concentration distribution of the low concentration N type emitter region 13 from one gate dielectric film 42 to an adjacent gate dielectric film 42.

In the present example, the doping concentration of the low concentration N type emitter region 13 at a position in contact with the gate trench portion 40 (gate dielectric film 42) is lower than the doping concentration of the low concentration N type emitter region 13 at the center C of the mesa portion 60. The doping concentration distribution on the line g-g may have a concentration peak at the center C.

Figure 16:
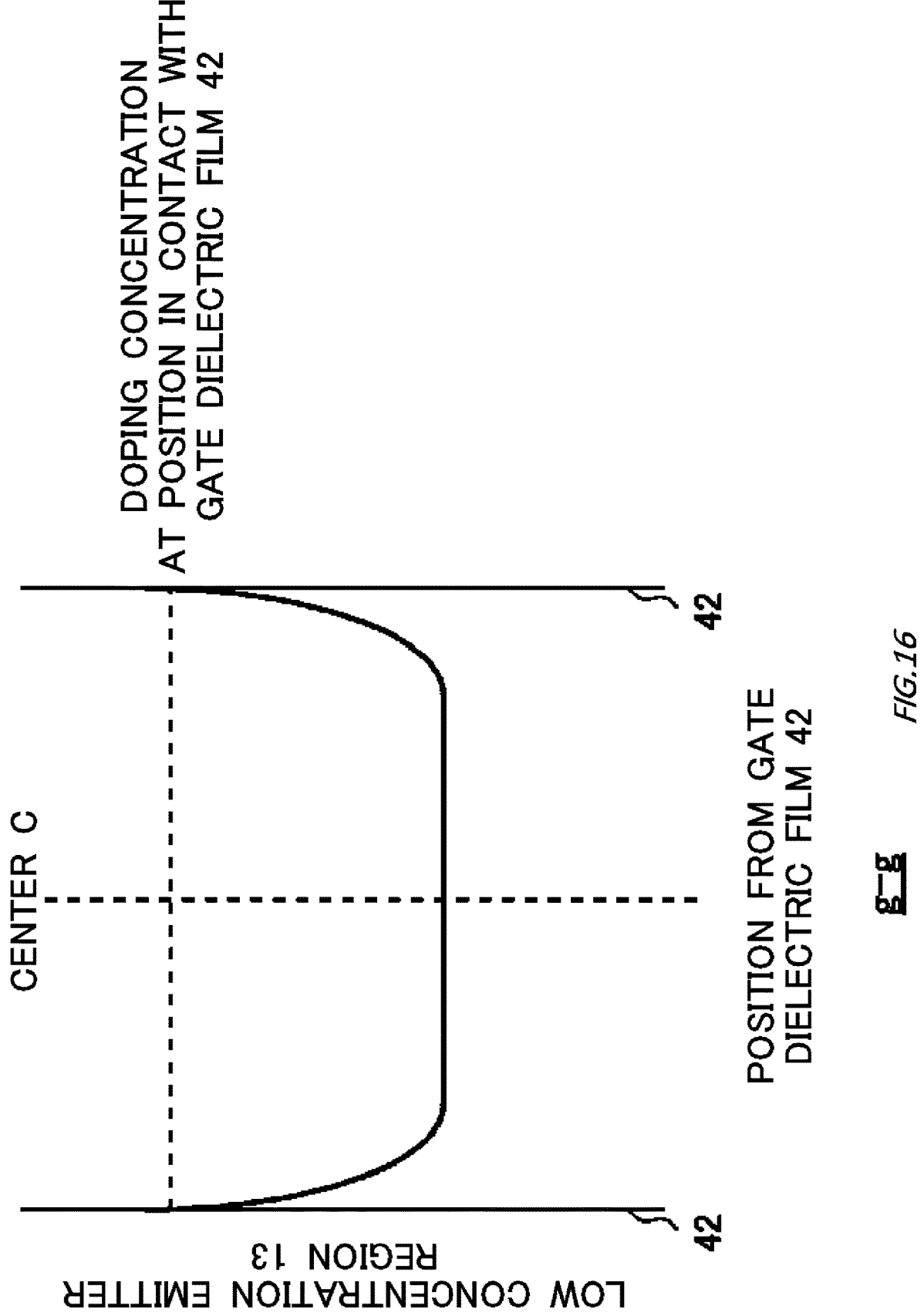
FIG. 16 is a diagram showing another example of the doping concentration distribution on the line g-g shown in FIG. 9.

FIG. 16 is a diagram showing another example of the doping concentration distribution on the line g-g shown in FIG. 9. FIG. 16 shows the doping concentration distribution of the low concentration N type emitter region 13 from one gate dielectric film 42 to an adjacent gate dielectric film 42.

In the present example, the doping concentration of the low concentration N type emitter region 13 at a position in contact with the gate trench portion 40 (gate dielectric film 42) is higher than the doping concentration of the low concentration N type emitter region 13 at the center C of the mesa portion 60. The doping concentration distribution on the line g-g may have a concentration peak at the position in contact with the gate trench portion 40. By increasing the doping concentration of the low concentration N type emitter region 13 at the position in contact with the gate trench portion 40, the resistance of the low concentration N type emitter region 13 can be increased. It is to be noted that the ion implantation is preferably performed obliquely for increasing the doping concentration of the low concentration N type emitter region 13 at the position in contact with the gate trench portion 40.

Figure 17:
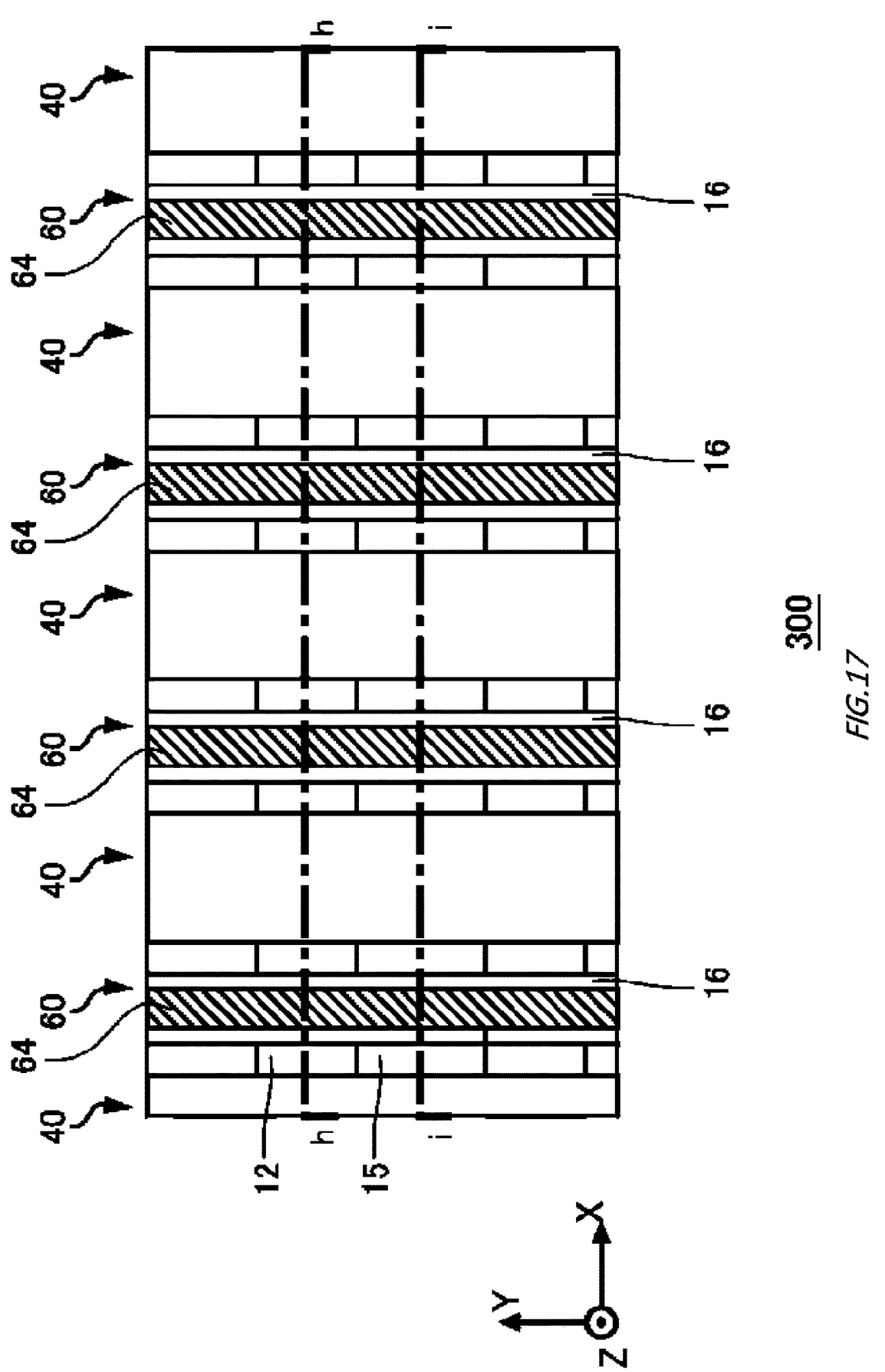
FIG. 17 is a diagram showing a semiconductor device 300 according to another example.

FIG. 17 is a diagram showing a semiconductor device 300 according to another example. FIG. 17 shows the arrangement on the upper surface 21 of the semiconductor substrate 10. The semiconductor device 300 shown in FIG. 17 differs from the semiconductor device 200 shown in FIG. 7 in the point of including a metal plug 64 and a P type diffusion region 16. Other configurations of FIG. 17 may be the same as those of FIG. 7.

Figure 18:
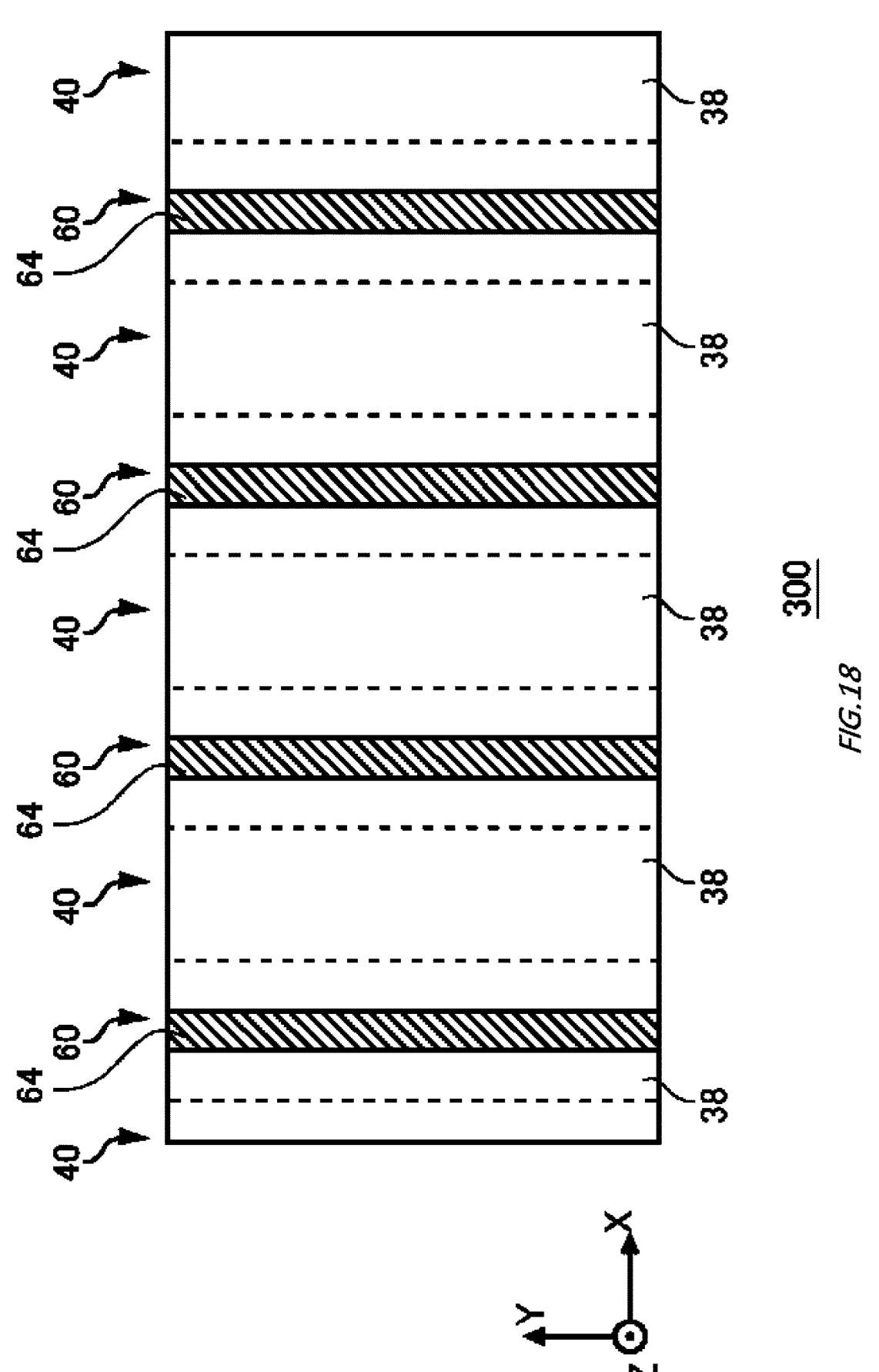
FIG. 18 is a diagram showing the semiconductor device 300 according to another example.

FIG. 18 is a diagram showing the semiconductor device 300 according to another example. FIG. 18 shows the arrangement on the upper surface of the interlayer dielectric film 38. The semiconductor device 300 shown in FIG. 18 differs from the semiconductor device 200 shown in FIG. 8 in the point of including the metal plug 64 in place of the metal plug 62. Other configurations of FIG. 18 may be the same as those of FIG. 8.

Figure 19:
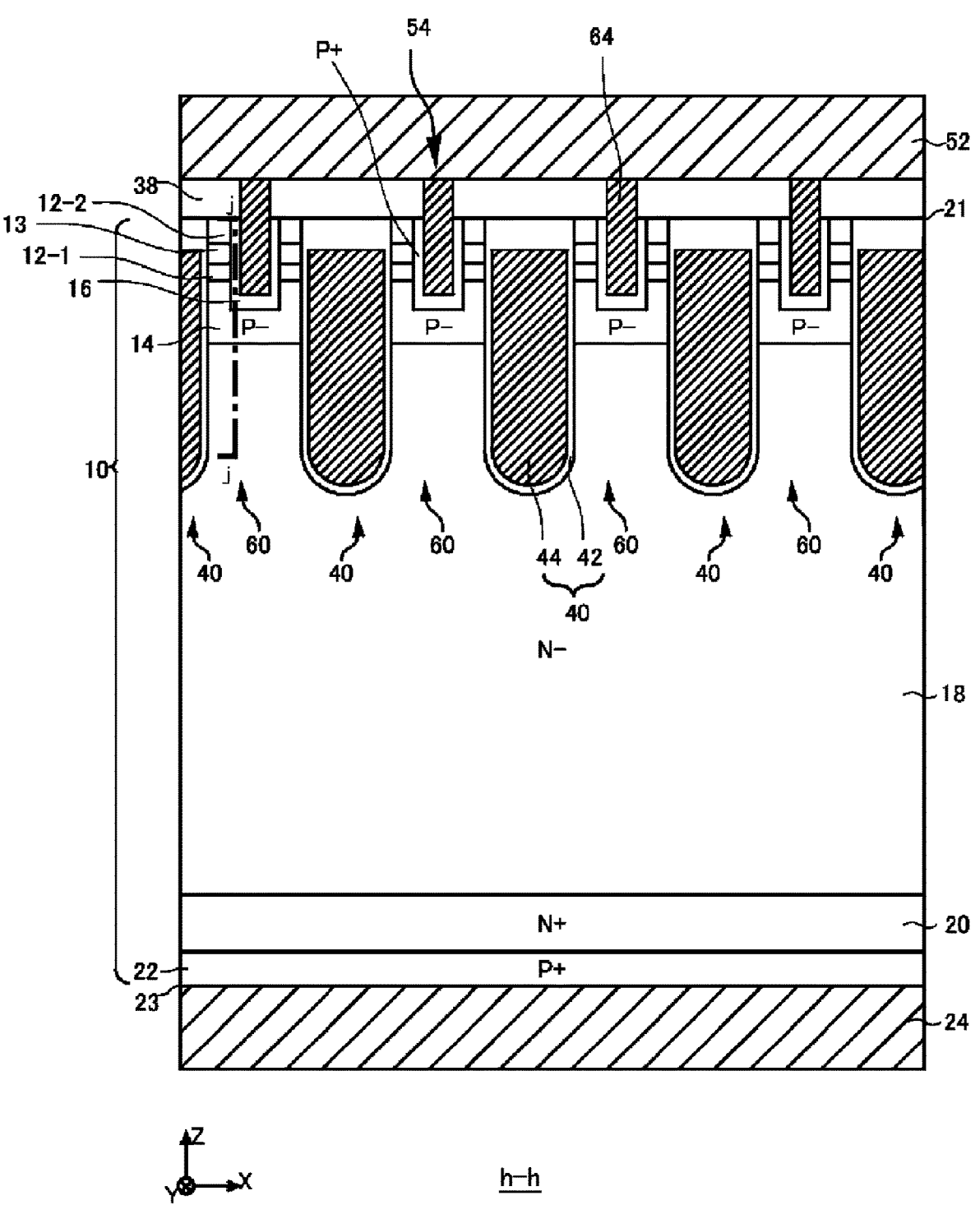
FIG. 19 is a diagram showing an example of a cross section h-h shown in FIG. 17.

FIG. 19 is a diagram showing an example of a cross section h-h shown FIG. 17. The cross section h-h is the XZ plane that passes through the N type emitter regions 12. The semiconductor device 300 shown in FIG. 19 differs from the semiconductor device 200 shown in FIG. 9 in the point of including the metal plug 64 and the P type diffusion region 16. Other configurations of FIG. 19 may be the same as those of FIG. 9.

In the present example, the metal plug 64 is provided inside the semiconductor substrate 10. The metal plug 64 may be provided inside the trench provided in the mesa portion 60 of the semiconductor substrate 10. In addition, similar to the metal plug 62, the metal plug 64 is provided in the interlayer dielectric film 38. The metal plug 64 may be formed in the contact holes 54 provided in the interlayer dielectric film 38. By providing the metal plug 64, the contact resistance between the semiconductor substrate 10 and the emitter electrode 52 can be reduced. As an example, the metal plug 64 is formed of Ta, W, Mo, or the like.

In the present example, the P type diffusion region 16 is provided below the metal plug 64. The P type diffusion region 16 may be provided between the P type base region 14 and the metal plug 64. The P type diffusion region 16 may be provided on the upper surface 21 of the semiconductor substrate 10. The P type diffusion region 16 may be provided so as not to be in contact with the gate trench portion 40. As an example, the P type diffusion region 16 is of the P+ type. By providing the P type diffusion region 16, holes directed toward the N type emitter region 12 from the lower surface 23 side when the semiconductor device 100 is turned off can be caused to flow to the metal plug 64 via the P type diffusion region 16. Accordingly, a resistance of a path through which the holes pass can be lowered, and latch-up can be suppressed. Further, since the metal plug 64 is in contact with the emitter electrode 52, a breakdown withstand capability can be improved.

Figure 20:
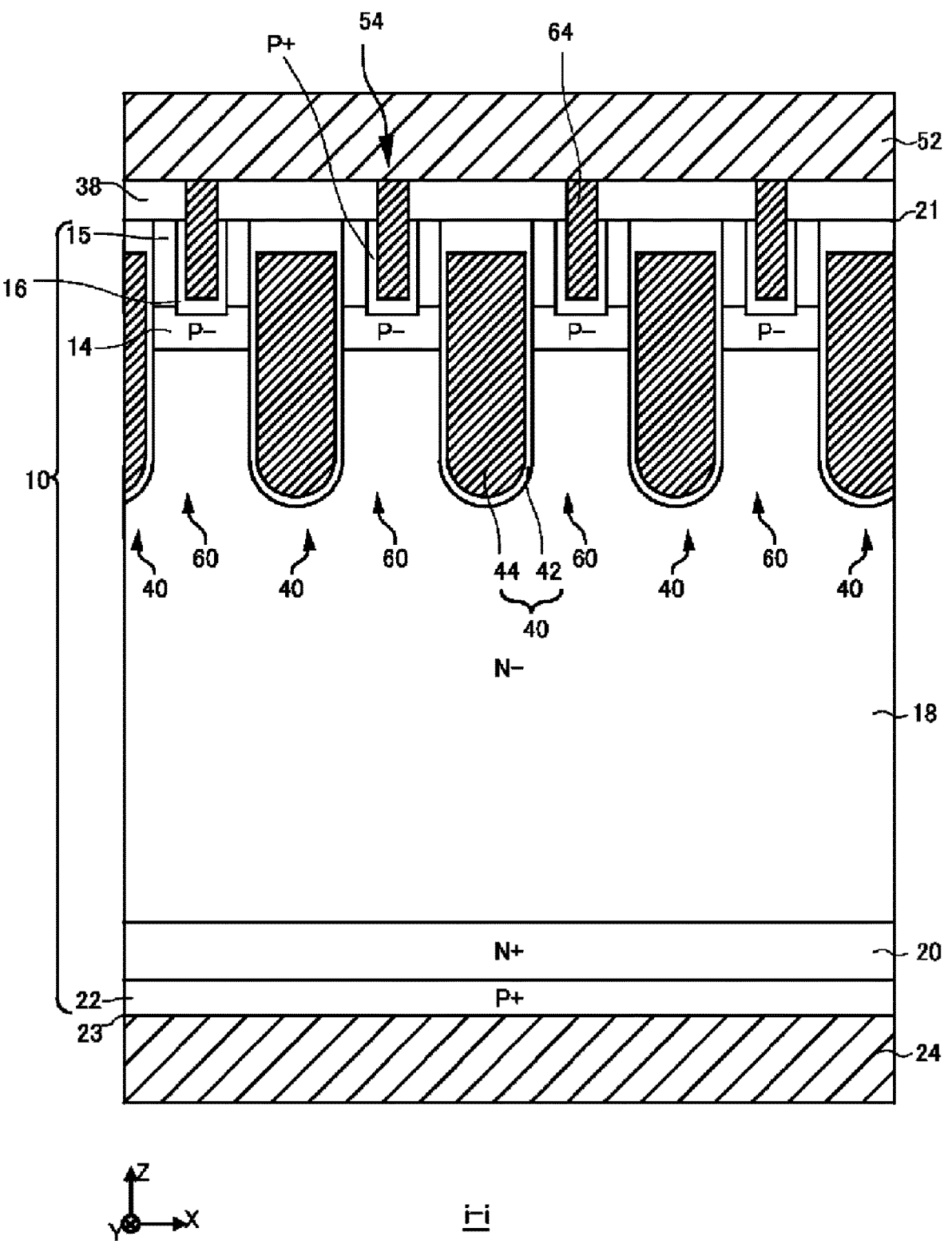
FIG. 20 is a diagram showing an example of a cross section i-i shown in FIG. 17.

FIG. 20 is a diagram showing an example of a cross section i-i shown in FIG. 17. The cross section i-i is the XZ plane that passes through the P type contact regions 15. The semiconductor device 300 shown in FIG. 20 differs from the semiconductor device 200 shown in FIG. 10 in the point of including the metal plug 64 and the P type diffusion region 16. Other configurations of FIG. 20 may be the same as those of FIG. 10. Also in the cross section that passes through the P type contact regions 15, the metal plug 64 and the P type diffusion region 16 may be provided.

Figure 21:
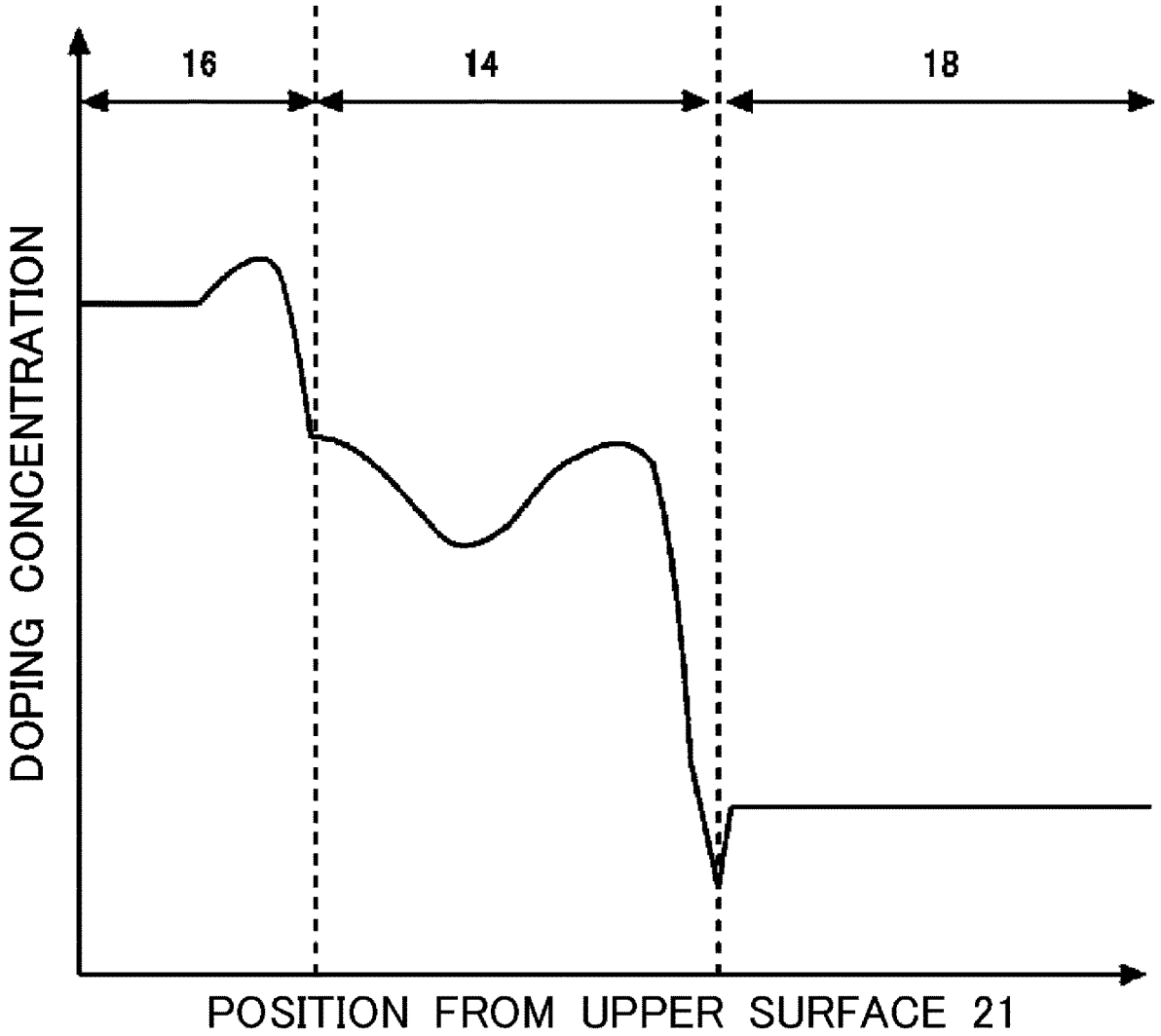
FIG. 21 is a diagram showing an example of a doping concentration distribution on a line j-j shown in FIG. 19.

FIG. 21 is a diagram showing an example of a doping concentration distribution on a line j-j shown in FIG. 19. FIG. 21 shows the doping concentration distribution in the P type diffusion region 16, the P type base region 14, and the N type drift region 18.

In the present example, the doping concentration of the P type diffusion region 16 is higher than the doping concentration of the P type base region 14. The P type diffusion region 16 may have a concentration peak at which the doping concentration is higher than that of the P type base region 14. The ion implantation is preferably performed obliquely for forming the P type diffusion region 16.

Figure 22:
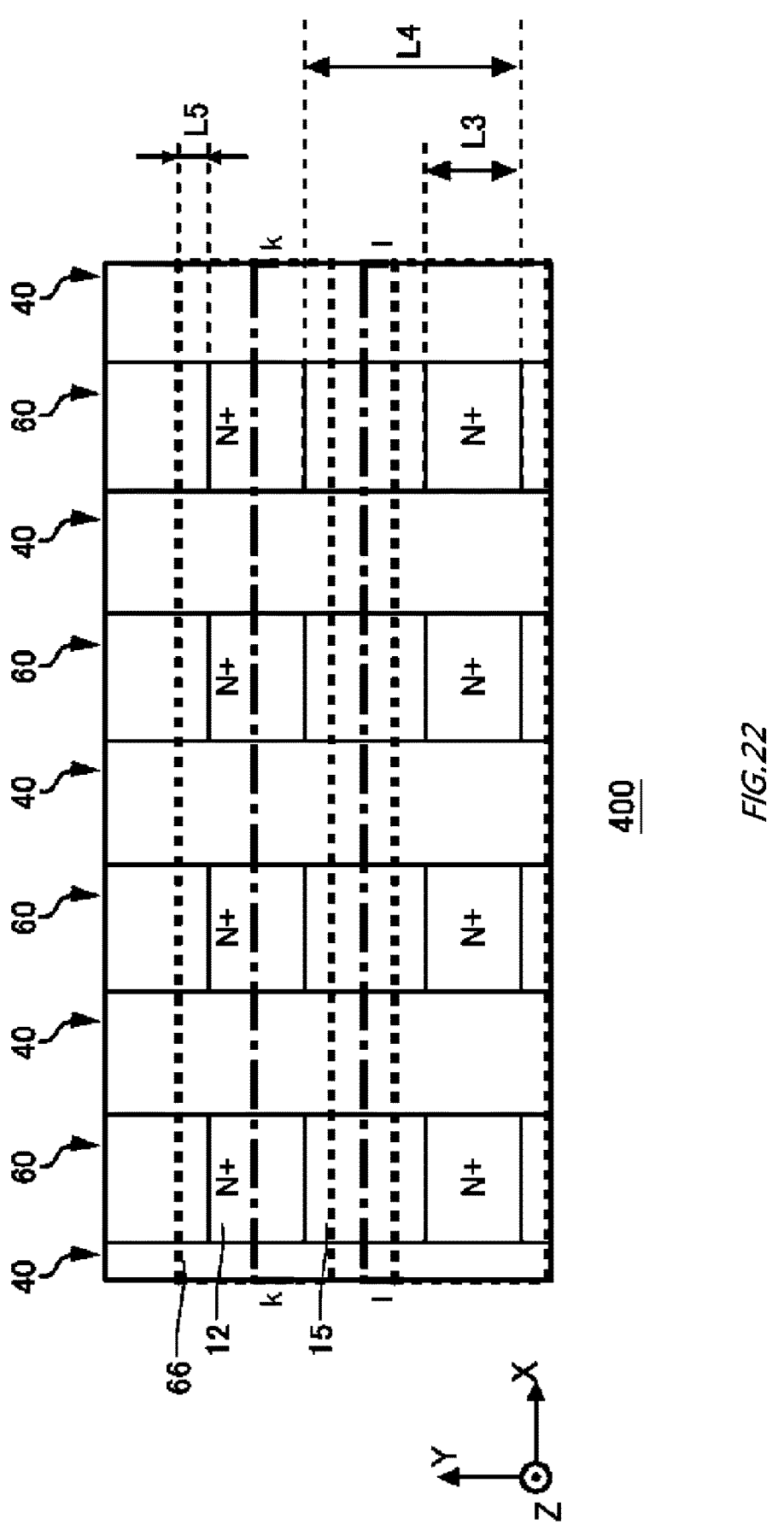
FIG. 22 is a diagram showing a semiconductor device 400 according to another example.

FIG. 22 is a diagram showing a semiconductor device 400 according to another example. FIG. 22 shows the arrangement on the upper surface 21 of the semiconductor substrate 10. The semiconductor device 400 shown in FIG. 22 differs from the semiconductor device 100 shown in FIG. 2 in that the width of the N type emitter region 12 in the Y axis direction is set as the emitter width L3, and a sum of the width of the N type emitter region 12 in the Y axis direction and the width of the P type contact region 15 in the Y axis direction is set as the pitch width L4. In addition, the semiconductor device 400 shown in FIG. 22 differs from the semiconductor device 100 shown in FIG. 2 in the point of including a polysilicon resistance portion 66 in place of the interlayer dielectric film 38 and the metal plug 62. Other configurations of FIG. 22 may be the same as those of FIG. 2. In FIG. 22, the arrangement of the polysilicon resistance portions 66 on the upper surface 21 of the semiconductor substrate 10 is indicated by bold dotted lines.

Figure 23:
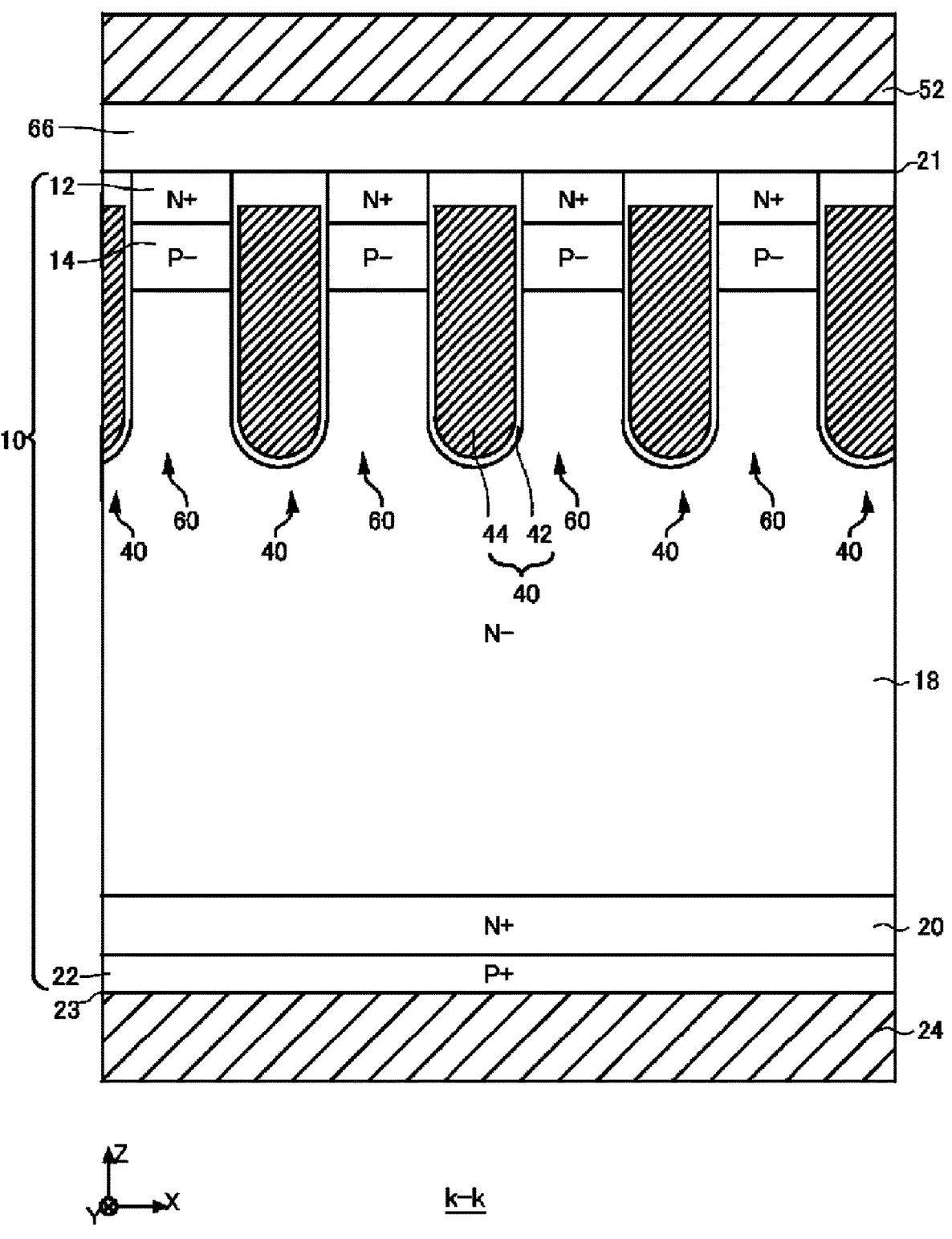
FIG. 23 is a diagram showing an example of a cross section k-k shown in FIG. 22.

FIG. 23 is a diagram showing an example of a cross section k-k shown in FIG. 22. The cross section k-k is the XZ plane that passes through the N type emitter regions 12. The semiconductor device 400 shown in FIG. 23 differs from the semiconductor device shown in FIG. 4 in the point of including the polysilicon resistance portion 66 in place of the interlayer dielectric film 38 and the metal plug 62. Other configurations of FIG. 23 may be the same as those of FIG. 4.

The polysilicon resistance portion 66 is provided between the emitter electrode 52 and the P type base regions 14 in the depth direction of the semiconductor substrate 10. In the present example, at least a part of the polysilicon resistance portion 66 is provided above the semiconductor substrate 10. At least a part of the polysilicon resistance portion 66 may be provided on the upper surface 21 of the semiconductor substrate 10. In FIG. 23, the entire polysilicon resistance portion 66 is provided on the upper surface 21 of the semiconductor substrate 10. The polysilicon resistance portion 66 may be provided above the N type emitter regions 12. The polysilicon resistance portion 66 may cover the N type emitter regions 12.

In the present example, the polysilicon resistance portion 66 has a higher resistance than the N type emitter region 12. Therefore, the polysilicon resistance portion 66 is an example of the high resistance portion. The gate conductive portion 44 may be provided on a lower side of the position at which the polysilicon resistance portion 66 is provided in the depth direction of the semiconductor substrate 10. In the present example, the polysilicon resistance portion 66 is provided above the gate conductive portions 44. It is to be noted that for lowering the contact resistance with the emitter electrode 52, it is preferable to implant arsenic into a front surface of the polysilicon resistance portion 66.

Figure 24:
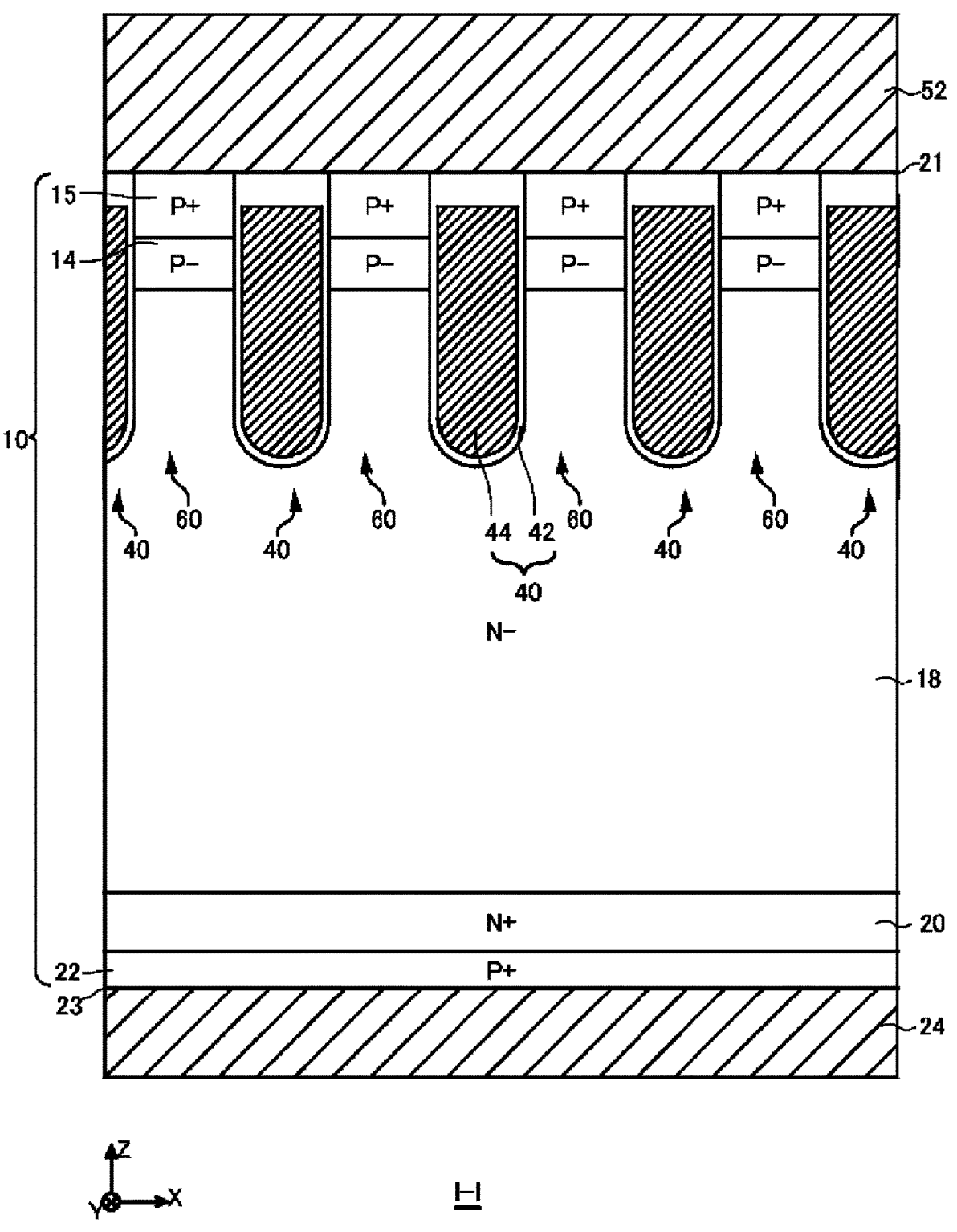
FIG. 24 is a diagram showing an example of a cross section l-l shown in FIG. 22.

FIG. 24 is a diagram showing an example of a cross section l-l shown in FIG. 22. The cross section l-l is the XZ plane that passes through the P type contact regions 15. The configuration of FIG. 24 may be the same as that of FIG. 5. That is, in the cross section, the semiconductor device 300 does not include the polysilicon resistance portion 66.

Figure 25:
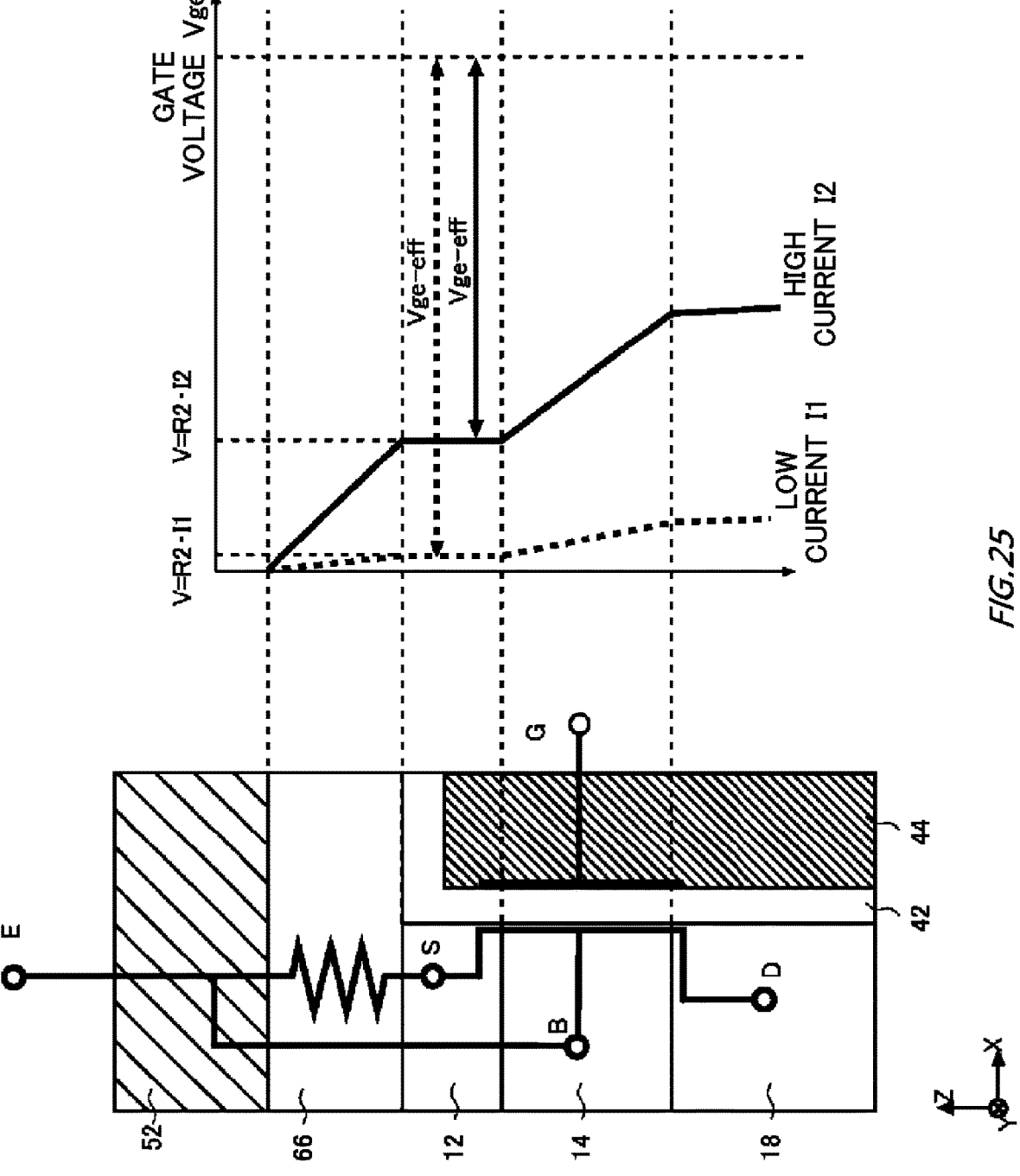
FIG. 25 is a diagram for describing an effect of a polysilicon resistance portion 66.

FIG. 25 is a diagram for describing an effect of the polysilicon resistance portion 66. In FIG. 25, the low current I1 is a current smaller than the rated current, and the high current I2 is a high current of about the same level as the saturation current. Moreover, the resistance of the polysilicon resistance portion 66 is represented by R2.

When the polysilicon resistance portion 66 is provided, the potential of the N type emitter region 12-1 varies due to a current that flows in the polysilicon resistance portion 66 and the resistance R2 of the polysilicon resistance portion 66. When the high current I2 flows, the potential of the N type emitter region 12-1 largely increases. On the other hand, when the low current I1 flows, the potential of the N type emitter region 12-1 only increases slightly. Since the gate voltage Vge for driving the surface MOS structure is constant, a potential difference Vge-eff applied to the gate dielectric film 42 becomes small in a high current region. On the other hand, the potential difference Vge-eff applied to the gate dielectric film 42 becomes relatively large in a low current region. Therefore, the saturation current can be largely suppressed.

Thus, in the present example, the semiconductor device 400 includes the polysilicon resistance portion 66 that functions as the high resistance portion. Since the polysilicon resistance portion 66 is provided, the saturation current can be reduced, and by increasing the total emitter width Z, the reduced limit current value can be adjusted. Therefore, it becomes possible to drive with a large gate voltage/emitter voltage difference in the low current region and drive with a small gate voltage/emitter voltage difference in the high current region, and realize the characteristics of the semiconductor device 200 having a low ON voltage and a low saturation voltage.

In the present example, the emitter width L3 is, for example, 1.5 μm, and the pitch width L4 is, for example, 3.5 μm. Therefore, in the semiconductor device 400, the total emitter width Z can be increased as compared to the semiconductor device 100, and the low ON voltage can be realized by Expression 2.

In FIG. 22, the polysilicon resistance portion 66 covers the N type emitter regions 12 in a top view. Since the polysilicon resistance portion 66 covers the N type emitter regions 12, a situation where the polysilicon resistance portion 66 and the emitter electrode 52 are directly connected can be prevented from occurring.

Alternatively, the polysilicon resistance portion 66 may cover at least a part of the P type contact regions 15 in a top view. The polysilicon resistance portion 66 does not need to cover at least a part of the P type contact regions 15 in a top view. The P type contact region 15 not covered by the polysilicon resistance portion 66 may be in contact with the emitter electrode 52. Therefore, the polysilicon resistance portion 66 and the emitter electrode 52 are alternately in contact with the upper surface 21 of the semiconductor substrate 10. In the present example, the polysilicon resistance portion 66 and the emitter electrode 52 are alternately in contact with the upper surface 21 of the semiconductor substrate 10 in the extending direction. With such a configuration, the function of the P type contact region 15 can be realized while realizing the low ON voltage. It is to be noted that a width L5 covering an end portion of the P type contact region 15 in a top view is, for example, 0.5 μm.

Figure 26:
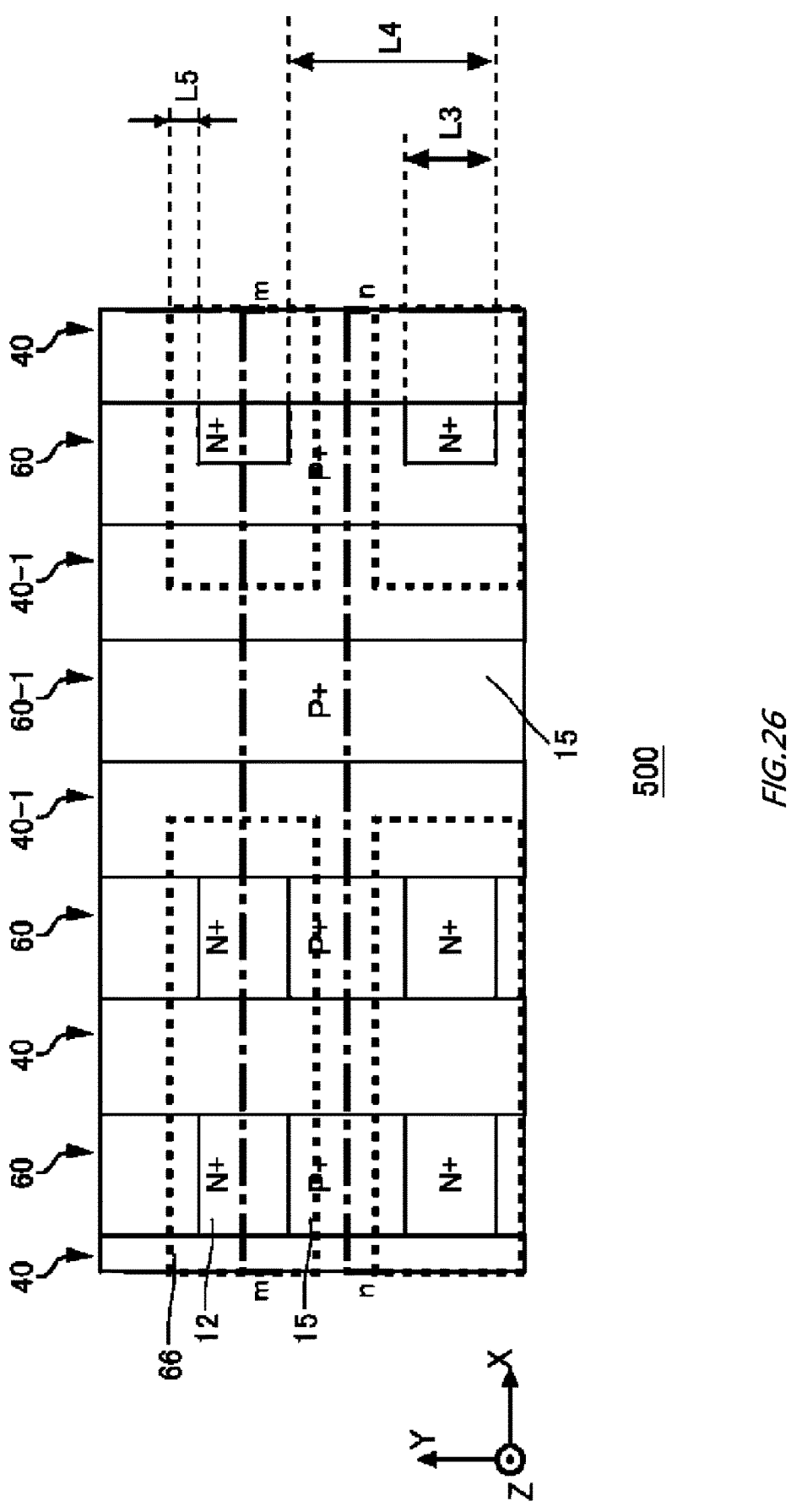
FIG. 26 is a diagram showing a semiconductor device 500 according to another example.

FIG. 26 is a diagram showing a semiconductor device 500 according to another example. FIG. 26 shows the arrangement on the upper surface 21 of the semiconductor substrate 10. In the semiconductor device 500 shown in FIG. 26, the arrangement of the N type emitter regions 12 and the polysilicon resistance portions 66 differs from that of the semiconductor device 400 shown in FIG. 22. Other configurations of FIG. 26 may be the same as those of FIG. 22. It is to be noted that a cross section n-n shown in FIG. 26 may be the same as the cross section H of the semiconductor device 400 shown in FIG. 24.

Figure 27:
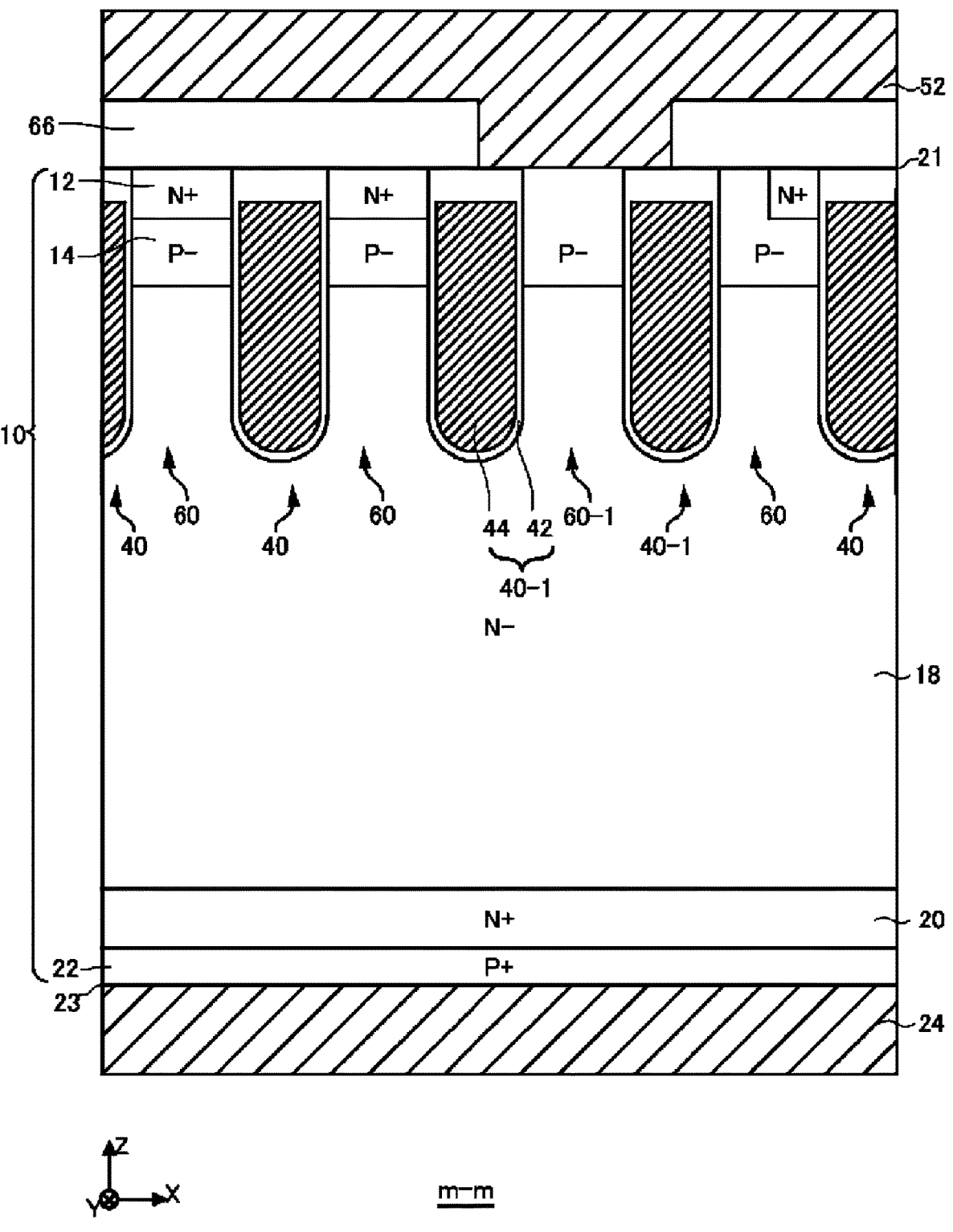
FIG. 27 is a diagram showing an example of a cross section m-m shown in FIG. 26.

FIG. 27 is a diagram showing an example of a cross section m-m shown in FIG. 26. The cross section m-m is the XZ plane that passes through the N type emitter regions 12. In the semiconductor device 500 shown in FIG. 27, the arrangement of the N type emitter regions 12 and the polysilicon resistance portions 66 differs from that of the semiconductor device 400 shown in FIG. 23. Other configurations of FIG. 27 may be the same as those of FIG. 23.

In the present example, the N type emitter region 12 is not provided in one mesa portion 60 (mesa portion 60-1). Therefore, the polysilicon resistance portion 66 does not need to be provided above the mesa portion 60-1. The polysilicon resistance portion 66 may be provided above two gate trench portions 40 (gate trench portions 40-1) sandwiching the mesa portion 60-1 in the array direction. The polysilicon resistance portion 66 may be provided from an end portion of the gate trench portion 40-1 on an opposite side of the mesa portion 60-1 in the array direction to a center of the gate trench portion 40-1 in the array direction. The emitter electrode 52 may be arranged at a position at which the polysilicon resistance portion 66 is not provided.

Figure 28:
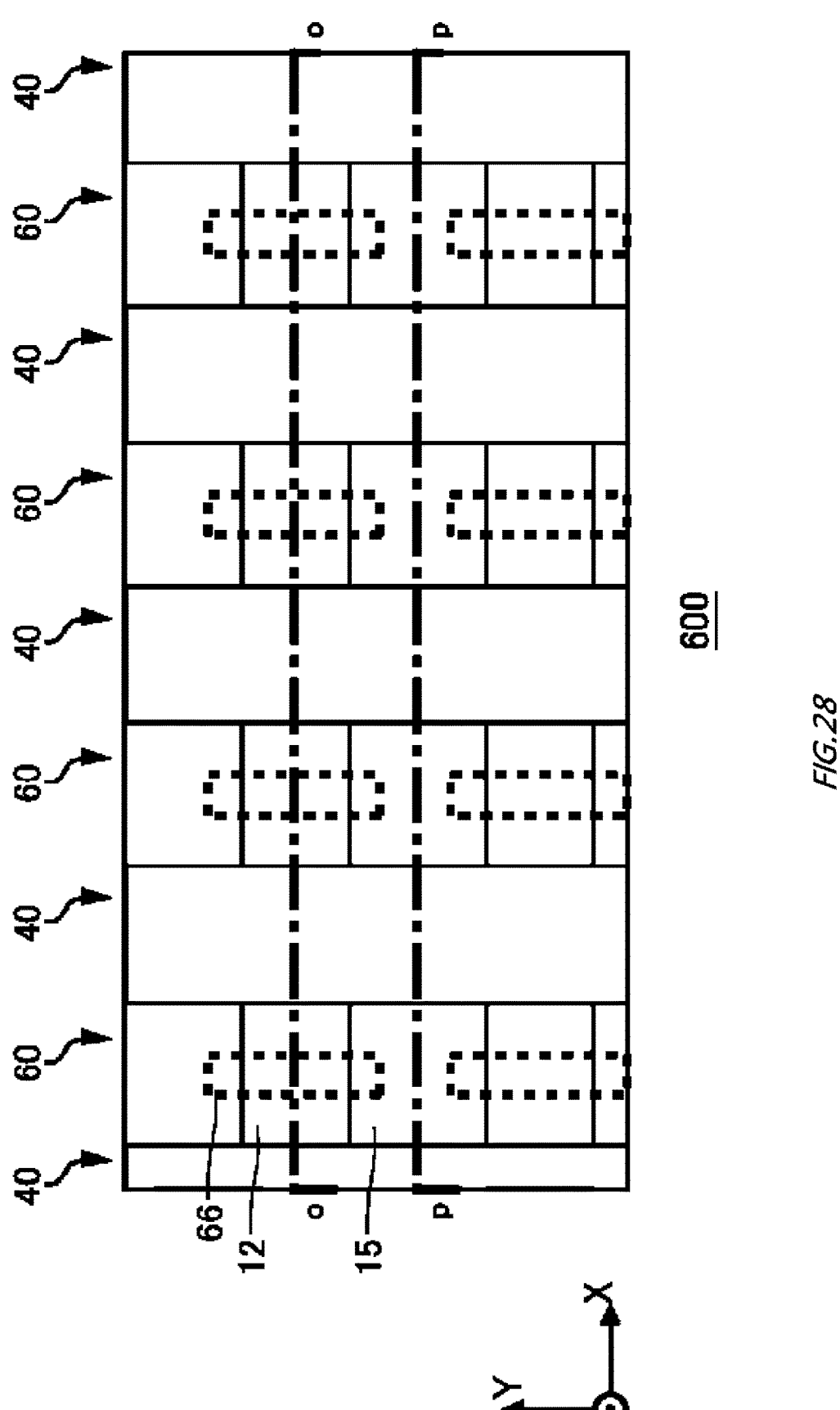
FIG. 28 is a diagram showing a semiconductor device 600 according to another example.

FIG. 28 is a diagram showing a semiconductor device 600 according to another example. FIG. 28 shows the arrangement on the upper surface 21 of the semiconductor substrate 10. The semiconductor device 600 shown in FIG. 28 differs from the semiconductor device 100 shown in FIG. 2 in that the width of the N type emitter region 12 in the Y axis direction is set as the emitter width L3, and a sum of the width of the N type emitter region 12 in the Y axis direction and the width of the P type contact region 15 in the Y axis direction is set as the pitch width L4. In addition, the semiconductor device 600 shown in FIG. 28 differs from the semiconductor device 100 shown in FIG. 2 in the point of including the polysilicon resistance portion 66. Other configurations of FIG. 28 may be the same as those of FIG. 2. In FIG. 28, the arrangement of the polysilicon resistance portions 66 on the upper surface 21 of the semiconductor substrate 10 is indicated by bold dotted lines. It is to be noted that a cross section p-p shown in FIG. 28 may be the same as the cross section b-b of the semiconductor device 100 shown in FIG. 5.

Figure 29:
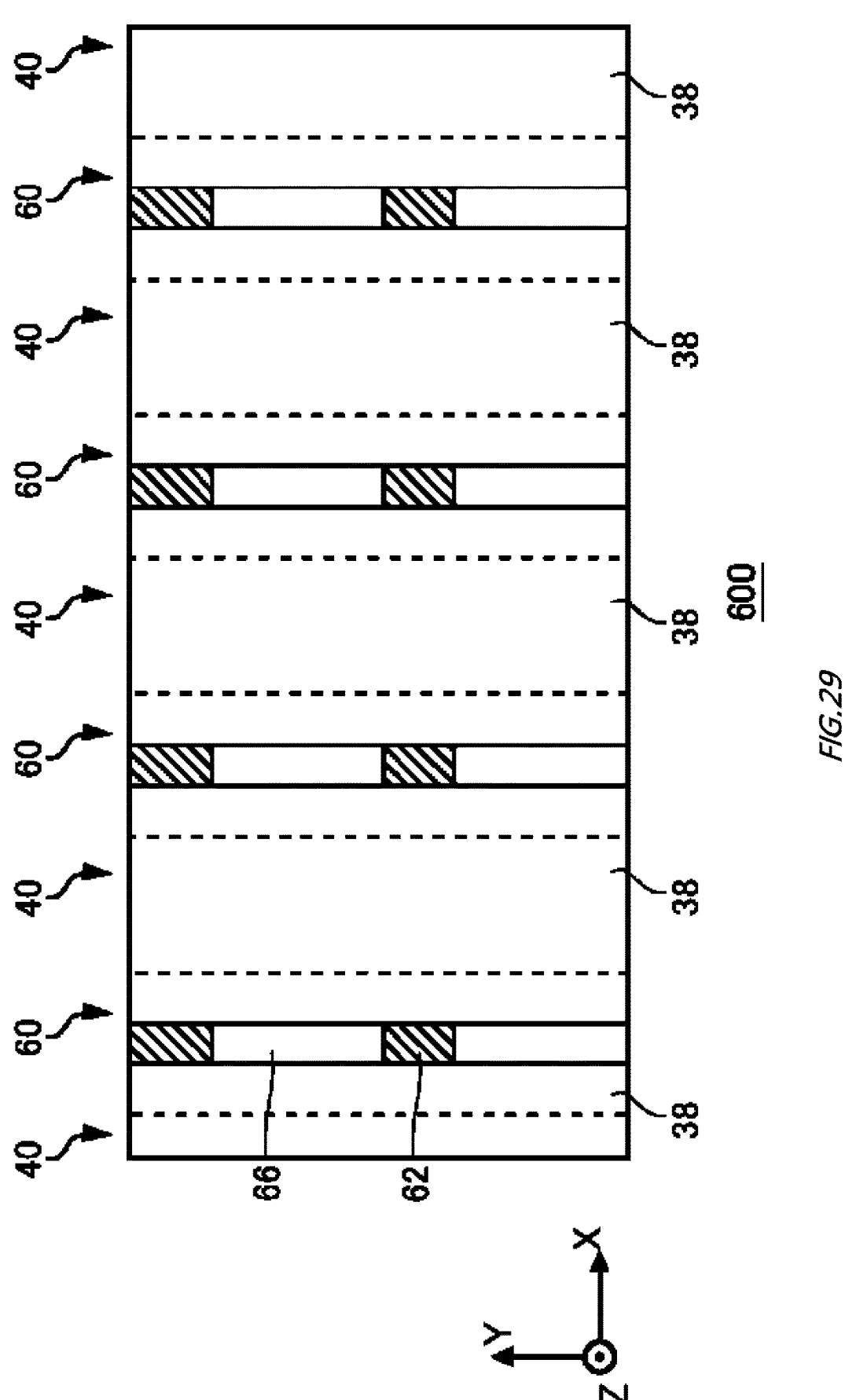
FIG. 29 is a diagram showing a semiconductor device 600 according to another example.

FIG. 29 is a diagram showing the semiconductor device 600 according to another example. FIG. 29 shows the arrangement on the upper surface of the interlayer dielectric film 38. FIG. 29 shows the arrangement in the XY plane different from FIG. 28. The semiconductor device 600 shown in FIG. 29 differs from the semiconductor device 100 shown in FIG. 3 in the point of including the polysilicon resistance portion 66. Other configurations of FIG. 29 may be the same as those of FIG. 3.

Figure 30:
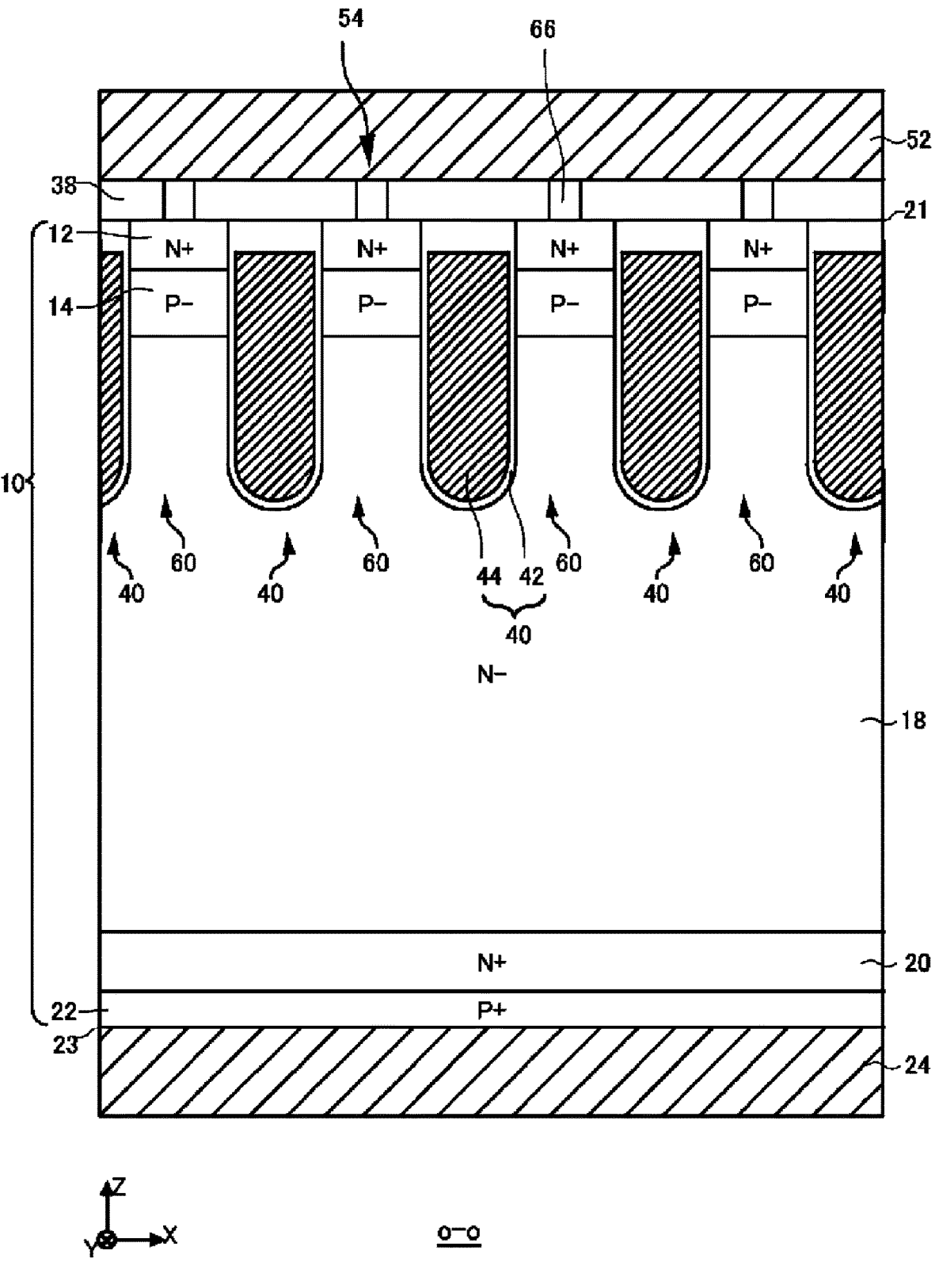
FIG. 30 is a diagram showing an example of a cross section o-o shown in FIG. 28.

FIG. 30 is a diagram showing an example of a cross section o-o shown in FIG. 28. The cross section o-o is the XZ plane that passes through the N type emitter regions 12. The semiconductor device 600 shown in FIG. 30 differs from the semiconductor device 100 shown in FIG. 4 in that the polysilicon resistance portion 66 is provided in place of the metal plug 62. Other configurations of FIG. 30 may be the same as those of FIG. 4.

In the present example, the polysilicon resistance portion 66 is provided in the interlayer dielectric film 38. The polysilicon resistance portion 66 may be formed in the contact holes 54 provided in the interlayer dielectric film 38. The polysilicon resistance portion 66 electrically connects the semiconductor substrate 10 (mesa portion 60) and the emitter electrode 52.

In FIG. 28, the polysilicon resistance portion 66 covers at least a part of the N type emitter region 12 in a top view. Since the semiconductor device 600 includes the interlayer dielectric film 38 in the present example, the polysilicon resistance portion 66 does not need to cover the entire N type emitter region 12 in a top view.

In addition, the polysilicon resistance portion 66 may cover at least a part of the P type contact region 15 in a top view. The polysilicon resistance portion 66 does not need to cover at least a part of the P type contact region 15 in a top view. The P type contact region 15 not covered by the polysilicon resistance portion 66 may be in contact with the metal plug 62 formed in the contact hole 54. The metal plug 62 may be provided above the P type contact region 15. The metal plug 62 does not need to be provided above the N type emitter region 12. Therefore, the polysilicon resistance portion 66 and the metal plug 62 are alternately in contact with the upper surface 21 of the semiconductor substrate 10. In the present example, the polysilicon resistance portion 66 and the metal plug 62 are alternately in contact with the upper surface 21 of the semiconductor substrate 10 in the extending direction. With such a configuration, the function of the P type contact region 15 can be realized while realizing the low ON voltage.

Figure 31:
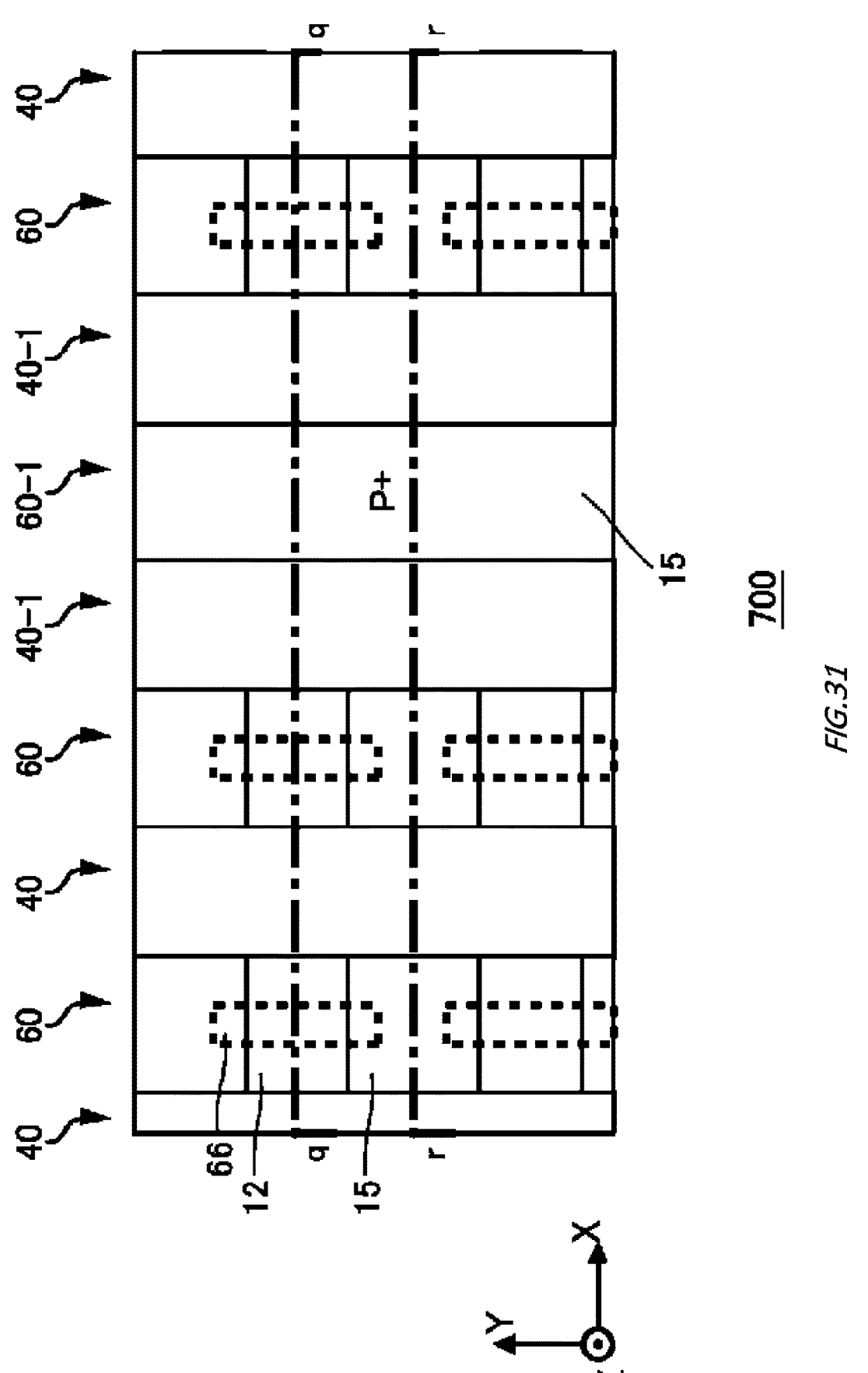
FIG. 31 is a diagram showing a semiconductor device 700 according to another example.

FIG. 31 is a diagram showing a semiconductor device 700 according to another example. FIG. 31 shows the arrangement on the upper surface 21 of the semiconductor substrate 10. In the semiconductor device 700 shown in FIG. 31, the arrangement of the N type emitter regions 12 and the polysilicon resistance portions 66 differs from that of the semiconductor device 600 shown in FIG. 28. Other configurations of FIG. 31 may be the same as those of FIG. 28. It is to be noted that a cross section r-r shown in FIG. 31 may be the same as the cross section b-b of the semiconductor device 100 shown in FIG. 5.

Figure 32:
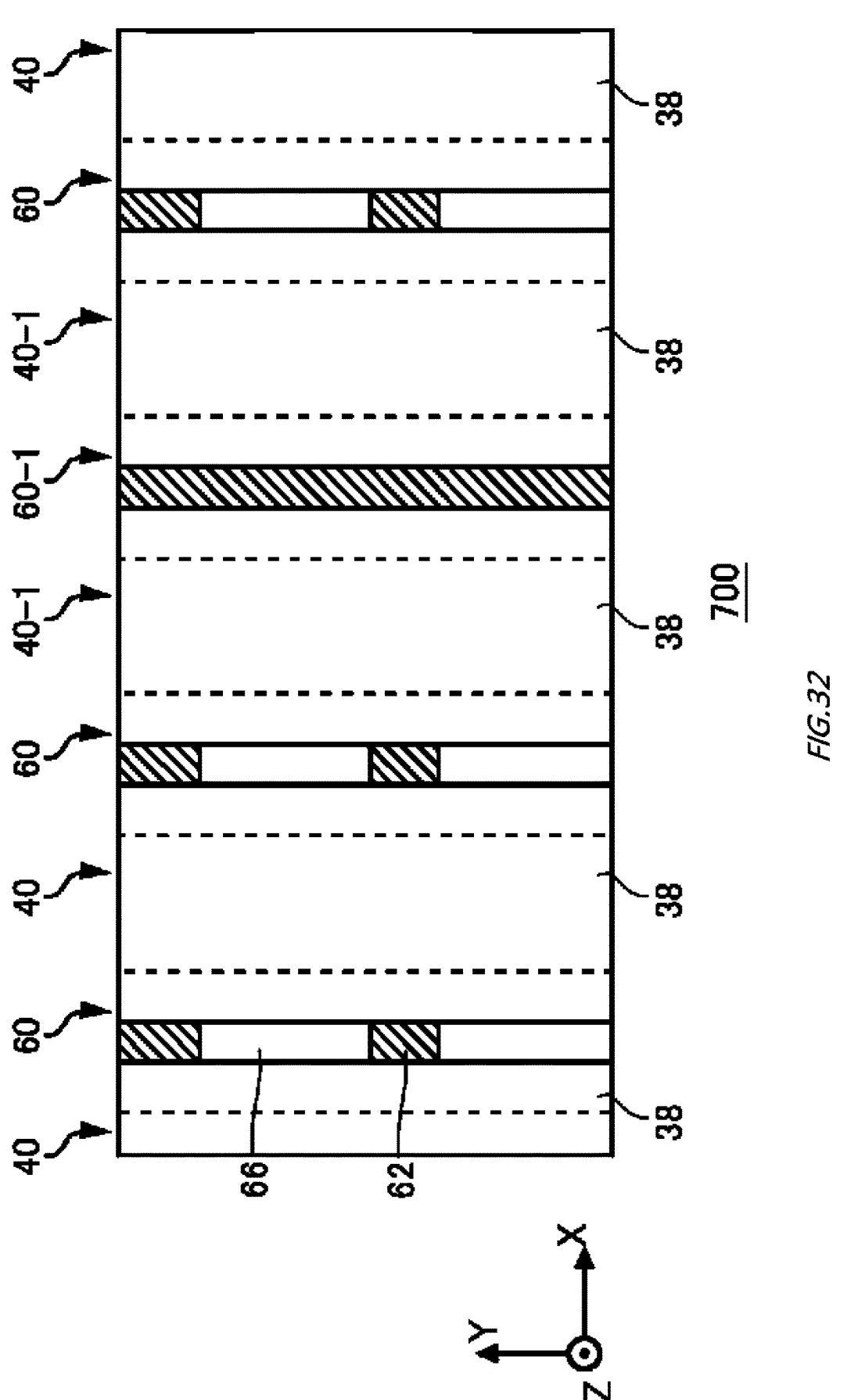
FIG. 32 is a diagram showing the semiconductor device 700 according to another example.

FIG. 32 is a diagram showing the semiconductor device 700 according to another example. FIG. 32 shows the arrangement on the upper surface of the interlayer dielectric film 38. FIG. 32 shows the arrangement in the XY plane different from FIG. 31. In the semiconductor device 700 shown in FIG. 32, the arrangement of the polysilicon resistance portions 66 differs from that of the semiconductor device 600 shown in FIG. 29. Other configurations of FIG. 32 may be the same as those of FIG. 29.

Figure 33:
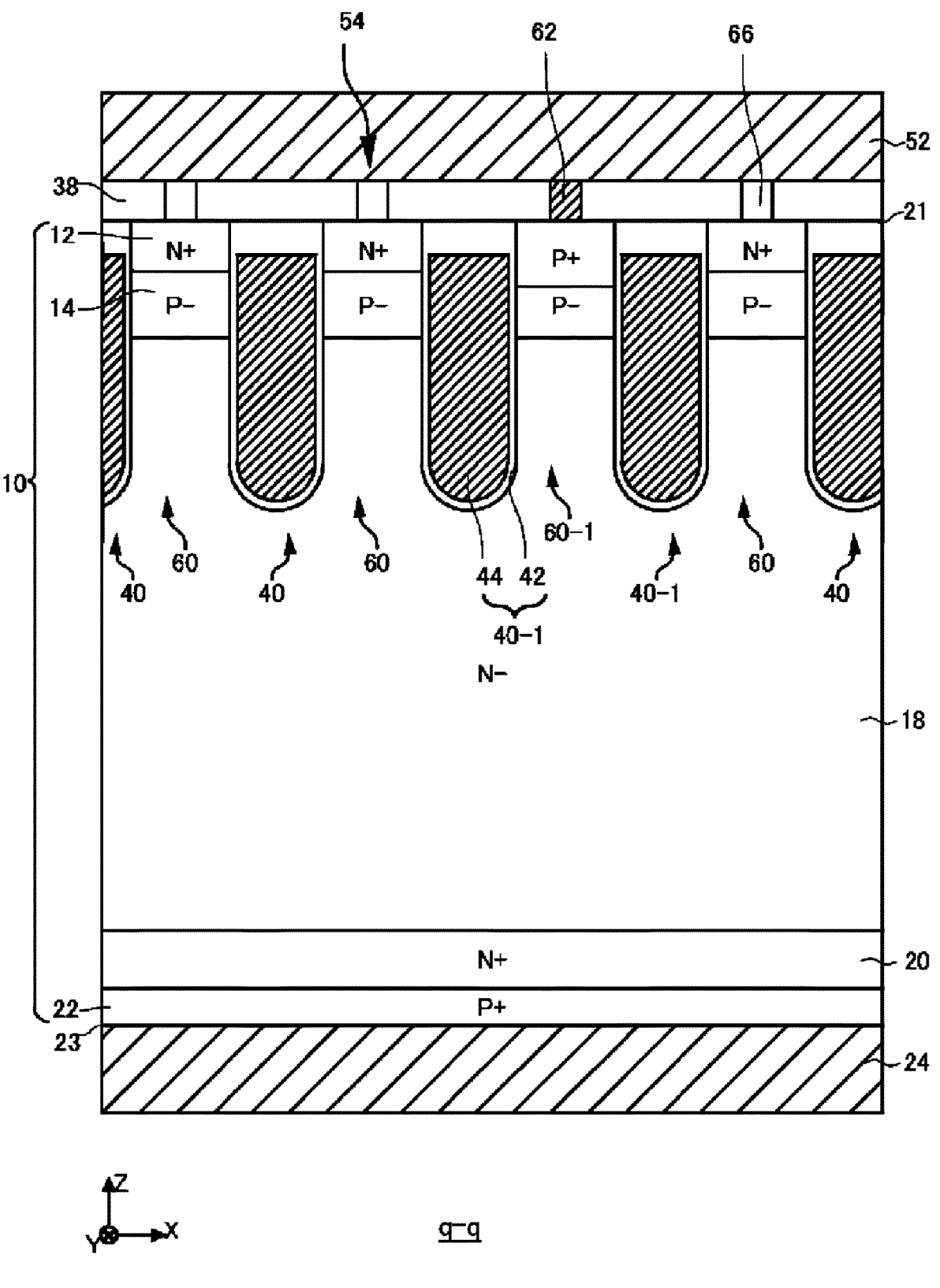
FIG. 33 is a diagram showing an example of a cross section q-q shown in FIG. 31.

FIG. 33 is a diagram showing an example of a cross section q-q shown in FIG. 31. The cross section q-q is the XZ plane that passes through the N type emitter regions 12. In the semiconductor device 700 shown in FIG. 33, the arrangement of the N type emitter regions 12 and the polysilicon resistance portions 66 differs from that of the semiconductor device 600 shown in FIG. 30. Other configurations of FIG. 33 may be the same as those of FIG. 30.

In the present example, the N type emitter region 12 is not provided in one mesa portion 60 (mesa portion 60-1). Therefore, the polysilicon resistance portion 66 does not need to be provided above the mesa portion 60-1. The metal plug 62 may be provided above the mesa portion 60-1.

Figure 34:
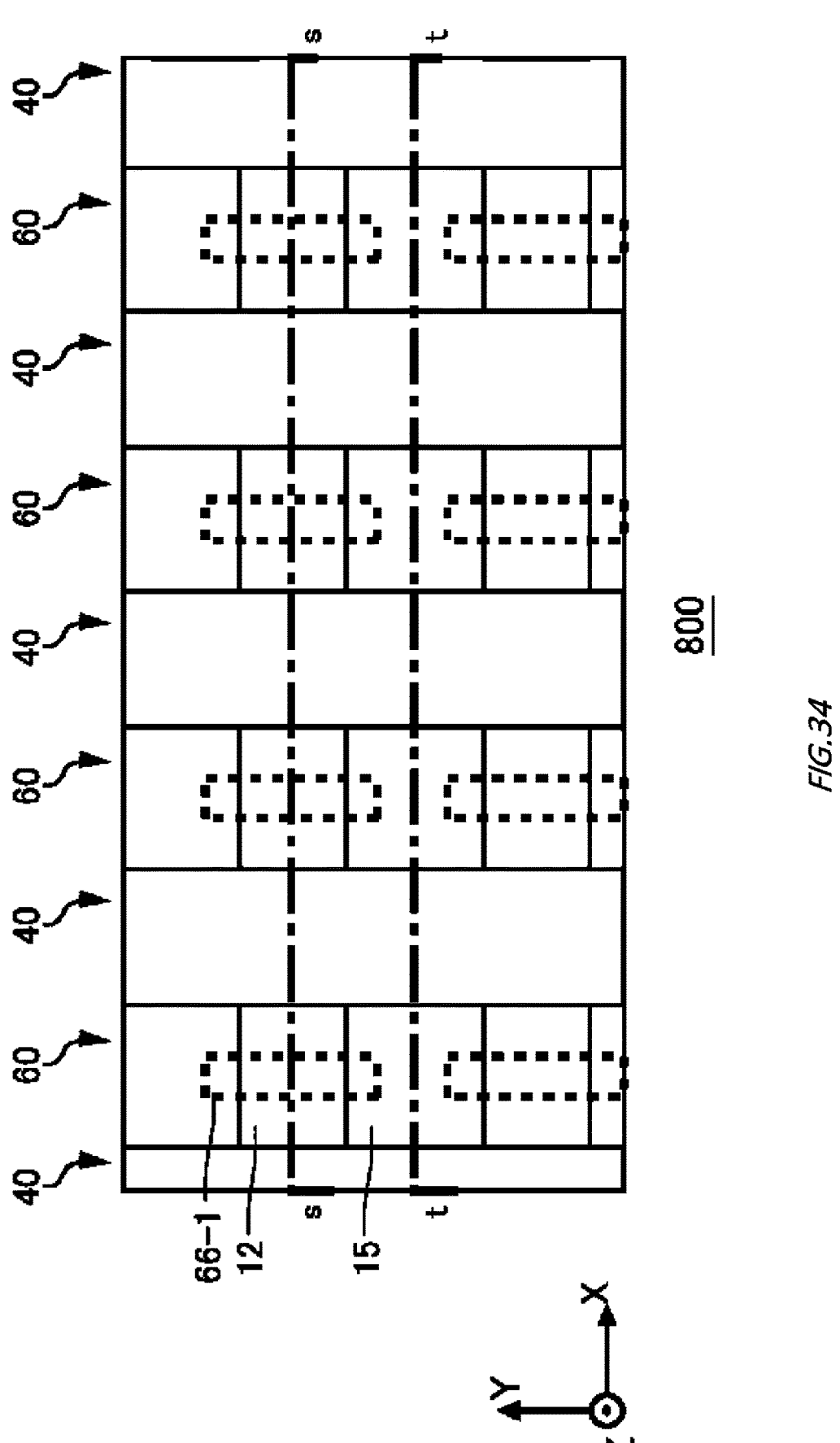
FIG. 34 is a diagram showing a semiconductor device 800 according to another example.

FIG. 34 is a diagram showing a semiconductor device 800 according to another example. FIG. 34 shows the arrangement on the upper surface 21 of the semiconductor substrate

10. The configuration of FIG. 34 may be the same as that of FIG. 28. It is to be noted that a cross section t-t shown in FIG. 34 may be the same as the cross section b-b of the semiconductor device 100 shown in FIG. 5. In FIG. 34, the polysilicon resistance portion 66 formed in the contact hole 54 is set as a polysilicon resistance portion 66-1.

Figure 35:
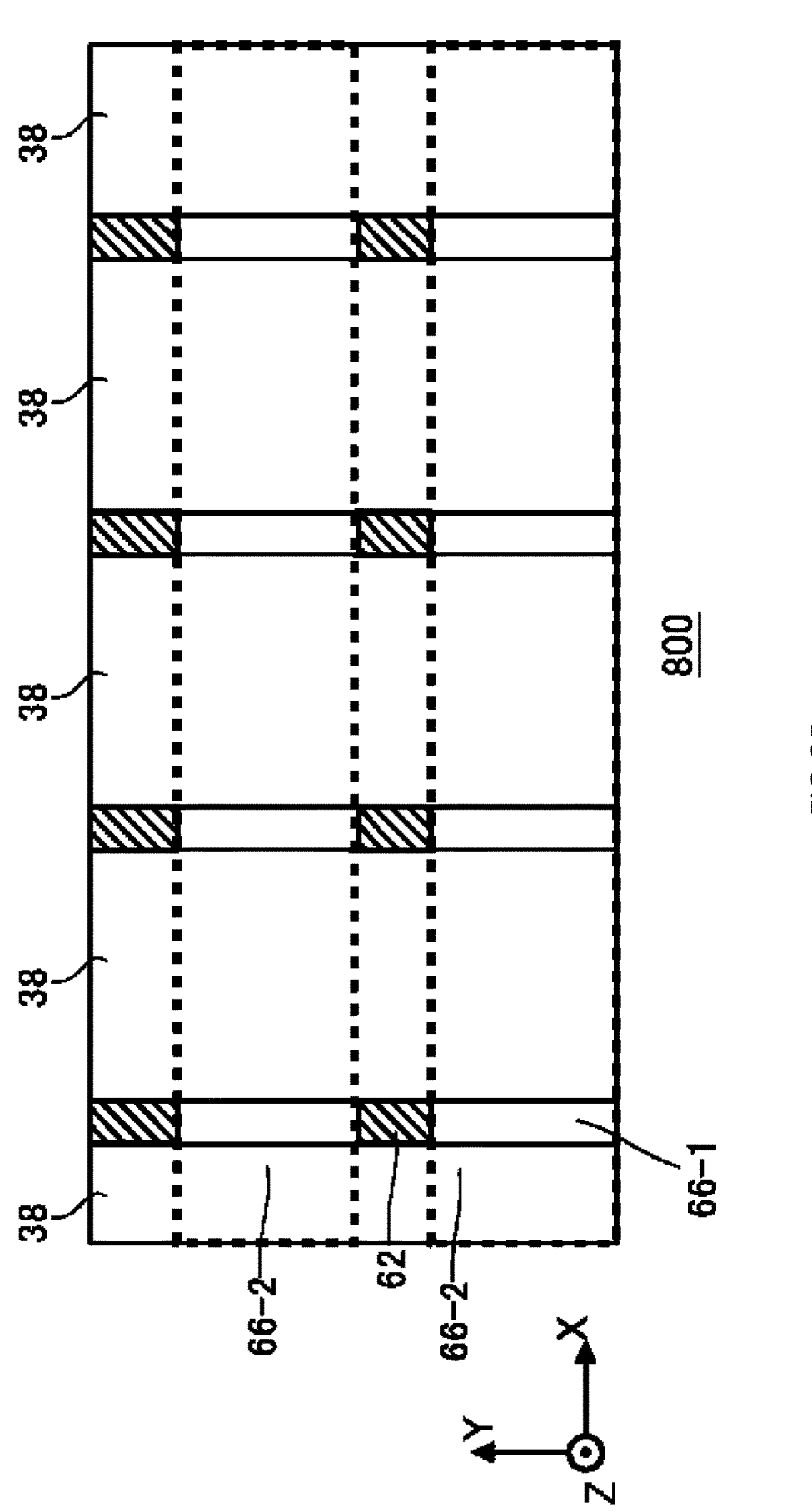
FIG. 35 is a diagram showing the semiconductor device 800 according to another example.

FIG. 35 is a diagram showing the semiconductor device 800 according to another example. FIG. 35 shows the arrangement on the upper surface of the interlayer dielectric film 38. FIG. 35 shows the arrangement in the XY plane different from FIG. 34. The semiconductor device 800 shown in FIG. 35 differs from the semiconductor device 600 shown in FIG. 29 in that the polysilicon resistance portion 66 is provided on an upper side of the interlayer dielectric film 38. Other configurations of FIG. 35 may be the same as those of FIG. 29. In FIG. 35, the polysilicon resistance portion 66 provided on the upper side of the interlayer dielectric film 38 is set as a polysilicon resistance portion 66-2, and an arrangement of the polysilicon resistance portions 66-2 is indicated by bold dotted lines. In the present specification, provided on the upper side means being arranged at a position on an upper side in the depth direction of the semiconductor substrate 10.

Figure 36:
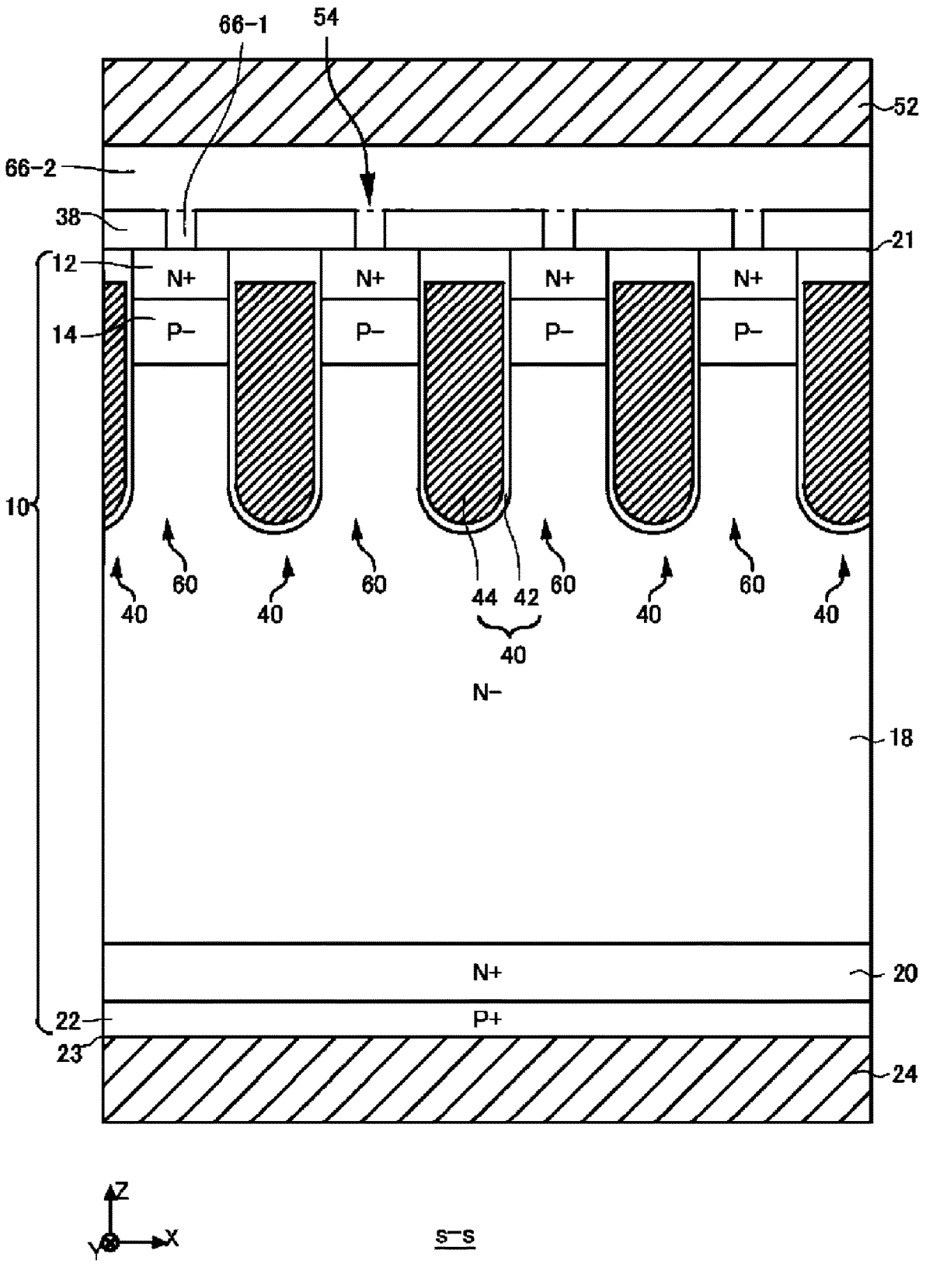
FIG. 36 is a diagram showing an example of a cross section s-s shown in FIG. 34.

FIG. 36 is a diagram showing an example of a cross section s-s shown in FIG. 34. The cross section s-s is the XZ plane that passes through the N type emitter regions 12. The semiconductor device 800 shown in FIG. 36 differs from the semiconductor device 600 shown in FIG. 30 in that the polysilicon resistance portion 66-2 is provided on the upper side of the interlayer dielectric film 38. Other configurations of FIG. 36 may be the same as those of FIG. 30. Further, in FIG. 36, a boundary between the polysilicon resistance portion 66-1 and the polysilicon resistance portion 66-2 is indicated by a dotted line.

In the present example, the polysilicon resistance portion 66-2 is provided on the upper side of the interlayer dielectric film 38. By providing the polysilicon resistance portion 66-2, the resistance of the polysilicon resistance portion 66 can be adjusted without changing the depth of the contact hole 54 and the depth of the metal plug 62.

Figure 37:
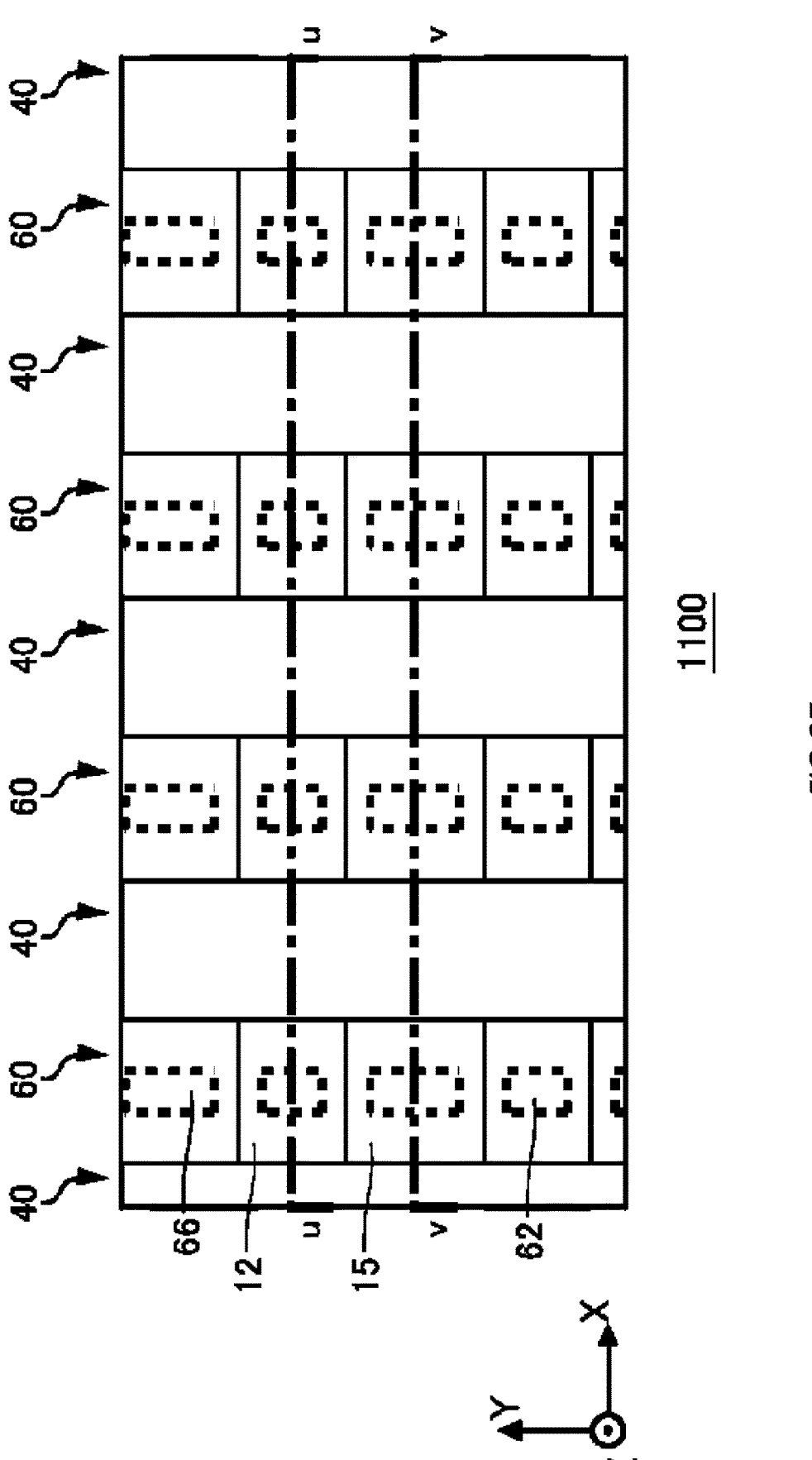
FIG. 37 is a diagram showing a semiconductor device 1100 according to another example.

FIG. 37 is a diagram showing a semiconductor device 1100 according to another example. FIG. 37 shows the arrangement on the upper surface 21 of the semiconductor substrate 10. The semiconductor device 1100 shown in FIG. 37 differs from the semiconductor device 600 shown in FIG. 28 in that the polysilicon resistance portion 66 is provided only above the N type emitter region 12. Other configurations of FIG. 37 may be the same as those of FIG. 28. In addition, similar to FIG. 28, in FIG. 37, the metal plug 62 is provided only above the P type contact region 15. In FIG. 37, the arrangement of the polysilicon resistance portions 66 and the metal plugs 62 on the upper surface 21 of the semiconductor substrate 10 is indicated by bold dotted lines. It is to be noted that a cross section u-u shown in FIG. 37 may be the same as the cross section o-o of the semiconductor device 600 shown in FIG. 30. It is to be noted that a cross section v-v shown in FIG. 37 may be the same as the cross section b-b of the semiconductor device 100 shown in FIG. 5.

Figure 38:
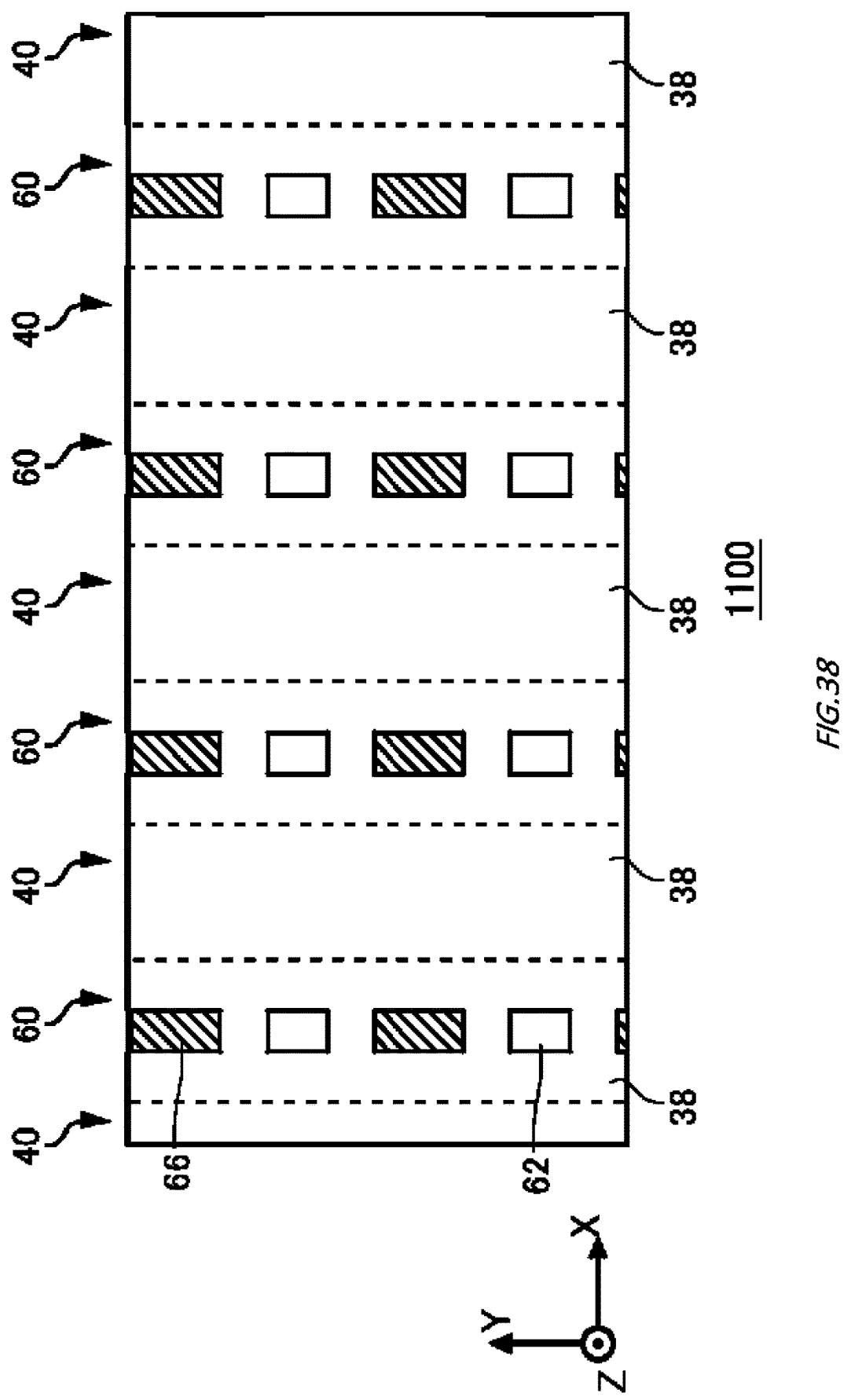
FIG. 38 is a diagram showing the semiconductor device 1100 according to another example.

FIG. 38 is a diagram showing the semiconductor device 1100 according to another example. FIG. 38 shows the arrangement on the upper surface of the interlayer dielectric film 38. FIG. 38 shows the arrangement in the XY plane different from FIG. 37. In the present example, the interlayer dielectric film 38 may be provided between the polysilicon resistance portion 66 and the metal plug 62 in the extending direction (Y axis direction). Also with such a configuration, the function of the P type contact region 15 can be realized while realizing the low ON voltage.

Figure 39:
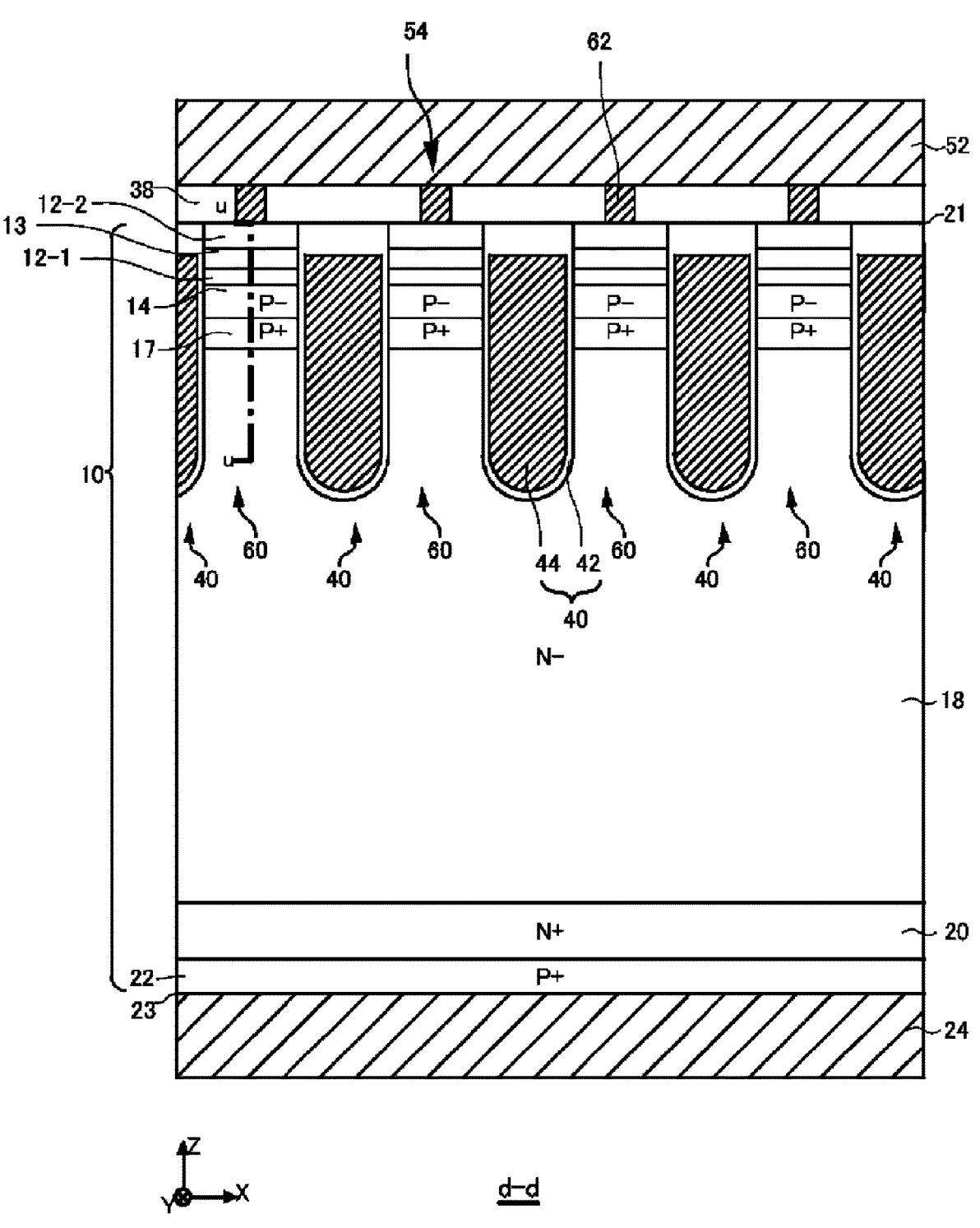
FIG. 39 is a diagram showing another example of the cross section d-d shown in FIG. 7.

FIG. 39 is a diagram showing another example of the cross section d-d shown in FIG. 7. The cross section d-d is the XZ plane that passes through the N type emitter regions 12. FIG. 39 differs from FIG. 9 in that a high concentration P type base region 17 is provided. Other configurations of FIG. 39 may be the same as those of FIG. 9. The high concentration P type base region 17 may be provided below the P type base region 14. The P type base region 14 is an example of the low concentration base region.

Figure 40:
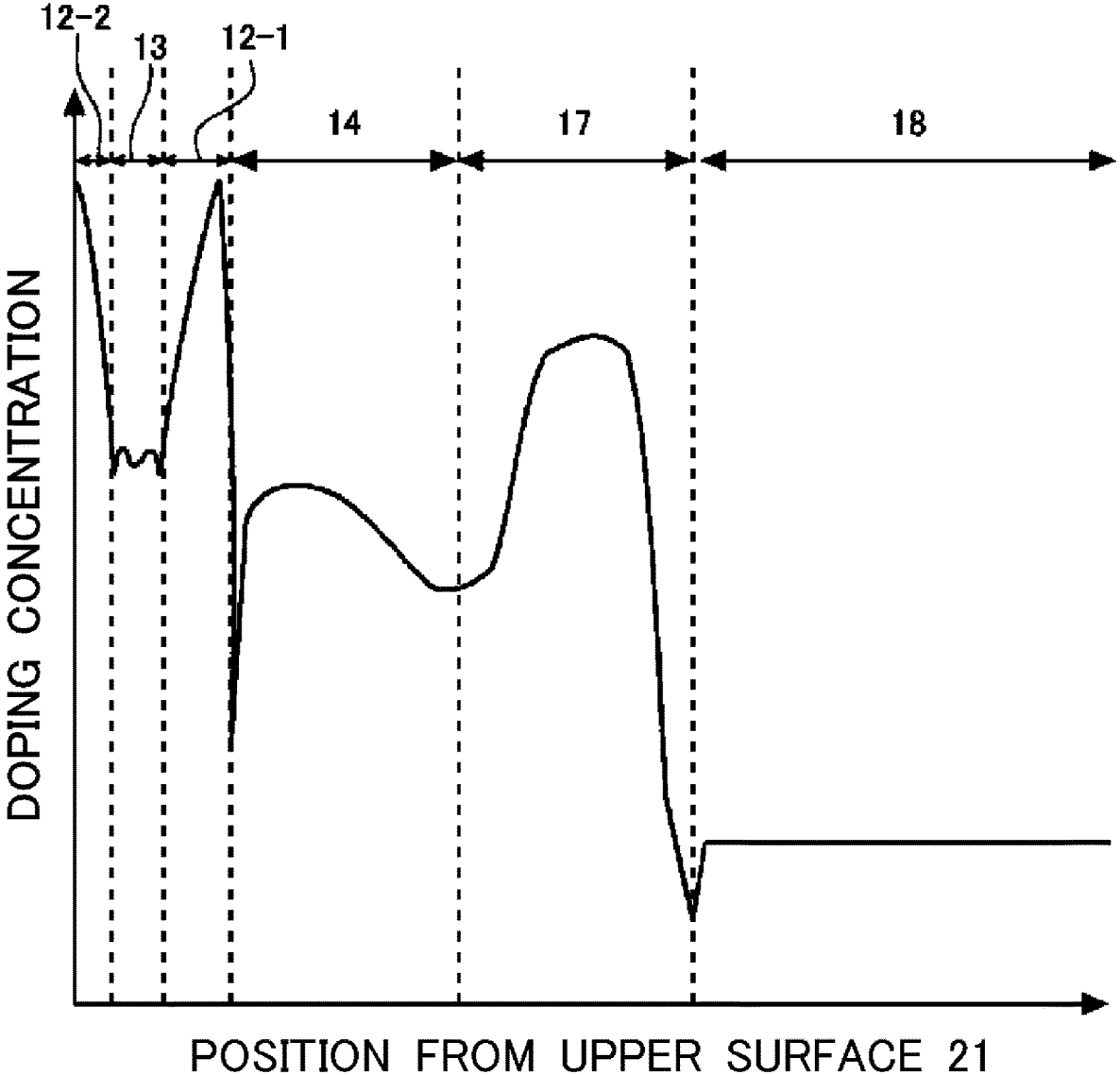
FIG. 40 is a diagram showing an example of a doping concentration distribution on a line u-u shown in FIG. 39.

FIG. 40 is a diagram showing an example of a doping concentration distribution on a line u-u shown in FIG. 39. The line u-u may be set at a position at the center of the mesa portion 60 in the X axis direction. FIG. 40 shows the doping concentration distribution in the N type emitter region 12-2, the low concentration N type emitter region 13, the N type emitter region 12-1, the P type base region 14, the high concentration P type base region 17, and the N type drift region 18.

In the present example, at the center of the mesa portion 60, the doping concentration of the high concentration P type base region 17 is higher the doping concentration of the P type base region 14. The high concentration P type base region 17 according to the present example is of the P+ type. The high concentration P type base region 17 may have a concentration peak at which the doping concentration is higher than that of the P type base region 14. Further, at the center of the mesa portion 60, the doping concentration of the high concentration P type base region 17 may be higher than the doping concentration of the low concentration N type emitter region 13. The high concentration P type base region 17 may have a concentration peak at which the doping concentration is higher than that of the low concentration N type emitter region 13. Also by providing the high concentration P type base region 17, the characteristics of the semiconductor device 200 having a low ON voltage and a low saturation voltage can be realized. It is to be noted that a boundary between the high concentration P type base region 17 and the P type base region 14 may have a peak.

Figure 41:
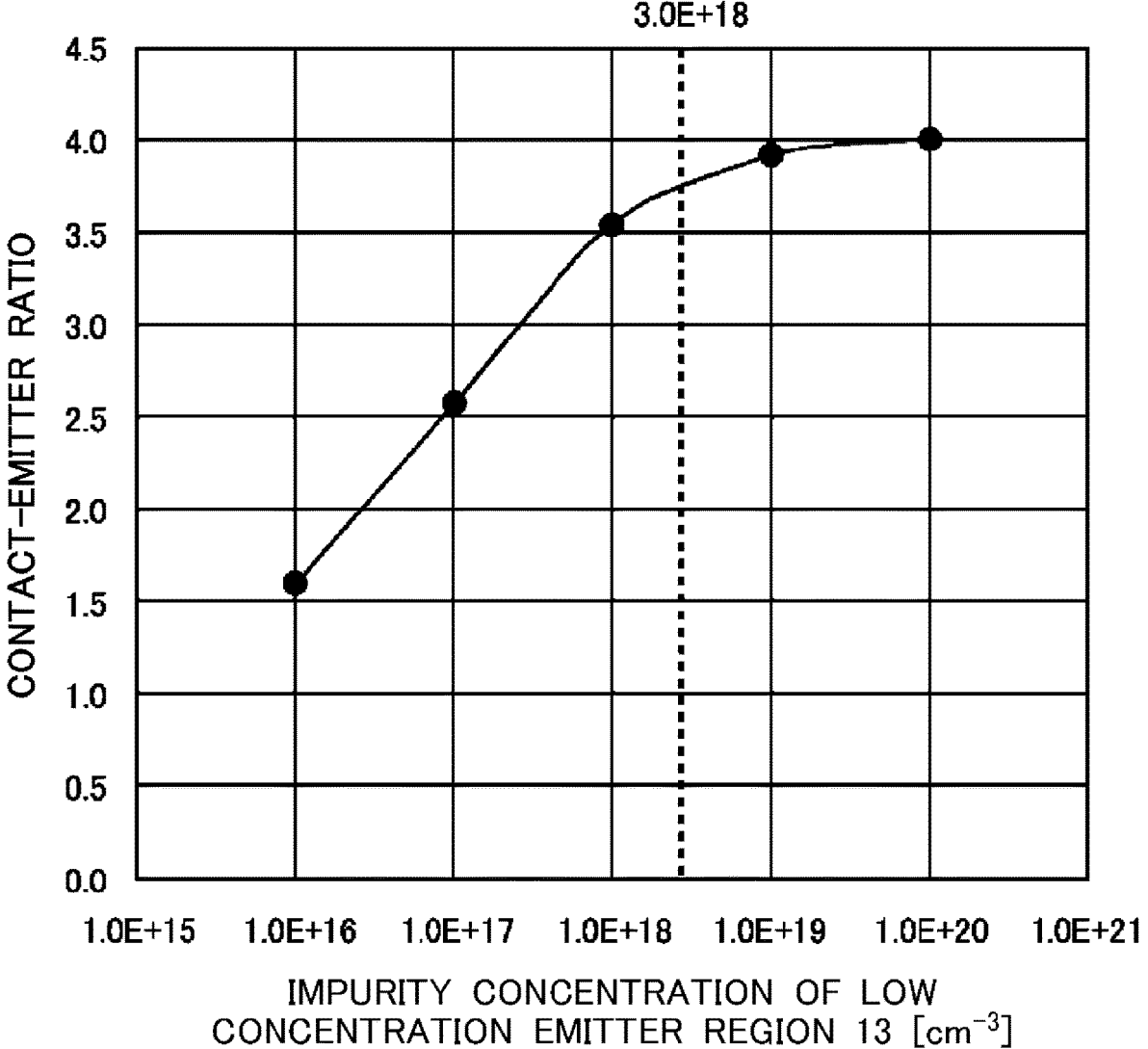
FIG. 41 is a diagram showing a relationship between an impurity concentration of the low concentration N type emitter region 13 and a contact-emitter ratio.

FIG. 41 is a diagram showing a relationship between the impurity concentration of the low concentration N type emitter region 13 and the contact-emitter ratio. The contact-emitter ratio is a ratio between the P type contact region 15 and the N type emitter region 12. In the example shown in FIG. 7, the contact-emitter ratio is (L4–L3)/L3=2.0 μm/1.5 μm≠1.33. In FIG. 41, the contact-emitter ratio with which, when the impurity concentration of the low concentration N type emitter region 13 is varied, the saturation current becomes equivalent was calculated.

In FIG. 41, by setting the impurity concentration of the low concentration N type emitter region 13 to be about $3.0 \times 10^{18}$ cm$^{-3}$ or less, the contact-emitter ratio can be reduced. Therefore, the total emitter width Z can be increased, and the low ON voltage can be realized by Expression 2. It is to be noted that a portion having a lowest concentration out of the low concentration N type emitter region 13 is preferably set to be $3.0 \times 10^{18}$ cm$^{-3}$ or less.

Figure 42:
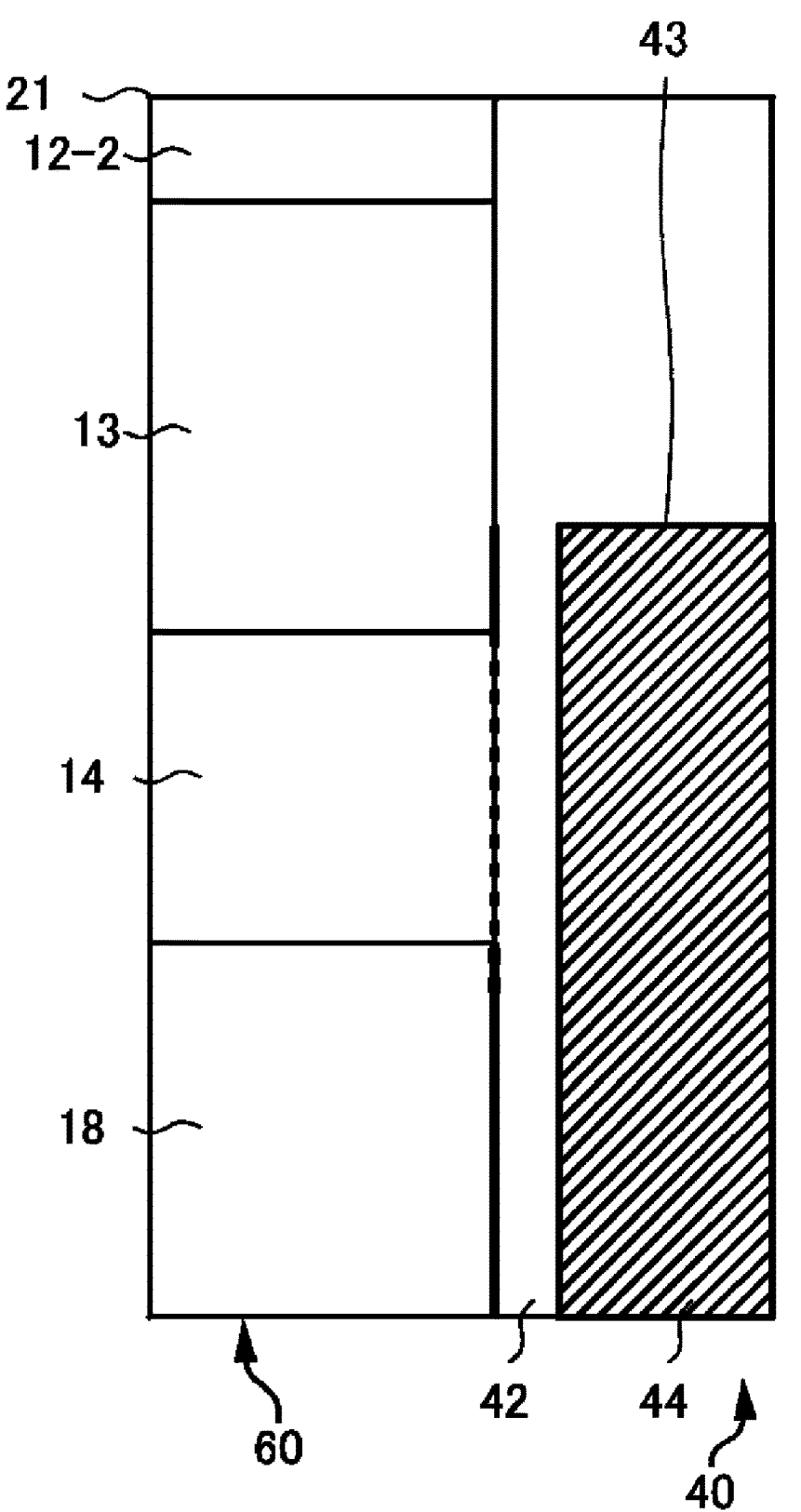
FIG. 42 is a diagram showing a semiconductor device 900 according to another example.

FIG. 42 is a diagram showing a semiconductor device 900 according to another example. FIG. 42 shows the XZ plane that passes through the N type emitter region 12-2. FIG. 42 shows only the vicinity of the mesa portion 60 and the gate trench portion 40. It is to be noted that regarding common signs in FIG. 42, descriptions will be omitted. In FIG. 42, an N type accumulation layer formed in the low concentration N type emitter region 13 when a positive voltage is applied to the gate conductive portion 44 is indicated by a thick line.

Also in FIG. 42, an N type inversion layer formed in the P type base region 14 when a positive voltage is applied to the gate conductive portion 44 is indicated by a bold dotted line. Also in FIG. 42, an N type accumulation layer formed in the N type drift region 18 when a positive voltage is applied to the gate conductive portion 44 is indicated by a thick line.

In the present example, the low concentration N type emitter region 13 is in contact with the P type base region 14. That is, in FIG. 42, the N type emitter region 12-1 is not provided unlike FIG. 9 and the like. Also with such a configuration, the saturation current can be reduced.

In the semiconductor device 900, the position of the upper end 43 of the gate conductive portion 44 in the depth direction of the semiconductor substrate 10 is provided in the low concentration N type emitter region 13. In this case, the N type accumulation layer formed in the low concentration N type emitter region 13 when a positive voltage is applied to the gate conductive portion 44 becomes short, with the result that the function of the low concentration N type emitter region 13 as a resistor becomes large.

Figure 43:
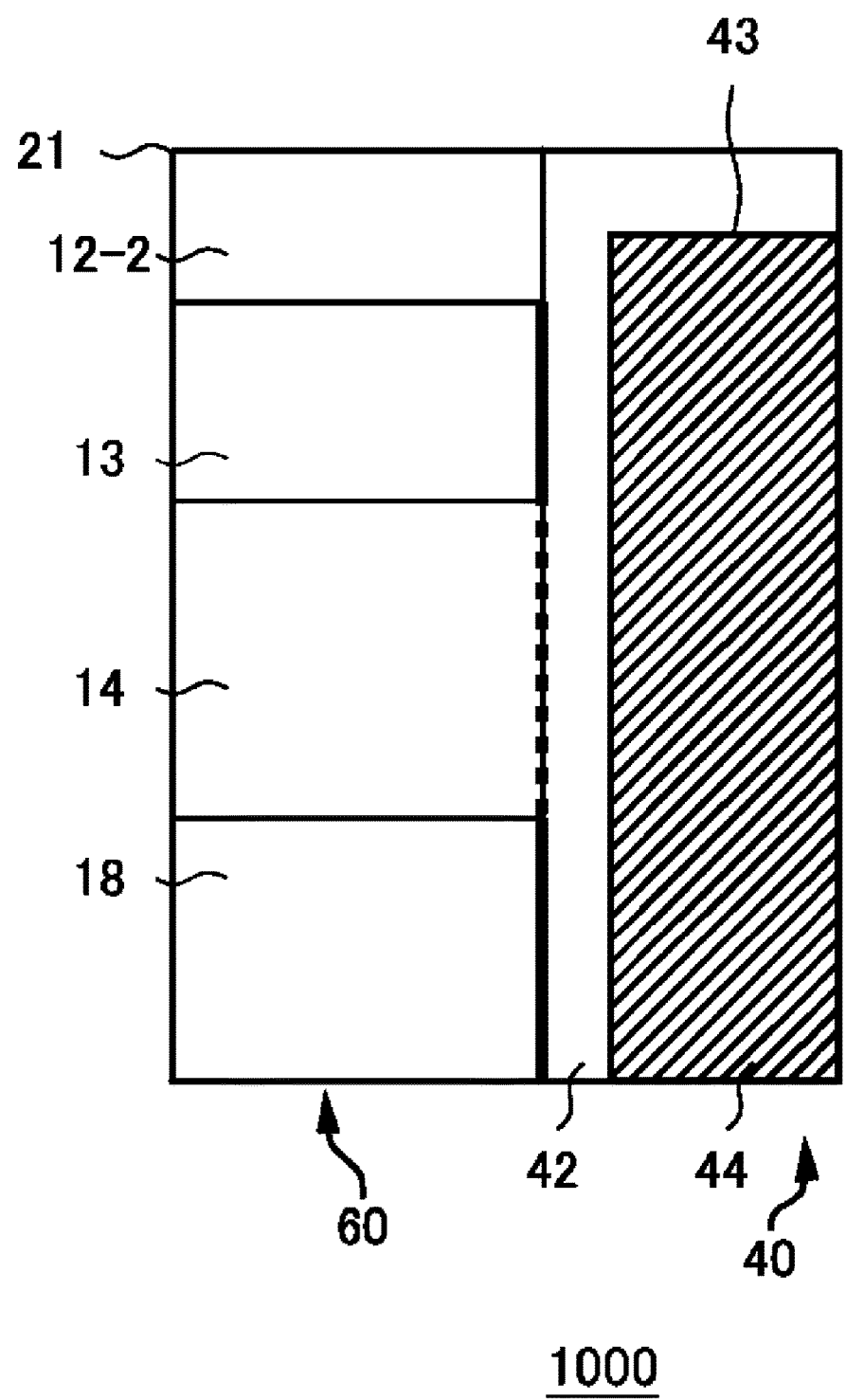
FIG. 43 is a diagram showing a semiconductor device 1000 according to another example.

FIG. 43 is a diagram showing a semiconductor device 1000 according to another example. FIG. 43 shows the XZ plane that passes through the N type emitter region 12-2. FIG. 43 shows only the vicinity of the mesa portion 60 and the gate trench portion 40. It is to be noted that regarding signs common to FIG. 42 in FIG. 43, descriptions will be omitted.

In the semiconductor device 1000, the position of the upper end 43 of the gate conductive portion 44 in the depth direction of the semiconductor substrate 10 is provided in the N type emitter region 12-2. In this case, the N type accumulation layer formed in the low concentration N type emitter region 13 when a positive voltage is applied to the gate conductive portion 44 becomes long, with the result that variations of the saturation current can be suppressed.

Figure 44:
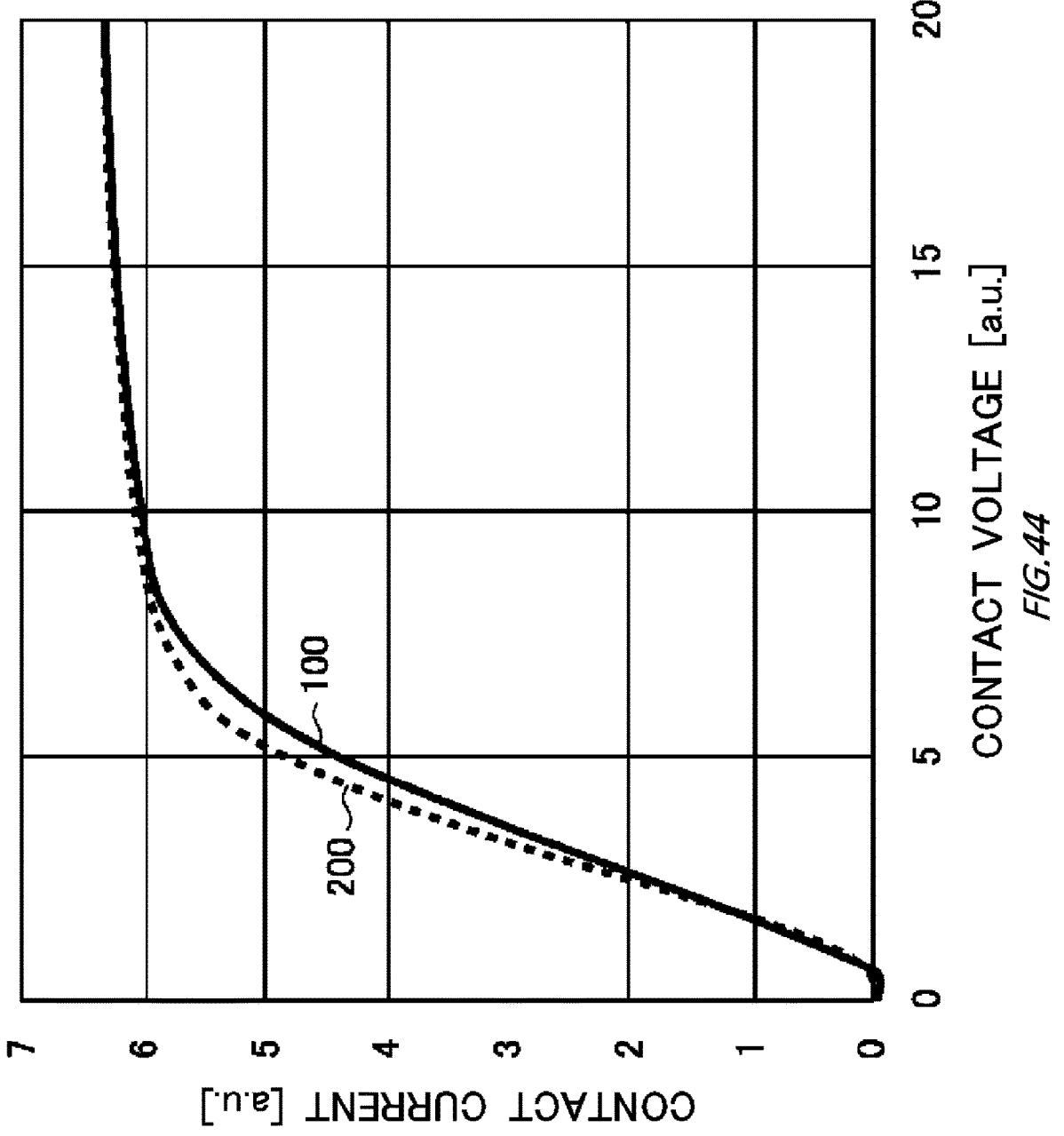
FIG. 44 is a diagram showing I-V characteristics in a high current region.

FIG. 44 is a diagram showing I-V characteristics in a high current region. In FIG. 44, the semiconductor device 100 is indicated by a solid line, and the semiconductor device 200 is indicated by a dotted line. By adjusting the total emitter width Z in the semiconductor device 200, the saturation current is adjusted to be of about the same level as the semiconductor device 100.

Figure 45:
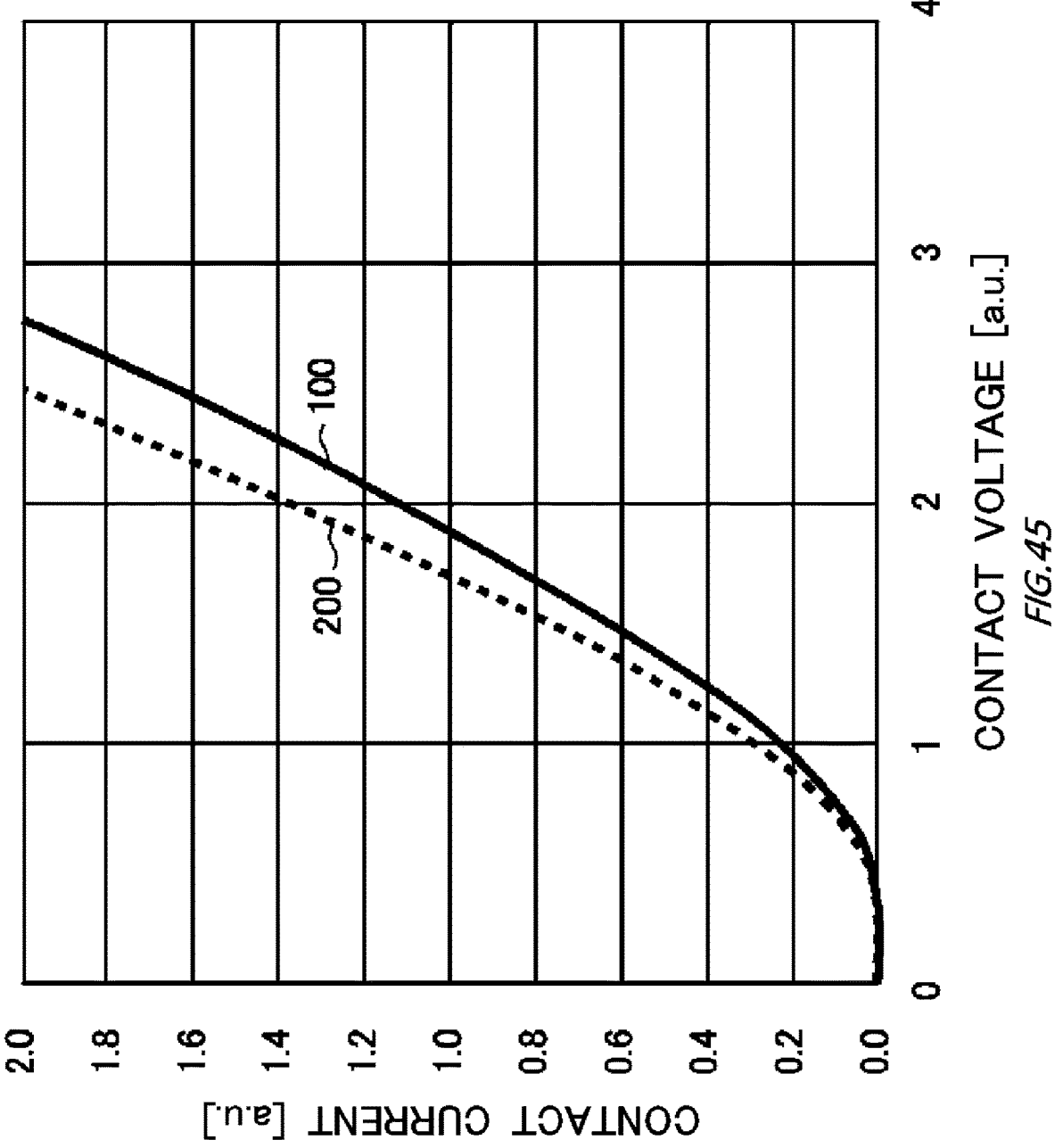
FIG. 45 is a diagram showing I-V characteristics in a rated current region.

FIG. 45 is a diagram showing I-V characteristics in a rated current region. In FIG. 45, the semiconductor device 100 is indicated by a solid line, and the semiconductor device 200 is indicated by a dotted line. Since the total emitter width Z of the semiconductor device 200 is increased as compared to the semiconductor device 100, the ON voltage is decreased.

While the embodiments of the present invention have been described, the technical scope of the present invention is not limited to the above-described embodiments. It is apparent to persons skilled in the art that various alterations or improvements can be made to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device, comprising:

a semiconductor substrate;

a plurality of gate trench portions which are provided on an upper surface of the semiconductor substrate and extend along an extending direction;

an emitter electrode provided above the semiconductor substrate;

a mesa portion provided between adjacent gate trench portions out of the plurality of gate trench portions;

an emitter region of a first conductivity type, which is provided on an upper surface of the mesa portion and is in contact with the adjacent gate trench portions;

a contact region of a second conductivity type, which is provided on the upper surface of the mesa portion;

a base region of the second conductivity type, which is provided below the emitter region and the contact region in the semiconductor substrate, is in contact with the adjacent gate trench portions, and has a lower doping concentration than the contact region;

a drift region of the first conductivity type, which is provided below the base region in the semiconductor substrate and has a lower doping concentration than the emitter region; and a high resistance portion which is provided between the emitter electrode and the base region in a depth direction of the semiconductor substrate and has a higher resistance than the emitter region, wherein the emitter region and the high resistance portion are provided adjacent to each other in the depth direction, wherein the emitter region and the contact region are arranged alternately in the extending direction, wherein the emitter region includes a first high concentration emitter region, and wherein the high resistance portion is a low concentration emitter region which is provided above the first high concentration emitter region and has a lower doping concentration than the first high concentration emitter region.

2. The semiconductor device according to claim 1, wherein the plurality of gate trench portions each include a gate conductive portion, and the gate conductive portion is provided on a lower side of a position at which the high resistance portion is provided in the depth direction of the semiconductor substrate.

3. The semiconductor device according to claim 1, wherein the emitter region further includes a second high concentration emitter region which is provided above the low concentration emitter region and has a higher doping concentration than the low concentration emitter region.

4. The semiconductor device according to claim 1, wherein the doping concentration of the low concentration emitter region is equal to or larger than the doping concentration of the base region.

5. The semiconductor device according to claim 1, wherein the doping concentration of the low concentration emitter region is equal to or smaller than the doping concentration of the base region.

6. The semiconductor device according to claim 1, wherein the doping concentration of the low concentration emitter region at a position in contact with the adjacent gate trench portions is higher than the doping concentration of the low concentration emitter region at a center of the mesa portion.

7. The semiconductor device according to claim 1, wherein the base region includes:

a low concentration base region; and a high concentration base region which is provided below the low concentration base region and has a higher doping concentration than the low concentration base region.

8. The semiconductor device according to claim 3, wherein the doping concentration of the low concentration emitter region is equal to or larger than the doping concentration of the base region.

9. The semiconductor device according to claim 3, wherein the doping concentration of the low concentration emitter region is equal to or smaller than the doping concentration of the base region.

10. The semiconductor device according to claim 3, wherein the doping concentration of the low concentration emitter region at a position in contact with the adjacent gate trench portions is higher than the doping concentration of the low concentration emitter region at a center of the mesa portion.

11. The semiconductor device according to claim 4, wherein the doping concentration of the low concentration emitter region at a position in contact with the adjacent gate trench portions is higher than the doping concentration of the low concentration emitter region at a center of the mesa portion.

12. The semiconductor device according to claim 5, wherein the doping concentration of the low concentration emitter region at a position in contact with the adjacent gate trench portions is higher than the doping concentration of the low concentration emitter region at a center of the mesa portion.

13. The semiconductor device according to claim 2, wherein the base region includes:

a low concentration base region; and a high concentration base region which is provided below the low concentration base region and has a higher doping concentration than the low concentration base region.

* * * * *